(12) United States Patent
Haverkamp et al.

(10) Patent No.: US 12,385,138 B2
(45) Date of Patent: *Aug. 12, 2025

(54) PLASMA-ENHANCED DEPOSITION OF FILM STACKS

(71) Applicant: Novellus Systems, Inc., Fremont, CA (US)

(72) Inventors: Jason Dirk Haverkamp, Tualatin, OR (US); Pramod Subramonium, Beaverton, OR (US); Joseph L. Womack, Tigard, OR (US); Dong Niu, West Linn, OR (US); Keith Fox, Tigard, OR (US); John B. Alexy, West Linn, OR (US); Patrick G. Breiling, Tigard, OR (US); Jennifer L. Petraglia, Lake Oswego, OR (US); Mandyam A. Sriram, San Jose, CA (US); George Andrew Antonelli, Portland, OR (US); Bart J. van Schravendijk, Palo Alto, CA (US)

(73) Assignee: Novellus Systems, Inc., Fremont, CA (US)

( * ) Notice: Subject to any disclaimer, the term of this patent is extended or adjusted under 35 U.S.C. 154(b) by 97 days.

This patent is subject to a terminal disclaimer.

(21) Appl. No.: 18/351,681

(22) Filed: Jul. 13, 2023

(65) Prior Publication Data
US 2023/0366094 A1 Nov. 16, 2023

Related U.S. Application Data

(60) Continuation of application No. 16/235,593, filed on Dec. 28, 2018, now Pat. No. 11,746,420, which is a
(Continued)

(51) Int. Cl.
H05H 1/24 (2006.01)
C23C 16/24 (2006.01)
(Continued)

(52) U.S. Cl.
CPC .............. *C23C 16/50* (2013.01); *C23C 16/24* (2013.01); *C23C 16/345* (2013.01);
(Continued)

(58) Field of Classification Search
CPC ......... C23C 16/24; C23C 16/34; C23C 16/50; C23C 16/345; H05H 1/24
See application file for complete search history.

(56) References Cited

U.S. PATENT DOCUMENTS 4,837,185 A 6/1989 Yau et al.
5,133,284 A 7/1992 Thomas et al.
(Continued)

FOREIGN PATENT DOCUMENTS

CN 101071771 A 11/2007
CN 101255552 A 9/2008
(Continued)

OTHER PUBLICATIONS

Hoogeland, D., et al., "Plasma-assisted atomic layer deposition of TiN/Al2O3 stacks for metal-oxide-semiconductor capacitor applications". Journal of Applied Physics 106, 114107 (2009), pp. 1-7.*
(Continued)

Primary Examiner — Bret P Chen
(74) Attorney, Agent, or Firm — Weaver Austin Villeneuve & Sampson LLP

(57) ABSTRACT

A method of depositing a film stack including films of different compositions in a process station using a plasma is described. The method includes: in a first plasma-activated film deposition phase, depositing a first film having a first film composition on a substrate, and, in a second plasma-activated deposition phase, depositing a second film having a second film composition on the first film, where the second film composition is different from the first film composition. Deposition of the first film can include delivering at least
(Continued)

two first deposition phase reactants to the process station via a delivery line; and deposition of the second film can include delivering at least two second deposition phase reactants to the process station via the same delivery line that was used during deposition of the first film. The method may also include a step of purging the delivery line.

11 Claims, 30 Drawing Sheets

Related U.S. Application Data continuation of application No. 14/262,196, filed on Apr. 25, 2014, now Pat. No. 10,214,816, which is a division of application No. 12/970,846, filed on Dec. 16, 2010, now Pat. No. 8,741,394.

(60) Provisional application No. 61/394,707, filed on Oct. 19, 2010, provisional application No. 61/382,465, filed on Sep. 13, 2010, provisional application No. 61/382,468, filed on Sep. 13, 2010, provisional application No. 61/317,656, filed on Mar. 25, 2010.

(51) Int. Cl.
| | | |
|---|---|---|
| C23C 16/34 | (2006.01) | |
| C23C 16/40 | (2006.01) | |
| C23C 16/44 | (2006.01) | |
| C23C 16/455 | (2006.01) | |
| C23C 16/50 | (2006.01) | |
| C23C 16/509 | (2006.01) | |
| C23C 16/52 | (2006.01) | |
| C23C 16/54 | (2006.01) | |
| H01J 37/32 | (2006.01) | |
| H01L 21/02 | (2006.01) | |
| H01L 21/67 | (2006.01) | |

(52) U.S. Cl.
CPC ........ *C23C 16/402* (2013.01); *C23C 16/4401* (2013.01); *C23C 16/45512* (2013.01); *C23C 16/45523* (2013.01); *C23C 16/45565* (2013.01); *C23C 16/45574* (2013.01); *C23C 16/509* (2013.01); *C23C 16/52* (2013.01); *C23C 16/54* (2013.01); *H01J 37/32137* (2013.01); *H01J 37/32155* (2013.01); *H01L 21/02123* (2013.01); *H01L 21/02164* (2013.01); *H01L 21/022* (2013.01); *H01L 21/02274* (2013.01); *H01L 21/6719* (2013.01); *H01L 21/67201* (2013.01); *H01L 21/67207* (2013.01)

(56) References Cited

U.S. PATENT DOCUMENTS

| | | | |
|---|---|---|---|
| 5,302,209 | A | 4/1994 | Maeda et al. |
| 5,399,387 | A | 3/1995 | Law et al. |
| 5,589,233 | A | 12/1996 | Law et al. |
| 5,647,945 | A | 7/1997 | Matsuse et al. |
| 5,851,602 | A | 12/1998 | Law et al. |
| 5,876,798 | A | 3/1999 | Vassiliev |
| 5,882,424 | A | 3/1999 | Taylor et al. |
| 6,066,550 | A | 5/2000 | Wang |
| 6,077,764 | A | 6/2000 | Sugiarto et al. |
| 6,083,355 | A | 7/2000 | Spence |
| 6,087,278 | A | 7/2000 | Kim et al. |
| 6,106,678 | A | 8/2000 | Shufflebotham et al. |
| 6,143,082 | A | 11/2000 | McINERNEY et al. |
| 6,199,506 | B1 | 3/2001 | Hilliker et al. |
| 6,207,574 | B1 | 3/2001 | Lee |
| 6,235,650 | B1 | 5/2001 | Yao |
| 6,303,518 | B1 | 10/2001 | Tian et al. |
| 6,358,573 | B1 | 3/2002 | Raoux et al. |
| 6,383,898 | B1 | 5/2002 | Kishimoto |
| 6,407,011 | B1 | 6/2002 | Ikeda et al. |
| 6,444,277 | B1 | 9/2002 | Law et al. |
| 6,541,400 | B1 | 4/2003 | Tian et al. |
| 6,652,969 | B1 * | 11/2003 | Murakami ............ C23C 16/30 427/249.7 |
| 6,656,837 | B2 | 12/2003 | Xu et al. |
| 6,660,663 | B1 | 12/2003 | Cheung et al. |
| 6,753,250 | B1 | 6/2004 | Hill et al. |
| 6,811,831 | B1 | 11/2004 | Koutny et al. |
| 6,818,533 | B2 | 11/2004 | Chen et al. |
| 6,844,612 | B1 | 1/2005 | Tian et al. |
| 6,860,965 | B1 | 3/2005 | Stevens |
| 6,875,687 | B1 | 4/2005 | Weidman et al. |
| 6,962,859 | B2 | 11/2005 | Todd et al. |
| 7,041,543 | B1 | 5/2006 | Varadarajan et al. |
| 7,125,758 | B2 | 10/2006 | Choi et al. |
| 7,214,630 | B1 | 5/2007 | Varadarajan et al. |
| 7,381,451 | B1 | 6/2008 | Lang et al. |
| 7,381,644 | B1 | 6/2008 | Subramonium et al. |
| 7,396,759 | B1 | 7/2008 | Van et al. |
| 7,420,275 | B1 | 9/2008 | Yu et al. |
| 7,422,776 | B2 | 9/2008 | Yim et al. |
| 7,479,443 | B2 | 1/2009 | Bauer et al. |
| 7,482,247 | B1 | 1/2009 | Papasouliotis et al. |
| 7,608,300 | B2 | 10/2009 | Bencher et al. |
| 7,635,651 | B2 | 12/2009 | Lee et al. |
| 7,642,202 | B1 | 1/2010 | Li et al. |
| 7,704,894 | B1 | 4/2010 | Henri et al. |
| 7,713,592 | B2 | 5/2010 | Nguyen et al. |
| 7,727,880 | B1 | 6/2010 | Chattopadhyay et al. |
| 7,727,881 | B1 | 6/2010 | Chattopadhyay et al. |
| 7,745,346 | B2 | 6/2010 | Hausmann et al. |
| 7,824,935 | B2 | 11/2010 | Verma et al. |
| 7,858,431 | B2 | 12/2010 | Isaka et al. |
| 7,923,376 | B1 | 4/2011 | Dhas et al. |
| 7,981,777 | B1 | 7/2011 | Subramonium et al. |
| 7,981,810 | B1 | 7/2011 | Subramonium et al. |
| 8,017,527 | B1 | 9/2011 | Dhas et al. |
| 8,076,250 | B1 | 12/2011 | Rajagopalan et al. |
| 8,110,493 | B1 | 2/2012 | Subramonium et al. |
| 8,124,522 | B1 | 2/2012 | Wu et al. |
| 8,129,288 | B2 | 3/2012 | Shanker et al. |
| 8,173,537 | B1 | 5/2012 | Chattopadhyay et al. |
| 8,293,013 | B2 | 10/2012 | Dedontney |
| 8,318,575 | B2 | 11/2012 | Lehnert et al. |
| 8,435,608 | B1 | 5/2013 | Subramonium et al. |
| 8,557,712 | B1 | 10/2013 | Antonelli et al. |
| 8,709,551 | B2 | 4/2014 | Fox et al. |
| 8,741,394 | B2 * | 6/2014 | Haverkamp ...... H01J 37/32155 427/579 |
| 8,895,415 | B1 | 11/2014 | Fox et al. |
| 9,028,924 | B2 | 5/2015 | Haverkamp et al. |
| 9,117,668 | B2 | 8/2015 | Hollister et al. |
| 9,165,788 | B2 | 10/2015 | Fox et al. |
| 10,214,816 | B2 | 2/2019 | Haverkamp et al. |
| 10,428,426 | B2 | 10/2019 | Raj et al. |
| 11,746,420 | B2 | 9/2023 | Haverkamp et al. |
| 2001/0007244 | A1 | 7/2001 | Matsuse |
| 2001/0007245 | A1 | 7/2001 | Weichart |
| 2001/0020447 | A1 | 9/2001 | Murugesh et al. |
| 2002/0011656 | A1 | 1/2002 | Swanson et al. |
| 2002/0168868 | A1 | 11/2002 | Todd |
| 2002/0173130 | A1 * | 11/2002 | Pomerede ............ H10D 64/691 438/286 |
| 2002/0179577 | A1 | 12/2002 | Koshimizu et al. |
| 2002/0197831 | A1 | 12/2002 | Todd et al. |
| 2003/0019580 | A1 | 1/2003 | Strang |
| 2003/0037881 | A1 | 2/2003 | Barnes et al. |
| 2003/0059535 | A1 | 3/2003 | Luo et al. |
| 2003/0077916 | A1 | 4/2003 | Xu et al. |
| 2003/0109136 | A1 | 6/2003 | Shioya et al. |
| 2003/0124859 | A1 | 7/2003 | Cheung et al. |
| 2003/0129827 | A1 | 7/2003 | Lee et al. |
| 2003/0161951 | A1 * | 8/2003 | Yuan ................ H01L 21/31612 257/E21.279 |
| 2003/0176080 | A1 | 9/2003 | Fu et al. |

(56) References Cited

U.S. PATENT DOCUMENTS

| | | |
|---|---|---|
| 2003/0194493 A1 | 10/2003 | Chang et al. |
| 2003/0211712 A1 | 11/2003 | Chen et al. |
| 2003/0213560 A1 | 11/2003 | Wang et al. |
| 2004/0011279 A1 | 1/2004 | Joo |
| 2004/0026374 A1 | 2/2004 | Nguyen et al. |
| 2004/0038514 A1 | 2/2004 | Hyodo et al. |
| 2004/0041239 A1 | 3/2004 | Ruelke et al. |
| 2004/0050328 A1 | 3/2004 | Kumagai et al. |
| 2004/0052972 A1 | 3/2004 | Schmitt |
| 2004/0065255 A1 | 4/2004 | Yang et al. |
| 2004/0087079 A1 | 5/2004 | Chen et al. |
| 2004/0091717 A1 | 5/2004 | Li et al. |
| 2004/0115876 A1 | 6/2004 | Goundar et al. |
| 2004/0118342 A1 | 6/2004 | Cheng et al. |
| 2004/0126929 A1 | 7/2004 | Tang et al. |
| 2004/0132268 A1 | 7/2004 | Koo et al. |
| 2004/0137756 A1 | 7/2004 | Li et al. |
| 2004/0142557 A1 | 7/2004 | Levy et al. |
| 2004/0146661 A1 | 7/2004 | Kapoor et al. |
| 2004/0151845 A1 | 8/2004 | Nguyen et al. |
| 2004/0187784 A1 | 9/2004 | Sferlazzo |
| 2004/0214446 A1 | 10/2004 | Kim et al. |
| 2004/0222189 A1 | 11/2004 | Fischer |
| 2004/0224520 A1 | 11/2004 | Yun et al. |
| 2005/0026434 A1 | 2/2005 | Huy et al. |
| 2005/0039681 A1 | 2/2005 | Fukiage |
| 2005/0040456 A1 | 2/2005 | Specht et al. |
| 2005/0042889 A1 | 2/2005 | Lee et al. |
| 2005/0045099 A1 | 3/2005 | Bencher et al. |
| 2005/0057733 A1 | 3/2005 | Owen et al. |
| 2005/0059259 A1 | 3/2005 | O'Meara et al. |
| 2005/0100683 A1 | 5/2005 | Fukiage et al. |
| 2005/0106893 A1 | 5/2005 | Wilk |
| 2005/0118428 A1 | 6/2005 | Bicker et al. |
| 2005/0123690 A1 | 6/2005 | Derderian et al. |
| 2005/0130435 A1 | 6/2005 | Annapragada et al. |
| 2005/0186686 A1 | 8/2005 | Chen et al. |
| 2005/0196960 A1 | 9/2005 | Koo et al. |
| 2005/0202685 A1 | 9/2005 | Huang et al. |
| 2005/0229848 A1 | 10/2005 | Shinriki et al. |
| 2005/0233092 A1 | 10/2005 | Choi et al. |
| 2005/0233591 A1 | 10/2005 | Schmitt et al. |
| 2005/0233595 A1 | 10/2005 | Choi et al. |
| 2005/0250346 A1 | 11/2005 | Schmitt |
| 2005/0277302 A1 | 12/2005 | Nguyen et al. |
| 2006/0046479 A1 | 3/2006 | Rajagopalan et al. |
| 2006/0049139 A1 | 3/2006 | Xia et al. |
| 2006/0091559 A1 | 5/2006 | Nguyen et al. |
| 2006/0093756 A1 | 5/2006 | Rajagopalan et al. |
| 2006/0105580 A1 | 5/2006 | Wirth et al. |
| 2006/0110931 A1 | 5/2006 | Fukazawa et al. |
| 2006/0118518 A1 | 6/2006 | Rusu et al. |
| 2006/0154086 A1 | 7/2006 | Fuller et al. |
| 2006/0166467 A1 | 7/2006 | Witvrouw et al. |
| 2006/0172545 A1 | 8/2006 | Hewes et al. |
| 2006/0189149 A1 | 8/2006 | Lee et al. |
| 2006/0204673 A1 | 9/2006 | Takayasu et al. |
| 2006/0211259 A1 | 9/2006 | Maes et al. |
| 2006/0219363 A1 | 10/2006 | Matsumoto et al. |
| 2006/0257689 A1* | 11/2006 | Sottke ............... C23C 30/005 427/249.1 |
| 2006/0276011 A1 | 12/2006 | Fogel et al. |
| 2006/0276054 A1 | 12/2006 | Lakshmanan et al. |
| 2007/0031236 A1 | 2/2007 | Chen |
| 2007/0042131 A1 | 2/2007 | Soo et al. |
| 2007/0042577 A1* | 2/2007 | Ishizaka ............ H01L 21/28562 257/E21.171 |
| 2007/0054504 A1 | 3/2007 | Chen et al. |
| 2007/0059942 A1 | 3/2007 | Hu et al. |
| 2007/0110918 A1 | 5/2007 | Yuda et al. |
| 2007/0141273 A1 | 6/2007 | Nakano |
| 2007/0144215 A1 | 6/2007 | Kharas |
| 2007/0202640 A1 | 8/2007 | Al-Bayati et al. |
| 2007/0215877 A1 | 9/2007 | Kato et al. |
| 2007/0221331 A1 | 9/2007 | Lee |
| 2007/0249171 A1 | 10/2007 | Sung et al. |
| 2007/0264842 A1 | 11/2007 | Kim |
| 2008/0011424 A1 | 1/2008 | Yin et al. |
| 2008/0020591 A1 | 1/2008 | Balseanu et al. |
| 2008/0050883 A1 | 2/2008 | Enicks |
| 2008/0073645 A1 | 3/2008 | Todd et al. |
| 2008/0113521 A1 | 5/2008 | Tanaka et al. |
| 2008/0118754 A1 | 5/2008 | Xianyu et al. |
| 2008/0119049 A1 | 5/2008 | Sung et al. |
| 2008/0145536 A1 | 6/2008 | Zhang et al. |
| 2008/0153300 A1 | 6/2008 | Bok |
| 2008/0190886 A1 | 8/2008 | Choi et al. |
| 2008/0202688 A1 | 8/2008 | Wu et al. |
| 2008/0233723 A1 | 9/2008 | Okumura et al. |
| 2008/0233734 A1 | 9/2008 | Ohara et al. |
| 2008/0268176 A1 | 10/2008 | Choi et al. |
| 2008/0299747 A1 | 12/2008 | Arai et al. |
| 2009/0004404 A1* | 1/2009 | Hartsuiker ........ C03B 37/01815 427/579 |
| 2009/0022908 A1 | 1/2009 | Yang et al. |
| 2009/0029564 A1 | 1/2009 | Yamashita et al. |
| 2009/0035927 A1 | 2/2009 | Olsen et al. |
| 2009/0053903 A1 | 2/2009 | Kobayashi et al. |
| 2009/0061083 A1 | 3/2009 | Chiang et al. |
| 2009/0061644 A1 | 3/2009 | Chiang et al. |
| 2009/0061646 A1 | 3/2009 | Chiang et al. |
| 2009/0095220 A1 | 4/2009 | Meinhold et al. |
| 2009/0095221 A1 | 4/2009 | Tam et al. |
| 2009/0097105 A1 | 4/2009 | Hart et al. |
| 2009/0104790 A1 | 4/2009 | Liang |
| 2009/0117272 A1 | 5/2009 | Behres |
| 2009/0136665 A1 | 5/2009 | Choi et al. |
| 2009/0142167 A1 | 6/2009 | Gage et al. |
| 2009/0149022 A1 | 6/2009 | Chan et al. |
| 2009/0159119 A1 | 6/2009 | Basol |
| 2009/0238997 A1 | 9/2009 | De Vries et al. |
| 2009/0246942 A1 | 10/2009 | Imaeda et al. |
| 2009/0275210 A1 | 11/2009 | Shanker et al. |
| 2009/0286402 A1 | 11/2009 | Xia et al. |
| 2009/0295296 A1 | 12/2009 | Shannon et al. |
| 2009/0297404 A1 | 12/2009 | Shannon et al. |
| 2009/0305516 A1 | 12/2009 | Hsu et al. |
| 2010/0001269 A1 | 1/2010 | Verma et al. |
| 2010/0012030 A1 | 1/2010 | Todd et al. |
| 2010/0022097 A1 | 1/2010 | Yamoto et al. |
| 2010/0032812 A1 | 2/2010 | Sedky et al. |
| 2010/0099271 A1 | 4/2010 | Hausmann et al. |
| 2010/0102359 A1 | 4/2010 | Khan et al. |
| 2010/0109065 A1 | 5/2010 | Oh et al. |
| 2010/0151691 A1 | 6/2010 | Henri et al. |
| 2010/0167551 A1 | 7/2010 | DeDontney |
| 2010/0184302 A1 | 7/2010 | Lee et al. |
| 2010/0190353 A1 | 7/2010 | Nguyen et al. |
| 2010/0210093 A1 | 8/2010 | Kato et al. |
| 2010/0243607 A1 | 9/2010 | Ohse et al. |
| 2011/0018044 A1 | 1/2011 | Lim et al. |
| 2011/0031217 A1 | 2/2011 | Himori |
| 2011/0036168 A1 | 2/2011 | Lin |
| 2011/0111136 A1 | 5/2011 | Slevin et al. |
| 2011/0143019 A1 | 6/2011 | Mosso et al. |
| 2011/0151142 A1 | 6/2011 | Seamons et al. |
| 2011/0151678 A1 | 6/2011 | Ashtiani et al. |
| 2011/0186545 A1 | 8/2011 | Mahadeswaraswamy et al. |
| 2011/0223759 A1 | 9/2011 | Wang et al. |
| 2011/0236594 A1 | 9/2011 | Haverkamp et al. |
| 2011/0236600 A1 | 9/2011 | Fox et al. |
| 2012/0142172 A1 | 6/2012 | Fox et al. |
| 2012/0214305 A1 | 8/2012 | Radwan et al. |
| 2013/0157466 A1 | 6/2013 | Fox et al. |
| 2013/0171834 A1 | 7/2013 | Haverkamp et al. |
| 2013/0267081 A1 | 10/2013 | Fox et al. |
| 2013/0316518 A1 | 11/2013 | Hollister et al. |
| 2014/0231389 A1 | 8/2014 | Nagami et al. |
| 2014/0272182 A1 | 9/2014 | Koo et al. |
| 2014/0357064 A1 | 12/2014 | Fox et al. |
| 2015/0013607 A1 | 1/2015 | Haverkamp et al. |
| 2015/0325435 A1 | 11/2015 | Hollister et al. |
| 2017/0062254 A1 | 3/2017 | Hirochi |

(56) References Cited

U.S. PATENT DOCUMENTS

| | | | |
|---|---|---|---|
| 2018/0223429 | A1 | 8/2018 | Fukazawa et al. |
| 2019/0376186 | A1 | 12/2019 | Haverkamp et al. |
| 2025/0112040 | A1* | 4/2025 | Meng .................... C23C 16/505 |

FOREIGN PATENT DOCUMENTS

| | | | |
|---|---|---|---|
| CN | 101419914 | A | 4/2009 |
| DE | 10143235 | A1 | 3/2003 |
| EP | 0394054 | A1 | 10/1990 |
| JP | H06240459 | A | 8/1994 |
| JP | H07326589 | A | 12/1995 |
| JP | 2000208422 | A | 7/2000 |
| JP | 2001044191 | A | 2/2001 |
| JP | 2007165883 | A | 6/2007 |
| KR | 20050034566 | A | 4/2005 |
| KR | 20060047185 | A | 5/2006 |
| KR | 20060056883 | A | 5/2006 |
| KR | 20070007915 | A | 1/2007 |
| KR | 20080000684 | A | 1/2008 |
| KR | 20080100793 | A | 11/2008 |
| TW | 200931520 | A | 7/2009 |
| WO | WO-2007097024 | A1 | 8/2007 |
| WO | WO-2008127469 | A2 | 10/2008 |
| WO | WO-2009098548 | A1 | 8/2009 |
| WO | WO-2011093979 | A2 | 8/2011 |
| WO | WO-2012036808 | A2 | 3/2012 |
| WO | WO-2013123143 | A1 | 8/2013 |
| WO | WO-2014159530 | A1 | 10/2014 |

OTHER PUBLICATIONS

Creatore, M., et al., "Flexible Organic Electronics: The Role of Plasma Deposition in Multi-layer Permeation Barrier Technology". 49th Annual Technical Conference Proceedings (2006); 2006 Society of Vacuum Coaters 505/856-7188, pp. 143-146.*
Lobbins, J.M., et al., "Development of plasma dielectric deposition method for increased pre-metal dielectric interfacial film stability". Solid-State Electronics, vol. 46, Issue 9, Sep. 2002, pp. 1367-1373.*
Cooper, James S., et al., "Plasma sputtering system for deposition of thin ® lm combinatorial libraries". Review of Scientific Instruments 76, 062221, (2005), pp. 1-7.*
Bahari et al., (Jul./Aug. 2006) "Growth of a stacked silicon nitride/silicon oxide dielectric on Si (100)," J. Vac. Sci. Technol. B 24(4):2119-2123.
Brochure PECVD3000, (Dec. 2003) "NOVELLUS less is more VECTOR®," Novellus Systems, Inc.,pp. 1-7, Source location: Lam Research Corporation, [retrieved on Sep. 26, 2015 at http://www.lamresearch.com/. Available: http://market360online.com/sqlimages/1182/33825.pdf.], 18pp.
Chinese Office Action dated Jul. 21, 2015 issued in Application No. CN 201380015652.6.
Chinese Office Action dated Mar. 26, 2015 issued in Application No. CN 201180044067.X.
Chinese Office Action dated Mar. 29, 2016 issued in Application No. CN 201180044067.X.
Dharmadhikari, Vineet, (Feb. 2005) "Novellus Delivers 250th VECTOR PECVD System," Interconnect, 7(1):6, Source location: Online Market 360. [ http://www.onlinemarket360.com/. Available: http://market360online.com/sqlimages/1182/42820.pdf.], 8pp.
"Diaphragm Valves," (Oct. 2003) Microelectronics Product Line, Catalog 4505/USA, Parker Hannifin Corporation, pp. 1-49.
Gatz, S., et al., (2008) "Thermal stability of amorphous silicon/silicon nitride stacks for passivating crystalline silicon solar cells," Applied Physics Letters 93:(173502): pp. 1-3.
Han et al. (Jun. 1994) "Modeling the Properties of PECVD Silicon Dioxide Films Using Optimzed Back-Propagation Neural Networks," IEE Transaction on Components, Packaging, and Manufacturing Technology—Part A, 17(2):174-182.
Hoogeland et al., (2009) "Plasma-assisted atomic layer deposition of TiN/A1203 stacks for metal-oxide-semiconductor capacitor applications," Journal of Applied Physics 106, 114107-1-114107-7, 7pp.

Jang, J., et al., "Vertical Cell Array Using TCAT (Terabit Cell Array Transistor) Technology for Ultra High Density NAND Flash Memory," 2009 Symposium on VLSI Technology Digest of Technical Papers, 2009, pp. 192-193.
Keipert-Colberg, Sinje, et al., (Sep. 5-9, 2011) "Investigation of a PECVD silicon oxide/silicon nitride passivation system concerning process influences," Presented at the 26th European PV Solar Energy Conference and Exhibition, Hamburg, Germany, pp. 1-4.
Kim et al., (2013) "Double antireflection coating layer with silicon nitride and silicon oxide for crystalline silicon solar cell," J. Electroceram, 30:41-45.
Kim, J., et al., "Novel Vertical-Stacked-Array-Transistor (VSAT) for Ultra-High-Density and Cost- Effective NAND Flash Memory Devices and SSD (Sold State Drive)," 2009 Symposium on VLSI Technology Digest of Technical Papers, 2009, pp. 186-187.
Kim, W., et al., "Multi-Layered Vertical Gate NAND Flash Overcoming Stacking Limit for Terabit Density Storage," 2009 Symposium on VLSI Technology Digest of Technical Papers, 2009, pp. 188-189.
Korean Decision for Grant of Patent dated Feb. 26, 2018 issued in Application No. KR 10-2011-0026238.
Korean Decision for Grant of Patent dated Feb. 28, 2018 issued in Application No. KR 10-2013-7009445.
Korean First Office Action dated Feb. 10, 2020 issued in Application No. KR 10-2019-0143172.
Korean First Office Action dated Feb. 25, 2021 issued in Application No. KR 10-2021-0013172.
Korean First Office Action dated Jul. 31, 2017 issued in Application No. KR 10-2013-7009445.
Korean First Office Action dated Jun. 18, 2018 issued in Application No. KR 10-2018-0059081.
Korean First Office Action dated Mar. 13, 2020 issued in Application No. KR 10-2013-0057946.
Korean Office Action dated Apr. 17, 2017 issued in Application No. KR 10-2011-0026238.
Korean Second Office Action dated Dec. 18, 2018 issued in Application No. KR 10-2018-0059081.
Korean Second Office Action dated Oct. 30, 2020 issued in Application No. KR 10-2019-0143172.
Korean Second Office Action dated Sep. 23, 2020 issued in Application No. KR 10-2013-0057946.
Korean Third Office Action dated Nov. 26, 2020 issued in Application No. KR 10-2013-0057946.
KR Office Action dated Dec. 23, 2021, in Application No. KR1020210159344 with English translation.
KR Office Action dated Jun. 28, 2022 in Application No. KR10-2021-0159344 with English translation.
KR Office Action dated Mar. 27, 2023, in Application No. KR10-2023-0024947 with English translation.
Lam Research, "UMC Takes Delivery of 250th Vector® PECVD System From Novellus," Novellus Systems, Inc., Sep. 1, 2004, pp. 1-2, Source location: Lam Research Corporation, [retrieved on Jan. 4, 2015 at http://www.lamresearch.com/. Available: http://files.shareholder.com/downloads/LRCX/0x0x761840/E64871C7-4EA2-4456-9875-57206CCB600F/LRCX_News_2004_9_1_Novellus_Archive.pdf.], 2 pp.
Moisan, M., et al., (Oct. 1987) "New surface wave launchers for sustaining plasma columns at submicrowave frequencies (1-300 MHZ)" Rev. Sci. Instrum. 58(10):1895-1900.
Ong, Y. et al., (2006) "Process Analysis and Optimization on PECVD Amorphous Silicon on Glass Substrate," Journal of Physics: Conference Series, 34:812-817.
PCT International Preliminary Report on Patentability and Written Opinion dated Aug. 28, 2014, issued in PCT/US2013/026069.
PCT International Preliminary Report on Patentability and Written Opinion dated Mar. 28, 2013, issued in PCT/US2011/047107.
PCT International Search Report and Written Opinion dated Apr. 9, 2012, issued in PCT/US2011/047107.
PCT International Search Report and Written Opinion dated Jun. 3, 2013, issued in PCT/US2013/026069.
Plasma Enhanced Atomic Layer Deposition (PEALD), Website: http://www.asm.com/index.php?option=com_content&task=view&id=19&Itemid=161 (2010), 1 page.

(56) References Cited

OTHER PUBLICATIONS

Schmidt et al., (2001) "Surface Passivation of silicon solar cells using plasma-enhanced chemical-vapour-deposited SiN films and thin thermal SiO2/plasma SiN stacks." Semicond. Sci. Technol., 16:164-170.
Schultz et al., (2005) "Silicon Oxide/Silicon Nitride Stack System for 20% Efficient Silicon Solar Cells," IEEE, pp. 872-876.
Singapore Search and Examination Report dated Mar. 13, 2014, issued in Application No. SG 201301550-8.
Singapore Search and Examination Report dated Nov. 28, 2013, issued in Application No. SG 201102162-3.
Singapore Search Report and Written Opinion dated Apr. 18, 2013, issued in Application No. SG 201102162-3.
Su, Chen-Yi, et al., (2012) "Deposition and characterization of MgO/Si gate stacks grown by molecular beam epitaxy," Thin Solid Films 520:4508-4511.
Taiwan Examination Report dated Jun. 19, 2017 issued in Application No. TW 102118087.
Taiwan Notice of Allowance and Search Report dated Oct. 25, 2016 issued in Application No. TW 102112349.
Taiwan Office Action dated Oct. 15, 2015, issued in Application No. TW 100130548.
U.S. Corrected Notice of Allowance dated Aug. 3, 2023, in U.S. Appl. No. 16/235,593.
US Final Office Action dated Aug. 11, 2015 issued in U.S. Appl. No. 13/766,696.
US Final Office Action dated Aug. 9, 2013 issued in U.S. Appl. No. 12/970,853.
US Final Office Action dated Feb. 13, 2015 issued in U.S. Appl. No. 13/857,566.
US Final Office Action dated Jul. 2, 2014 issued in U.S. Appl. No. 13/478,999.
US Final Office Action dated May 13, 2014 issued in U.S. Appl. No. 13/313,422.
US Final Office Action dated May 16, 2013 issued in U.S. Appl. No. 12/970,846.
US Final Office Action dated May 17, 2017 issued in U.S. Appl. No. 14/262,196.
US Final Office Action dated May 31, 2018 issued in U.S. Appl. No. 14/262,196.
US Final Office Action dated Nov. 8, 2016 issued in U.S. Appl. No. 14/802,766.
U.S. Final Office Action dated Oct. 28, 2021 in U.S. Appl. No. 16/235,593.
U.S Non Final Office Action dated May 17, 2022 in U.S. Appl. No. 16/235,593.
U.S. Non-Final Office Action dated Jul. 7, 2023, in U.S. Appl. No. 17/632,074.
U.S. Non-Final office Action dated Oct. 31, 2022 in U.S. Appl. No. 16/235,593.
U.S. Notice of Allowance dated Apr. 19, 2023 in U.S. Appl. No. 16/235,593.
US Notice of Allowance dated Apr. 20, 2015 issued in U.S. Appl. No. 13/478,999.
US Notice of Allowance dated Dec. 15, 2014 issued in U.S. Appl. No. 13/671,424.
US Notice of Allowance dated Dec. 18, 2013 issued in U.S. Appl. No. 12/970,853.
US Notice of Allowance dated Feb. 3, 2015 issued in U.S. Appl. No. 13/671,424.
US Notice of Allowance dated Jan. 24, 2014 issued in U.S. Appl. No. 12/970,846.
US Notice of Allowance dated Jul. 14, 2014 issued in U.S. Appl. No. 13/671,424.
US Notice of Allowance dated Jun. 17, 2015 issued in U.S. Appl. No. 13/857,566.
US Notice of Allowance dated Jun. 23, 2014 issued in U.S. Appl. No. 13/907,742.
US Notice of Allowance dated Oct. 16, 2014 issued in U.S. Appl. No. 13/907,742.
US Notice of Allowance dated Oct. 4, 2018 issued in U.S. Appl. No. 14/262,196.
US Office Action dated Apr. 15, 2021 issued in U.S. Appl. No. 16/235,593.
US Office Action dated Apr. 9, 2013 issued in U.S. Appl. No. 12/970,853.
US Office Action dated Feb. 28, 2014 issued in U.S. Appl. No. 13/671,424.
US Office Action dated Feb. 5, 2014 issued in U.S. Appl. No. 13/478,999.
US Office Action dated Jan. 30, 2014 issued in U.S. Appl. No. 13/313,422.
US Office Action dated Jul. 10, 2014 issued in U.S. Appl. No. 13/857,566.
US Office Action dated Jun. 16, 2016 issued in U.S. Appl. No. 14/802,766.
US Office Action dated Mar. 16, 2015 issued in U.S. Appl. No. 13/766,696.
US Office Action dated Nov. 16, 2017 issued in U.S. Appl. No. 14/262,196.
US Office Action dated Nov. 26, 2012 issued in U.S. Appl. No. 12/970,846.
US Office Action dated Nov. 6, 2014 issued in U.S. Appl. No. 13/478,999.
US Office Action dated Nov. 9, 2016 issued in U.S. Appl. No. 14/262,196.
US Office Action dated Sep. 11, 2013 issued in U.S. Appl. No. 12/970,846.
U.S. Appl. No. 61/289,300 dated Dec. 22, 2009 and entitled "PECVD Multi-Step Processing With Continuous Plasma," 35 pages. (2009).
U.S. Restriction requirement dated Apr. 20, 2023 in U.S. Appl. No. 17/632,074.
Viana et al. (Jun. 2001) "Analysis of SiO2 Thin Film Deposited by PECVD using an Oxygen-TEOS-Argon Mixture," Brazilian Journal of Physics, 31(2):299-303.
Zohni et al., (2007) "Investigating thin film stresses in stacked silicon dioxide/silicon nitride structures and quantifying their effects on frequency response," J. Micromech. Microeng. 17:1042-1051.
U.S. Corrected Notice of Allowance dated Jul. 17, 2024 in U.S. Appl. No. 17/632,074.
U.S. Final Office Action dated Mar. 29, 2024 in U.S. Appl. No. 17/632,074.
U.S. Notice of Allowance dated Jul. 5, 2024 in U.S. Appl. No. 17/632,074.

\* cited by examiner

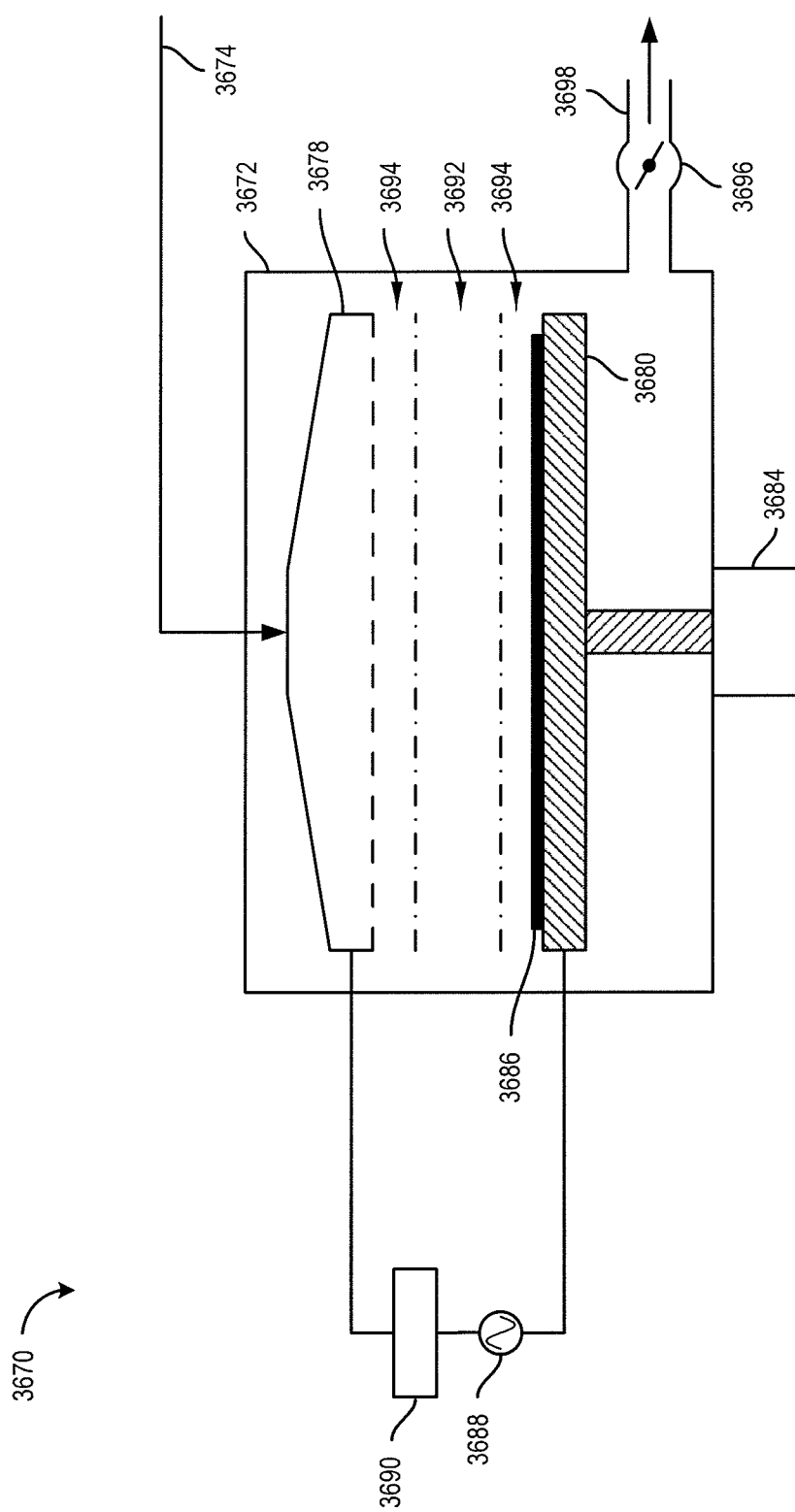

PLASMA-ENHANCED DEPOSITION OF FILM STACKS

INCORPORATION BY REFERENCE

An Application Data Sheet is filed concurrently with this specification as part of the present application. Each application that the present application claims benefit of or priority to as identified in the concurrently filed Application Data Sheet is incorporated by reference herein in its entirety and for all purposes. Specifically, this application is a continuation claiming priority to U.S. application Ser. No. 16/235,593, titled "PECVD APPARATUS FOR IN-SITU DEPOSITION OF FILM STACKS" and filed on Dec. 28, 2018 (issued as U.S. Pat. No. 11,746,420 on Sep. 5, 2023), which is a continuation claiming priority to U.S. application Ser. No. 14/262,196, titled "PECVD APPARATUS FOR IN-SITU DEPOSITION OF FILM STACKS" and filed on Apr. 25, 2014 (issued as U.S. Pat. No. 10,214,816 on Feb. 26, 2019), which is a divisional claiming priority to U.S. application Ser. No. 12/970,846, titled "IN-SITU DEPOSITION OF FILM STACKS" and filed on Dec. 16, 2010 (issued as U.S. Pat. No. 8,741,394 on Jun. 3, 2014), which claims priority to U.S. Provisional Patent Application Ser. No. 61/317,656, titled "IN-SITU PLASMA-ENHANCED CHEMICAL VAPOR DEPOSITION OF FILM STACKS," and filed on Mar. 25, 2010; U.S. Provisional Patent Application Ser. No. 61/382,465, titled "IN-SITU PLASMA-ENHANCED CHEMICAL VAPOR DEPOSITION OF FILM STACKS," and filed on Sep. 13, 2010; U.S. Provisional Patent Application Ser. No. 61/382,468, titled "SMOOTH SILANE-BASED FILMS," and filed on Sep. 13, 2010; and U.S. Provisional Patent Application Ser. No. 61/394,707, titled "IN-SITU PLASMA-ENHANCED CHEMICAL VAPOR DEPOSITION OF FILM STACKS," and filed on Oct. 19, 2010, the entirety of which are hereby incorporated herein by reference for all purposes.

BACKGROUND

Various thin film layers for semiconductor devices may be deposited by chemical vapor deposition (CVD) and/or plasma-enhanced chemical vapor deposition (PECVD) processes. Some deposition processes generate small gas phase particles during process, which may decorate a deposition surface, potentially contaminating the device. Such particles may cling to the device, potentially blocking subsequent etch and/or deposition events, which may ultimately lead to device failure. Further, particles may be knocked off the device downstream, potentially contaminating other process tools.

Some approaches to addressing gas-phase particle generation may attempt to suppress particle generation by diluting reaction conditions. However, such approaches may diminish film deposition rates, requiring the installation and maintenance of additional process tools to support a production line. Further, films produced by such approaches may have physical or electrical characteristics that provide inadequate device performance. Further still, such approaches may not address particles formed in various exhaust hardware for the process tool, which may backstream and contaminate the device. These particles may be delivered to the substrate surface during deposition. Once coated by additional film material, the small size of the particles may be magnified, causing ripples and distortions at the film surface. These ripples may make it difficult to pattern the resulting films.

Patterning problems may also be caused by rough films. Some traditional atomic layer deposition (ALD), chemical vapor deposition (CVD), high-density plasma chemical vapor deposition (HDP-CVD) and plasma-enhanced chemical vapor deposition (PECVD) processes for depositing film layers may produce unacceptably rough films, cause unacceptable interfacial mixing between film layers, and may have interfacial defects caused by vacuum breaks between successively deposited film layers. The resulting rough film interfaces and interfacial defects may be magnified by subsequently deposited layers as the film stack is built, so that the top surface of the film stack may be unacceptably rough for downstream patterning processes. Further, interfacial defects within the film stack may lead to structural and/or electrical defects in the resulting integrated device.

SUMMARY

Various embodiments are described herein related to depositing film stacks in a process tool in-situ (i.e., without a vacuum break or air exposure) using plasma-enhanced chemical vapor deposition (PECVD). In one example, a method for depositing, on a substrate, a film stack including films of different compositions in-situ in a process station using a plasma is described. The method includes, in a first plasma-activated film deposition phase, depositing a first layer of film having a first film composition on the substrate; in a second plasma-activated deposition phase, depositing a second layer of film having a second film composition on the first layer of film; and sustaining the plasma while transitioning a composition of the plasma from a first plasma composition of the first plasma-activated film deposition phase to a second plasma composition of the second plasma-activated film deposition phase.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 36 schematically shows an example PECVD process station according to an embodiment of the present disclosure.

DETAILED DESCRIPTION

Figure 1:
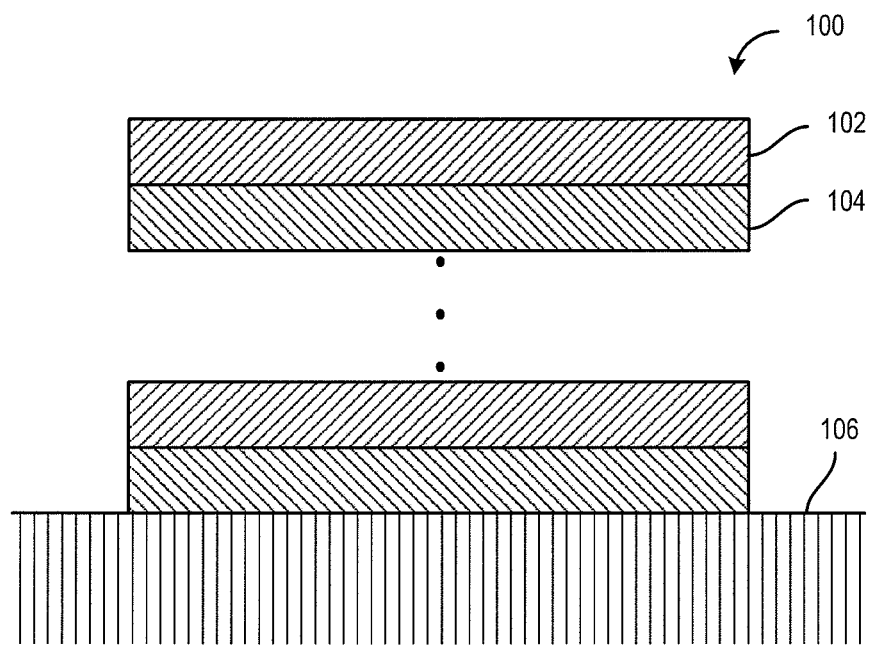
FIG. 1 schematically shows an example embodiment of a film stack including alternating layers of a first film and a second film deposited on a substrate.

Some memory devices, such as NAND flash memory, are arranged in two-dimensional arrays. Because such memory devices are limited to a planar arrangement, die size and memory density parameters may constrain the total memory capacity of the device. In turn, moving to larger die sizes to expand memory capacity may comparatively increase the cost of the memory device, which may delay adoption of larger capacity memory devices. Recently, some approaches for arranging memory gates into three-dimensional (3D) arrays have been proposed. Some of these approaches incorporate of transistors formed by patterning stacks of alternating film composition. FIG. 1 schematically shows an example film stack 100 including alternating layers of first film 102 and second film 104 on a substrate 106.

Patterning such film stacks can be difficult. For example, rough film surfaces caused during deposition and/or film cracks caused by vacuum breaks between deposition events may cause ripples in subsequently deposited layers. Further, ripples and surface irregularities can also be caused by particles included in the film as the film is being deposited. Such small particle defects may be generated from the interaction of incompatible processes gases during deposition, during an in-situ transition from one film deposition process to another, and/or during wafer handling operations in ex-situ deposition processes. As the film stack is built, these roughness- and defect-caused undulations may grow in size and may cause focus, exposure, and etch problems in downstream patterning operations. Thus, it is desirable for each layer to be highly smooth.

Accordingly, various embodiments are disclosed herein that are related to providing smooth film surfaces. For example, embodiments are described below related to ultra-smooth film deposition chemistries and processes, which may result in ultra-smooth film surfaces. Further, embodiments are also described below related to low defect tool hardware and processes for depositing film stacks without intervening vacuum breaks, which may also result in ultra-smooth film stack surfaces.

While many plasma-enhanced chemical vapor deposition (PECVD) or chemical vapor deposition (CVD) processes may be used to deposit such thin films, building thick stacks of multiple layers may present manufacturing challenges. Some approaches for depositing such silicon dioxide films include using tetraethyl orthosilicate ($Si(OC_2H_5)_4$, or TEOS)-based plasma-enhanced chemical vapor deposition (PECVD) processes or silane-based PECVD processes. However, these conventional PECVD processes may produce unacceptably rough films. For example, a conventional silane-based PECVD process for depositing $SiO_2$ exhibits an absolute roughness (Ra) of 7.2 Å for a 1000 Å film deposited on a bare silicon substrate while a conventional TEOS-based PECVD process for depositing $SiO_2$ exhibits an roughness of 4.5 Å Ra for a 1000 Å film deposited on a bare silicon substrate.

Figure 2:
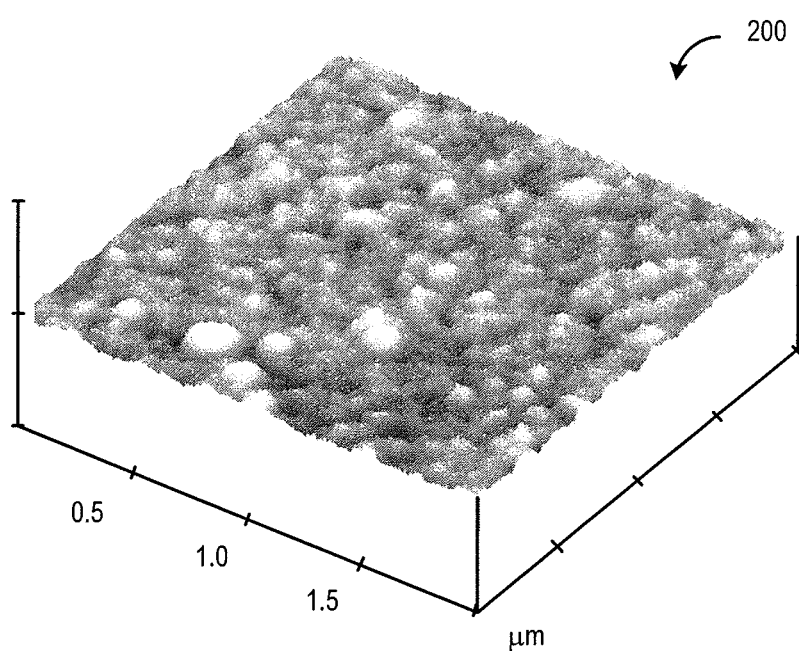
FIG. 2 shows an atomic force microscopy (AFM) image of a surface of an example tetraethyl orthosilicate (TEOS)-based plasma-enhanced chemical vapor deposition (PECVD) $SiO_2$ film deposited at the top of a film stack including 11 pairs of alternating $SiN/SiO_2$ layers.
Figure 3:
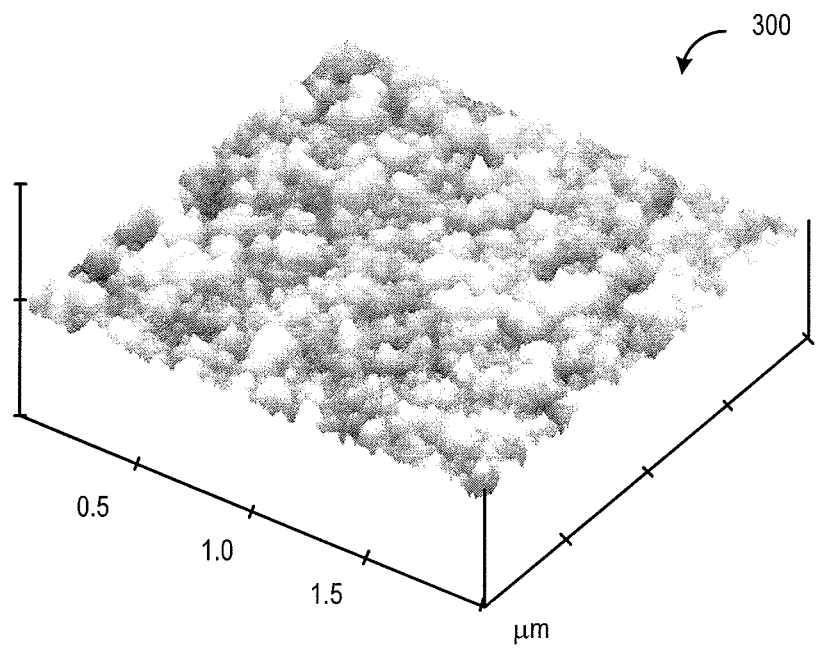
FIG. 3 shows an atomic force microscopy (AFM) image of a surface of an example conventional silane-based PECVD $SiO_2$ film deposited at the top of a film stack including 11 pairs of alternating $SiN/SiO_2$ layers.

The effect of stacking rough films can be cumulative, so that a top surface of the film stack may be rougher than the individual films. FIGS. 2 and 3 show surface roughness images for example $SiN/SiO_2$ film stacks measured by atomic force microscopy (AFM). FIG. 2 depicts an AFM image 200 of a film stack having 11 pairs of $SiN/SiO_2$ films using a TEOS-based PECVD $SiO_2$ deposition process. For reference, the roughness of a 1000 Å silicon nitride film deposited on a bare silicon substrate is 5.1 Å Ra.

In the example shown in FIG. 2, the TEOS-based $SiO_2$ film at the top of the film stack exhibits a roughness of approximately 9.9-10.6 Å Ra. FIG. 3 depicts an AFM image 300 of a film stack having 11 alternating pairs of $SiN/SiO_2$ films using a silane-based PECVD $SiO_2$ process (e.g., using silane at a flow rate of approximately 500-600 sccm). In the example shown in FIG. 3, the $SiO_2$ film has a roughness of approximately 17 to 19 Å Ra. Thus, it will be appreciated that the conventional PECVD $SiO_2$ processes may deposit films that are comparatively rougher than the underlying film.

Some other approaches for depositing smooth silicon dioxide films employ high-density plasma chemical vapor deposition (HDP-CVD) processes. However, HDP-CVD processes typically employ ion densities of greater than $2 \times 10^{10}$ ions/cm$^3$. Such high ion density deposition environments may unselectively sputter underlying films as the $SiO_2$ layer is deposited. This may lead to unacceptable interlayer oxidation, potentially leading to electrical defects or structural defects at the film interfaces. Further, HDP-CVD processes typically use inductively-coupled plasma sources, which are comparatively more expensive and are comparatively more likely to generate defects during process relative to the capacitively-coupled plasma sources used in PECVD processes.

Further, because HDP-CVD process equipment may not be suitable for depositing more than one film composition in-situ, vacuum breaks may be required during processing, potentially leading to the inclusion of interlayer defects. For example, in one scenario, film cracking may result from vacuum break conditions as substrates are exchanged between separate tools. In another scenario, a film may absorb atmospheric moisture during a vacuum break. Building film stacks using ex-situ processes may also lead to additional processing equipment expense, because film-specific tools may be required and because added substrate handling times between film-specific tools may reduce fab throughput.

Thus, various embodiments are disclosed herein that are related to plasma-enhanced chemical vapor deposition (PECVD) processes and equipment used for depositing film stacks in-situ without intervening vacuum breaks. Further, various embodiments are described here for depositing ultra-smooth silicon-containing films, including dielectric films such as silicon oxides (e.g., $SiO_2$ and sub-oxides thereof), silicon oxynitrides, and silicon nitrides, and conductive films such as polycrystalline and amorphous silicon. Example film stacks that may be constructed in-situ using the embodiments described herein include, but are not limited to, alternating layers of silicon dioxide and silicon nitride, alternating layers of polycrystalline silicon and silicon dioxide, alternating layers of polycrystalline silicon and silicon nitride, and alternating layers of doped and undoped amorphous and/or polycrystalline silicon, which in some embodiments, may deposited in situ. Further still, various embodiments are described relating to novel in-situ PECVD processes and equipment that may comparatively reduce defect generation relative to conventional PECVD processes and equipment when depositing layers and film stacks such as the examples listed above.

Figure 4:
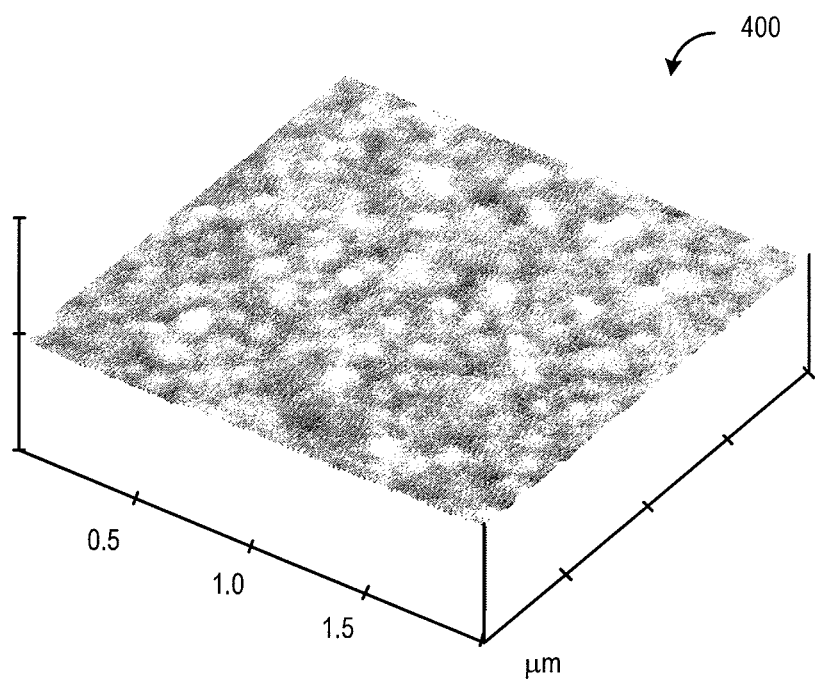
FIG. 4 shows an atomic force microscopy (AFM) image of a surface of an example ultra-smooth PECVD $SiO_2$ film deposited according to an embodiment of the present disclosure at the top of a film stack including 14 pairs of alternating $SiN/SiO_2$ layers.

As an example, FIG. 4 shows an AFM image 400 of an example film stack having 14 alternating pairs of a silicon nitride film and an ultra-smooth silicon dioxide film deposited according to an example of an ultra-smooth PECVD process of the present disclosure. In the example shown in FIG. 4, the ultra-smooth PECVD $SiO_2$ top layer has a roughness of approximately 4.6 Å Ra, exhibiting a greater than two-fold improvement in surface roughness compared to the conventional PECVD $SiO_2$ processes described above and shown in FIGS. 2 and 3, though some ultra-smooth PECVD silicon dioxide films (discussed in more detail below) deposited on silicon nitride surfaces exhibit roughness values of approximately 3.6 Å Ra. Further, as explained above, the roughness of a 1000 Å silicon nitride film deposited on a bare silicon substrate is 5.1 Å Ra. Thus, it will be appreciated that, in some embodiments, the ultra-smooth PECVD $SiO_2$ process may provide a top surface roughness that is less than a roughness of an underlying film. For example, in some embodiments, an ultra-smooth PECVD $SiO_2$ film may have an absolute roughness that is approximately 90% or less than the roughness of an underlying film.

Without wishing to be bound by theory, it is believed that, in some embodiments, the ultra-smooth character of ultra-smooth PECVD films may result from conditions where surface adsorption, rearrangement and/or assembly reactions occur at a substantially faster rate and/or in greater abundance than gas-phase polymerization and adsorption reactions. Under such conditions, the radicals generated in the plasma may be relatively more likely to be adsorbed to the substrate and link on the substrate surface than they are to react in the gas phase above the substrate.

Figure 5:
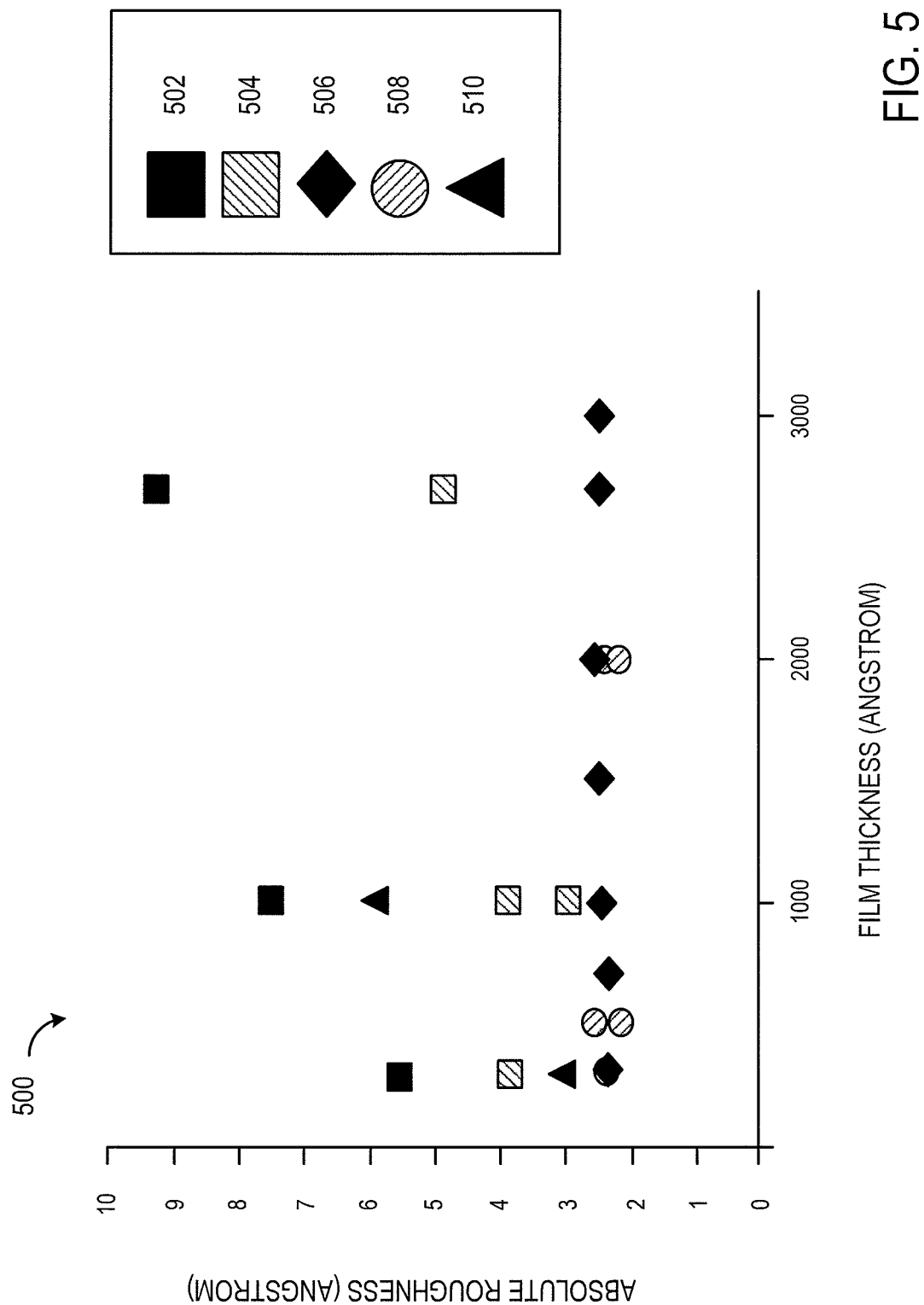
FIG. 5 graphically shows a comparison of absolute roughness between conventional PECVD and atomic layer deposition (ALD) SiO$_2$ films and example ultra-smooth PECVD SiO$_2$ films deposited according to embodiments of the present disclosure.

Thus, an ultra-smooth PECVD process according to the present disclosure may provide a film that has an absolute roughness that is substantially independent of film thickness. For example, in some examples, an ultra-smooth PECVD $SiO_2$ film may exhibit a surface roughness of less than or equal to 4.5 Å for film thicknesses of up to 3000 Å as measured on a silicon substrate. For example, FIG. 5 shows a graph 500 comparing surface absolute roughness as a function of film thickness for silicon dioxide films deposited on bare silicon substrates by various example processes, including a conventional silane-based PECVD process example (points 502), a conventional TEOS-based PECVD process example (points 504), and an example ultra-smooth silicon dioxide film deposited by an example ultra-smooth PECVD process according to the present disclosure (points 506). The example films made by conventional PECVD processes shown in FIG. 5 may be characterized as having gas-phase polymerization reactions that occur at a faster rate than surface assembly and rearrangement reactions. Thus, points 502 and points 504 trend toward increasing absolute roughness with increasing film thickness. In contrast, the example ultra-smooth PECVD silicon dioxide film shown in FIG. 5 exhibits a surface roughness of approximately 2.5 Å Ra for film thicknesses of up to 3000 Å while having a substantially constant absolute roughness.

FIG. 5 also shows a comparison between example silicon dioxide films deposited by high-density plasma chemical vapor deposition (HDP-CVD) processes and the ultra-smooth PECVD-deposited silicon dioxide film example discussed above. As shown in FIG. 5, the example ultra-smooth PECVD silicon dioxide film has approximately the same absolute surface roughness as the example HDP-CVD silicon dioxide film (points 508). However, as explained above, HDP-CVD processes may damage underlying films and may be unable to produce film stacks in-situ. In contrast, as explained in detail below, ultra-smooth PECVD films may be deposited without using high ion densities (e.g., with ion densities of less than $2 \times 10^{10}$ ions/cm$^3$) and therefore may maintain a comparatively sharp interfacial composition boundary with an underlying film. Further, ultra-smooth PECVD films may be deposited in-situ with other film processes, potentially avoiding vacuum breaks when building a film stack.

FIG. 5 also shows a comparison between an example $SiO_2$ film deposited by an atomic layer deposition (ALD) process (points 510) and the ultra-smooth PECVD film example described above. Like the conventional PECVD processes, the example film deposited by the ALD process exhibits a thickness-dependent increase in absolute roughness. While ALD processes theoretically deposit a monolayer of film at a time, differences in adsorption of the otherwise segregated deposition precursors may lead to the formation of condensed phase precursor domains (e.g., the surface may include both chemisorbed and physisorbed precursor). Such domains may lead to the creation of non-stoichiometric regions of the film, which may cause lattice defects and surface roughness in the film. Subsequently-deposited layers may magnify the effect of the surface roughness. Moreover, the layer-by-layer deposition process used in ALD may be comparatively more expensive than a PECVD process, both in throughput costs and in equipment costs.

In contrast, and without wishing to be bound by theory, the comparatively lower surface energies of flatter surfaces (e.g., surfaces approaching the native roughness of a thermodynamically stable terminated surface) may provide a driving force that allows, via surface rearrangement and assembly reactions, self-planarization of the deposited film. Thus, in some embodiments, an ultra-smooth PECVD film that is deposited on a comparatively rougher film may still exhibit ultra-smooth characteristics. This may provide a highly smooth surface for a film stack, even if the film stack comprises comparatively rougher underlying films.

Figure 6:
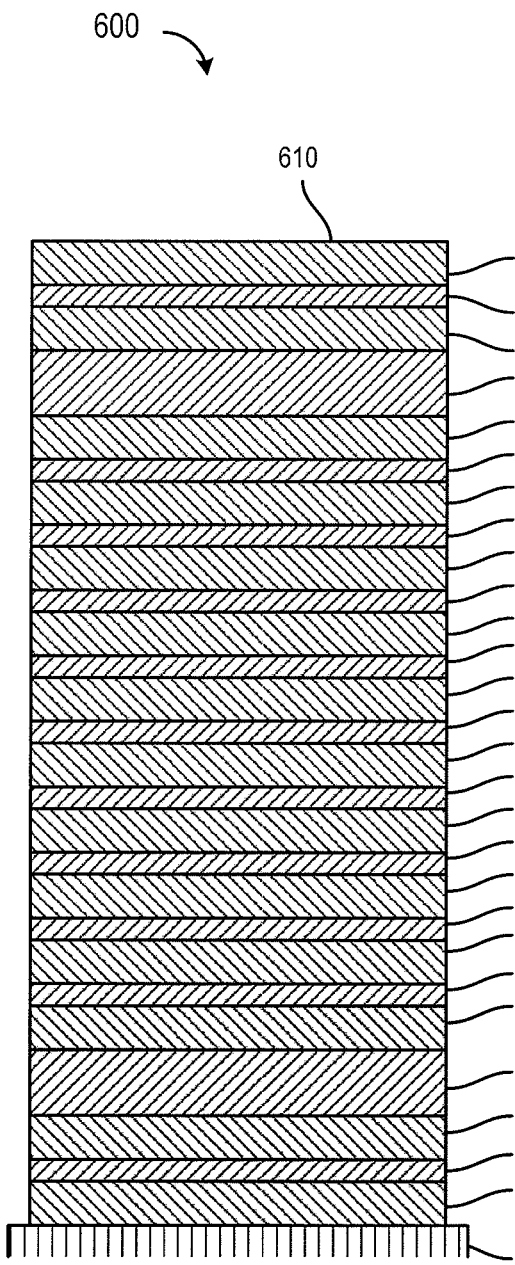
FIG. 6 schematically shows an embodiment of a film stack including example ultra-smooth PECVD SiO$_2$ films deposited according to an embodiment of the present disclosure, the ultra-smooth PECVD SiO$_2$ films interleaved with silicon nitride films.
Figure 7:
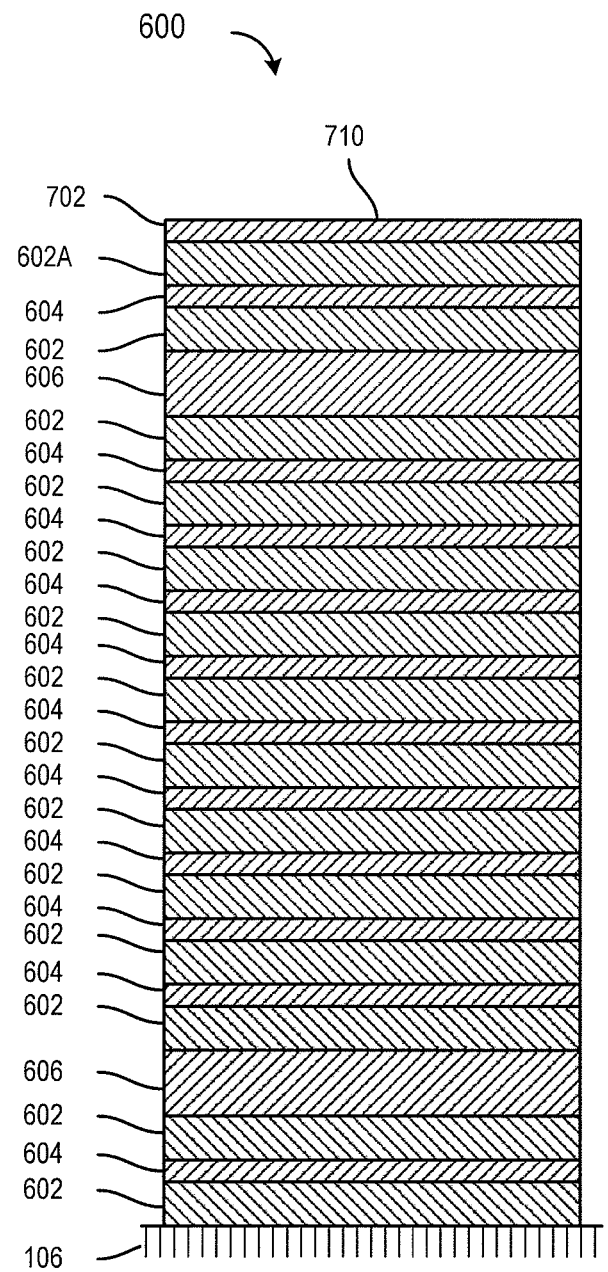
FIG. 7 schematically shows an ultra-smooth PECVD SiO$_2$ film deposited according to an embodiment of the present disclosure deposited on top of the film stack schematically depicted in FIG. 6.

For example, FIG. 6 schematically shows an embodiment of a film stack 600 including example ultra-smooth PECVD $SiO_2$ films having a deposition rate of approximately 2.3 Å/sec. The example shown in FIG. 6 includes a plurality of 300 Å ultra-smooth PECVD $SiO_2$ films 604 interleaved with a plurality of 800 Å silicon nitride films 602 and a plurality of 1000 Å ultra-smooth PECVD SiO$_2$ films 606. A final 800 Å silicon nitride film (layer 602A) having a top surface 610 is deposited on top of film stack 600. FIG. 7 schematically shows a top layer of ultra-smooth PECVD SiO$_2$ film (layer 702) deposited on top of film stack 600.

Figure 8:
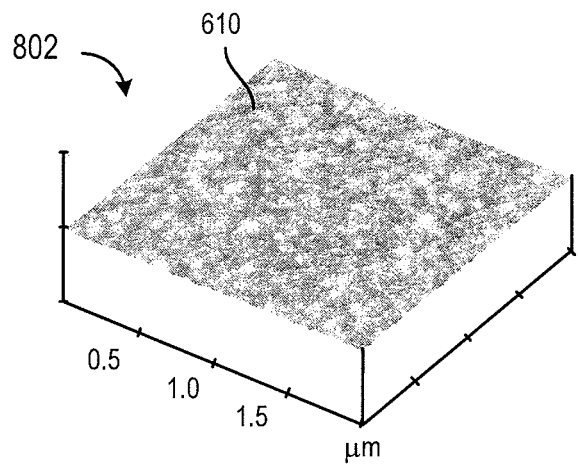
FIG. 8 shows an AFM image of a silicon nitride surface exposed at the top of the film stack schematically depicted in FIG. 6.

FIG. 8 shows an AFM image 800 of silicon nitride surface 610 exposed at the top of film stack 600 schematically depicted in FIG. 6. As measured by AFM, silicon nitride surface 610 exhibits an absolute roughness of approximately 6.9 Å. For comparative purposes, an 800 Å silicon nitride film deposited on a film stack having an identical number of alternating layers of silicon dioxide and silicon nitride in which conventional TEOS-based PECVD SiO$_2$ films are substituted for ultra-smooth PECVD SiO$_2$ films has an absolute roughness of approximately 10 Å. Thus, the ultra-smooth PECVD SiO$_2$ film yields a comparatively smoother surface at the top of an overlying silicon nitride relative to a TEOS-based PECVD SiO$_2$ film.

Figure 9:
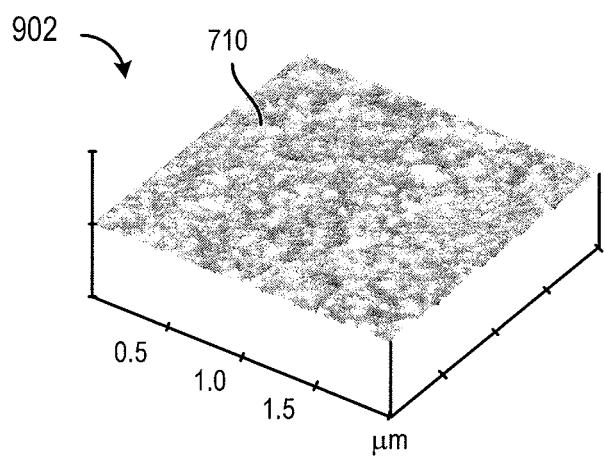
FIG. 9 shows an AFM image of a surface of a 300 Å-ultra-smooth PECVD SiO$_2$ film deposited according to an embodiment of the present disclosure at the top of the film stack schematically depicted in FIG. 7.
Figure 10:
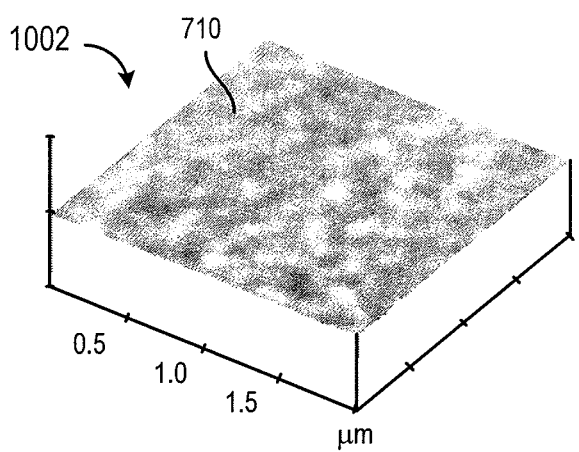
FIG. 10 shows an AFM image of a surface of a 3000 Å-ultra-smooth PECVD SiO$_2$ film deposited according to an embodiment of the present disclosure at the top of the film stack schematically depicted in FIG. 7.

Subsequent deposition of ultra-smooth PECVD SiO$_2$ film layer on top of the silicon nitride layer may provide additional improvement in top surface roughness relative to the silicon nitride layer roughness. For example, FIGS. 9 and 10 show AFM images 900 and 1000, respectively, of top surface 710 of ultra-smooth PECVD SiO$_2$ film layer 702 schematically depicted in FIG. 7. As measured by AFM, ultra-smooth PECVD SiO$_2$ top surface 710 has an absolute roughness of approximately 5.4 Å when layer 702 is deposited at a 300 Å thickness (as shown in FIG. 9), having a roughness approximately 80% of that exhibited by the underlying silicon nitride film. Further, comparatively thicker layers of ultra-smooth PECVD SiO$_2$ films may provide comparatively smoother top surfaces. For example, when layer 702 is deposited at a 3000 Å thickness (as shown in FIG. 10), it exhibits an absolute roughness of approximately 3.6 Å, having a roughness approximately 50% of that exhibited by the underlying silicon nitride film. In contrast, when conventional TEOS-based PECVD SiO$_2$ films are substituted for ultra-smooth PECVD SiO$_2$ films, there is no reduction in the surface roughness compared that exhibited by the silicon nitride film. Specifically, each of a 300 Å-thick and a 3000 Å-thick TEOS-based PECVD SiO$_2$ film exhibits an absolute roughness of approximately 10 Å.

Figure 11:
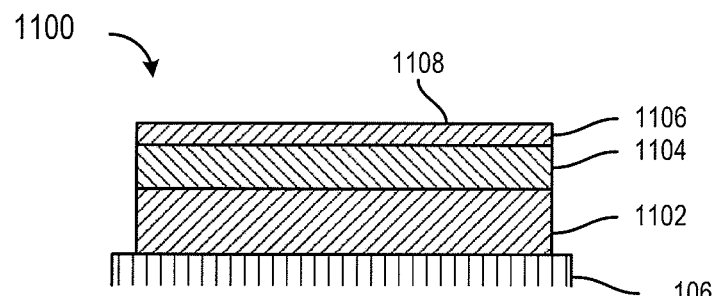
FIG. 11 schematically shows another embodiment of a film stack including example ultra-smooth PECVD SiO$_2$ films deposited according to an embodiment of the present disclosure, the ultra-smooth PECVD SiO$_2$ films interleaved with silicon nitride films.
Figure 12:
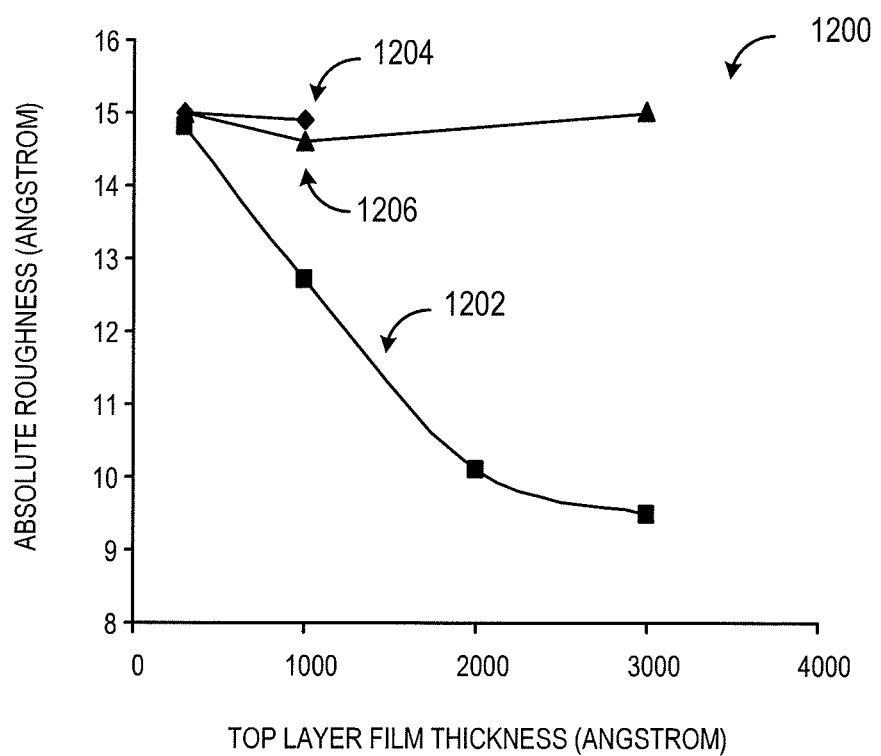
FIG. 12 graphically shows an example relationship between the thickness of ultra-smooth PECVD SiO$_2$ films deposited according to an embodiment of the present disclosure, conventional TEOS-based PECVD SiO$_2$ films, and conventional silane-based PECVD SiO$_2$ films and absolute roughness measurements for those films.

As described above, in some embodiments, ultra-smooth PECVD films may exhibit a decreasing surface roughness as the thickness of the ultra-smooth PECVD film increases. FIGS. 11 and 12 illustrate another example of such an embodiment. FIG. 11 schematically shows an example of a film stack 1100 including a 1000 Å-thick conventional silane-based PECVD SiO$_2$ film layer 1102 deposited on substrate 106. An 800 Å-thick silicon nitride layer 1104 is deposited on top of layer 1102. For reference, the roughness of layer 1104 is approximately 16.3 Å Ra. FIG. 11 also shows a top surface 1108 of an example ultra-smooth PECVD SiO$_2$ film layer 1106, layer 1106 being deposited on top of layer 1104. FIG. 12 shows a graph 1200 illustrating an example relationship 1202 between the thickness of layer 1106 and the roughness of surface 1108 for an example ultra-smooth PECVD SiO$_2$ film deposited at approximately 2.3 Å/sec. As shown in FIG. 12, the ultra-smooth PECVD SiO$_2$ film exhibits an inverse relationship between thickness and surface roughness for ultra-smooth PECVD SiO$_2$ film thickness up to approximately 3000 Å. For comparison purposes, curves 1204 and 1206 do not depict an inverse relationship between thickness and surface roughness data for the conventional silane-based and TEOS-based PECVD. When viewed in the light of the direct relationship between thickness and roughness exhibited by the conventional PECVD films individually (shown in FIG. 5), the data shown in FIG. 12 suggests that, unlike conventional PECVD films, increasing the thickness of some example ultra-smooth PECVD films may comparatively improve the surface of a film stack relative to the surface roughness of an underlying film.

Figure 13:
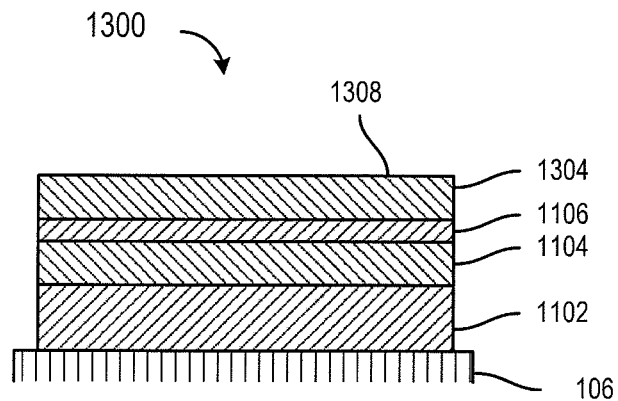
FIG. 13 schematically shows a silicon nitride film deposited on top of the film stack schematically depicted in FIG. 11.
Figure 14:
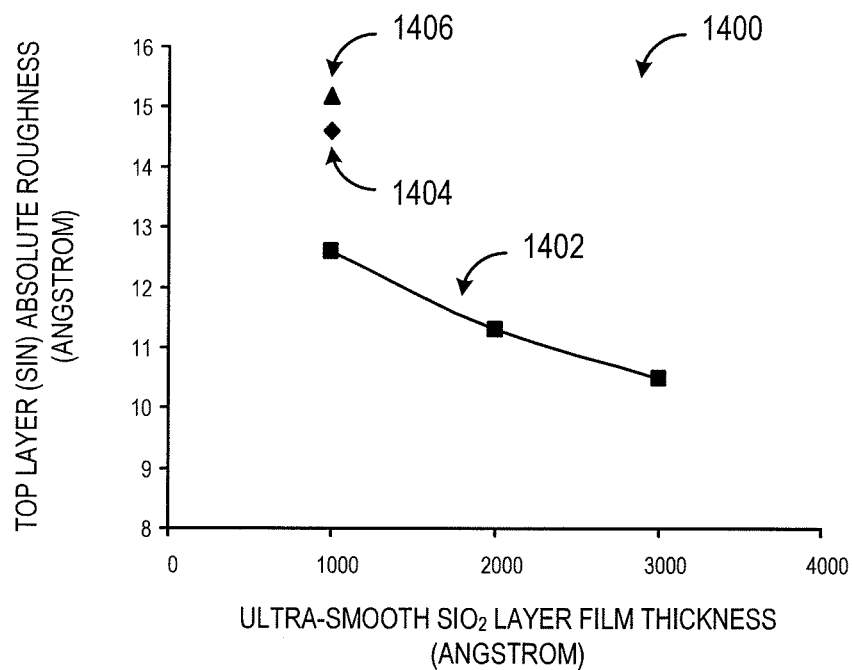
FIG. 14 graphically shows an example relationship between the thickness of ultra-smooth PECVD SiO$_2$ films deposited according to an embodiment of the present disclosure, conventional TEOS-based PECVD SiO$_2$ films, and conventional silane-based PECVD SiO$_2$ films and absolute roughness measurements for an 800 Å-silicon nitride film deposited on each of those SiO$_2$ films.

In some embodiments, increasing the thickness of an ultra-smooth PECVD film may decrease the roughness of a film deposited on top of the ultra-smooth PECVD film, as shown in the examples depicted in FIGS. 13 and 14. FIG. 13 schematically shows film stack 1100 of FIG. 11, including example ultra-smooth PECVD SiO$_2$ film layer 1106, on top of which an 800 Å-thick silicon nitride layer 1304 is deposited. FIG. 14 shows a graph 1400 illustrating an inverse relationship 1402 between the thickness of layer 1106 and the roughness of surface 1308 of silicon nitride layer 1304. For example, for a 1000 Å thick ultra-smooth PECVD SiO$_2$ film layer 1106 underlying silicon nitride layer 1304, silicon nitride surface 1308 exhibits an absolute roughness of approximately 12.6 Å, or approximately 77% as rough as silicon nitride layer 1104 and approximately the same roughness as ultra-smooth PECVD SiO$_2$ film layer 1106. For comparison, points 1404 and 1406 depict thickness-dependent roughness data for the conventional silane-based and TEOS-based PECVD processes, respectively, which are approximately 92% and 89% as rough as layer 1304.

Figure 15:
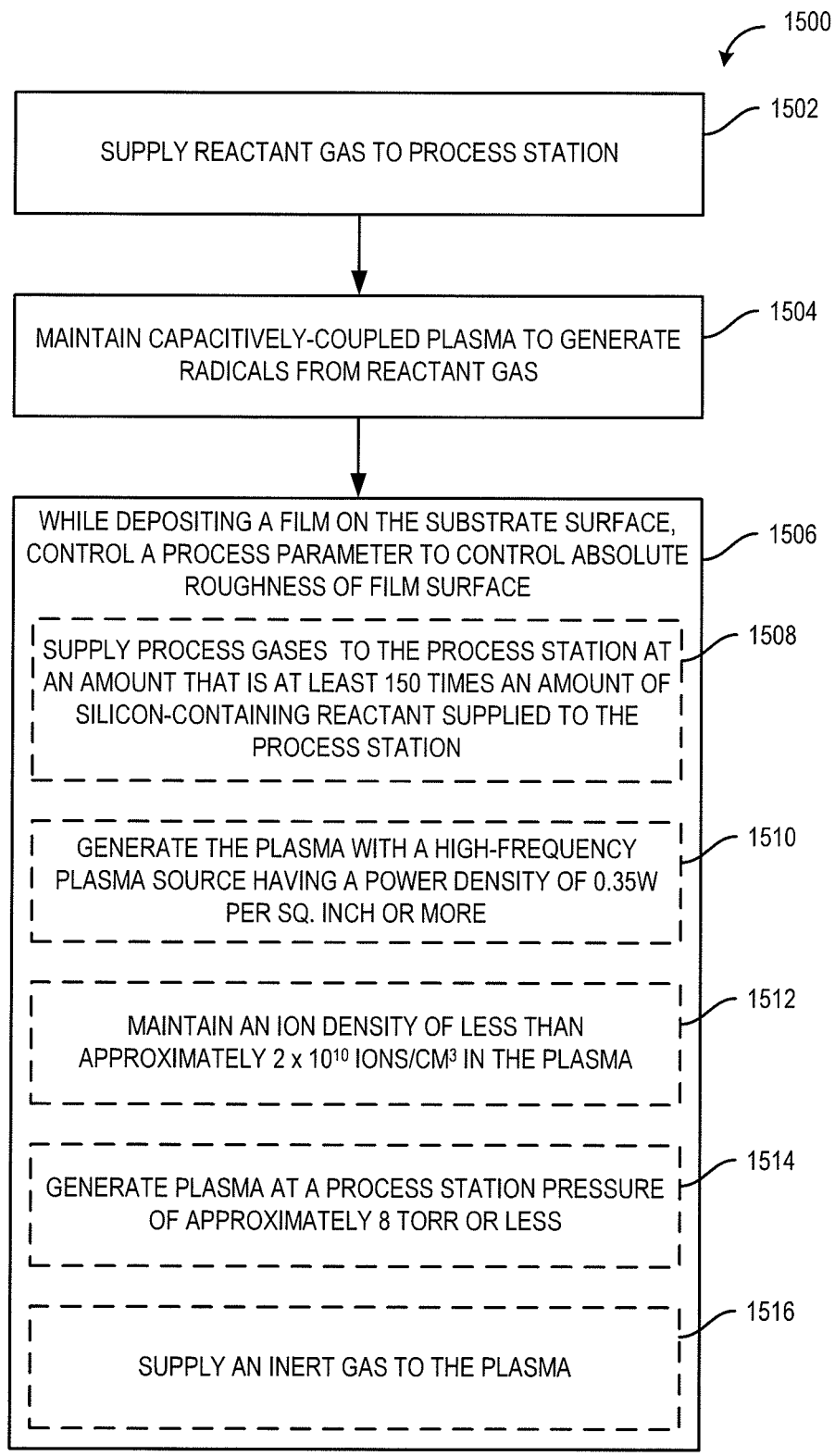
FIG. 15 shows a flow chart illustrating a method of depositing an ultra-smooth PECVD silicon-containing film according to an embodiment of the present disclosure.

FIG. 15 shows a flow chart illustrating an example embodiment of a method 1500 for depositing an ultra-smooth PECVD silicon-containing film. Method 1500 includes, at 1502, supplying a reactant gas or reactant gas mixture to a process station. At 1504, method 1500 includes maintaining a capacitively-coupled plasma to generate radicals and active species of the reactant gas and/or of inert gases included in the reactant gas mixture. At 1506, method 1500 includes, while depositing a film on the substrate surface, controlling a process parameter to control an absolute roughness of the film surface, as explained in more detail below. For example, in some embodiments, one or more process parameters may be controlled during a film deposition phase so that the absolute roughness of the film decreases with increasing thickness of the film. In another example, in some embodiments, one or more process parameters may be controlled during a film deposition phase so that the absolute roughness is controlled to below a predetermined threshold. In one scenario, for example, the absolute roughness of an ultra-smooth PECVD silicon-containing film having a refractive index of between approximately 1.4 and 2.1 may be controlled to below 4.5 Å as measured on a bare silicon substrate. It will be appreciated that process parameter control may be performed by any suitable controller included in a process tool. Example controllers are described in more detail below.

While method 1500 refers to a method of depositing a single layer of ultra-smooth PECVD film, it will be appreciated that, in some embodiments, method 1500 may represent an ultra-smooth PECVD film deposition phase of an in-situ film stack deposition process. Thus, in some embodiments, a suitable number of instances of method 1500 may be performed to build a film stack. In one example, layers of ultra-smooth PECVD undoped silicon films (discussed in more detail below) may be alternated with layers of ultra-smooth PECVD doped silicon films to build an ultra-smooth alternating undoped silicon/doped silicon film stack. In another example, layers of ultra-smooth PECVD undoped silicon films may be alternated with layers of ultra-smooth PECVD silicon dioxide films. Thus, in some embodiments, suitable ultra-smooth PECVD processes may be used to deposit each layer in a film stack. In one scenario, for example, layers of ultra-smooth silicon oxide may be alternated with layers of ultra-smooth silicon nitride. In another scenario, layers of ultra-smooth silicon oxide may be alternated with layers of conventional silicon nitride film.

Alternatively, in other embodiments, a suitable number of instances of method 1500 may be included, at one or more suitable intervals, with other suitable deposition processes (e.g., PECVD, CVD, or ALD processes) to build a film stack in-situ. In one example, an ultra-smooth PECVD silicon dioxide film may be alternated with a PECVD silicon nitride film to form an alternating silicon dioxide/silicon nitride film stack similar to that shown in FIG. 4. In another example, a conventionally-deposited film stack may be capped with a suitable thickness of an ultra-smooth PECVD film.

Further, it will be appreciated that, in some embodiments, adjusting the film stack deposition scheme may provide, on an in-situ basis, approaches to tune bulk properties of the film stack (e.g., wafer bow) while still providing an acceptable top surface roughness, and, in some embodiments, to provide ultra-smooth patterning surfaces while realizing faster deposition rates for underlying layers.

Continuing with FIG. 15, various examples of approaches to control one or more process parameters to control an absolute roughness of the film surface are described below with respect to an example ultra-smooth PECVD silicon dioxide film process. For example, an ultra-smooth silicon dioxide film may be deposited using silane and nitrous oxide ($N_2O$) in one or more process stations of a process tool. Non-limiting examples of process conditions for depositing ultra-smooth PECVD silicon dioxide films using an example four-station process tool (an embodiment of which is described in more detail below) are provided in Table 1.

TABLE 1

| Parameter | Range |
| --- | --- |
| Pressure (torr) | 0.5-8.0 |
| Temperature (° C.) | 300-600 |
| He flow rate (sccm) | 0-10000 |
| Ar flow rate (sccm) | 0-10000 |
| Silane flow rate (sccm) | 10-200 |
| $N_2O$ flow rate (sccm) | 1000-30000 |
| Nitrogen flow rate (sccm) | 0-20000 |
| High-frequency plasma power (W) | 500-5000 |
| Low-frequency plasma power (W) | 0-2500 |
| Time between beginning of silane flow and plasma ignition (sec) | −3 to +3 |
| Time between end of silane flow and plasma extinction (sec) | −3 to 10 |

In some embodiments, controlling a process parameter to control an absolute roughness of the film surface may include, at 1508, supplying process gases, including one or more co-reactants and/or one or more diluents, to the process station at a concentration of at least 150 times a concentration of a silicon-containing reactant included in the reactant gas mixture. In such embodiments, oversupplying the co-reactant may create a plasma that is lean in silicon radicals, potentially reducing the deposition rate. By controlling the deposition rate to less than a threshold deposition rate, an ultra-smooth PECVD film may result.

For example, in the case of a silicon oxide film deposited using the example process parameters described above, $N_2O$ may be fed at a flow rate of from approximately 5 times an amount of the silane flow rate to approximately 3000 times an amount of the silane flow rate. Assuming other process parameters are held constant, the greater flow rate of $N_2O$ may control the deposition rate of the silicon dioxide film to less than 10 Å/sec. Such deposition rates may have surface rearrangement and assembly reactions at suitable rates to produce an ultra-smooth silicon oxide film having a roughness of less than or equal to 4.5 Å Ra for films of up to 3000 Å thickness or more as measured on a silicon substrate.

Figure 16:
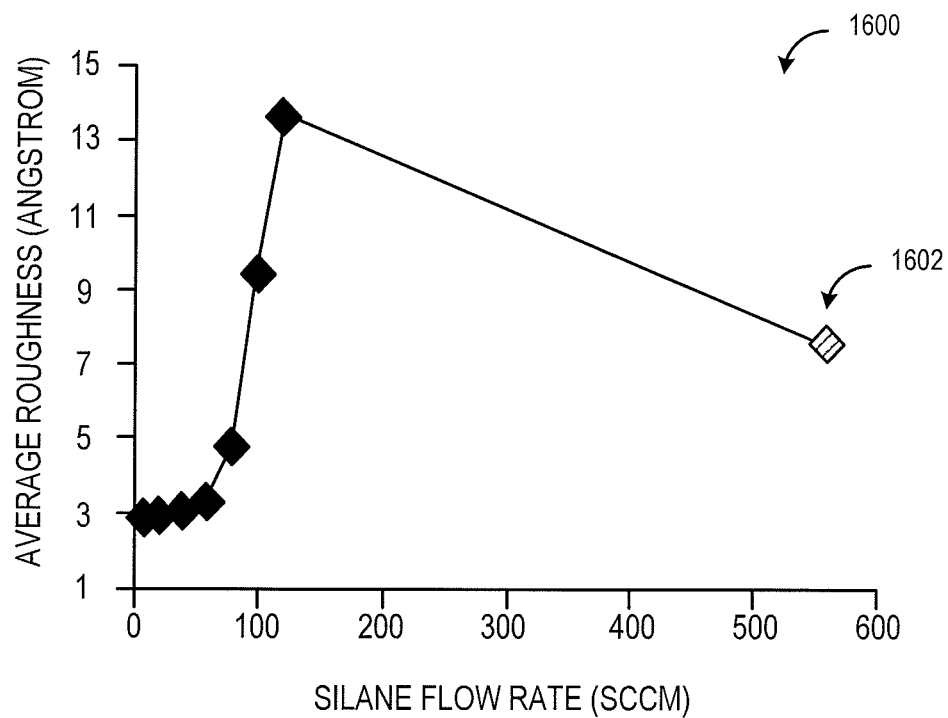
FIG. 16 graphically shows an example relationship between surface roughness and silane flow rate for conventional PECVD SiO$_2$ films and ultra-smooth PECVD SiO$_2$ films deposited according to embodiments of the present disclosure.
Figure 17:
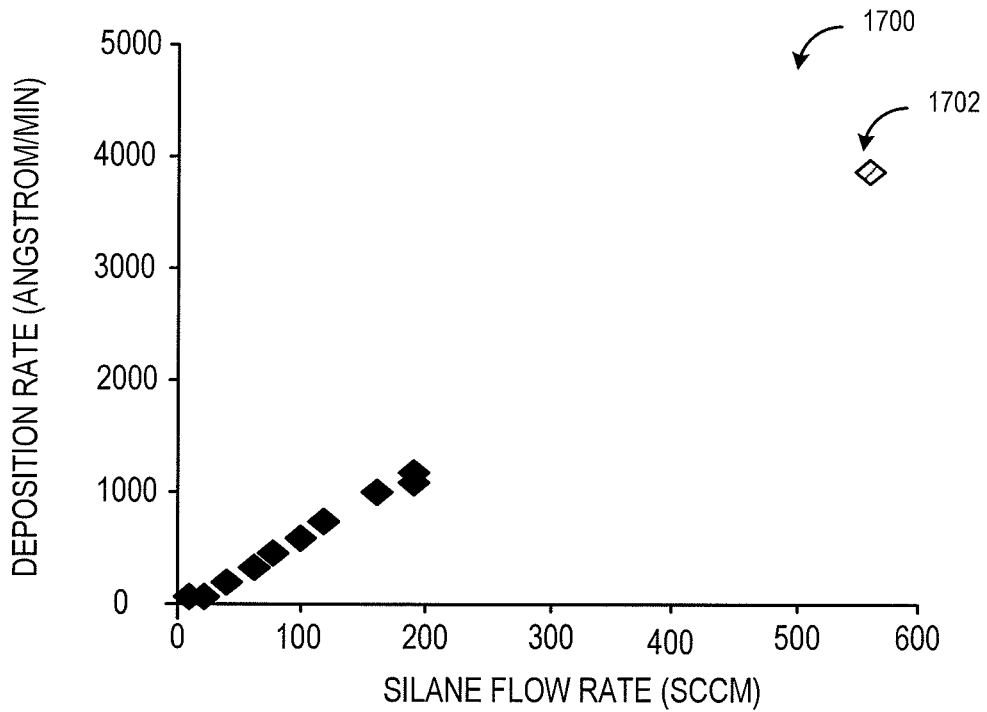
FIG. 17 graphically shows an example relationship between silane flow rate and SiO$_2$ film deposition rate for the example films shown in FIG. 7.

Previously, it was believed that reducing the flow rate of silane in conventional silane-based PECVD silicon dioxide deposition processes would not result in a similar reduction in silicon dioxide film roughness. Instead, the surface of the deposited film was believed to become rougher as the silane flow rate was reduced. FIG. 16 shows an example relationship 1600 between surface roughness as measured by AFM and silane flow rate. FIG. 17 shows an example relationship 1700 between silane flow rate and silicon dioxide film deposition rate for relationship 1600 shown in FIG. 16. For comparative purposes, an example film deposited by the conventional silane-based PECVD process is indicated (points 1602 and 1702). FIGS. 16 and 17 graphically illustrate that roughness increases as the silane flow rate and the deposition rate decrease from the conventional silane-based PECVD process.

However, referring to the left-most portion of FIG. 16, it has been found that controlling the deposition rate below a threshold level may actually decrease surface roughness, which may allow ultra-smooth silicon-containing surfaces to be obtained. Thus, FIGS. 16 and 17 show that, in the embodiment depicted, reducing the flow rate of silane below 100 sccm reduces the silicon dioxide deposition rate to below 10 Å/sec, in turn reducing the surface roughness of the silicon dioxide film deposited. As shown in FIGS. 16 and 17, in some embodiments, processes providing a silicon dioxide deposition rate of less than 6 Å/sec may produce films having a roughness of less than or equal to 4.5 Å Ra for films of up to 3000 Å thickness or more as measured on a silicon substrate.

While the example described above refers to controlling the deposition rate by controlling a flow and/or concentration of silane, it will be appreciated that such effects may be achieved by controlling the flow and/or concentration of any suitable silicon-containing reactant. Non-limiting examples of suitable silicon-containing reactants that may produce ultra-smooth silicon-containing films include silanes (e.g., $Si_xH_y$, such as silane and disilane), halogen-substituted silanes (e.g., $Si_xCl_y$), and alkyl-substituted silanes (e.g., $Si_xR_y$).

Figure 18:
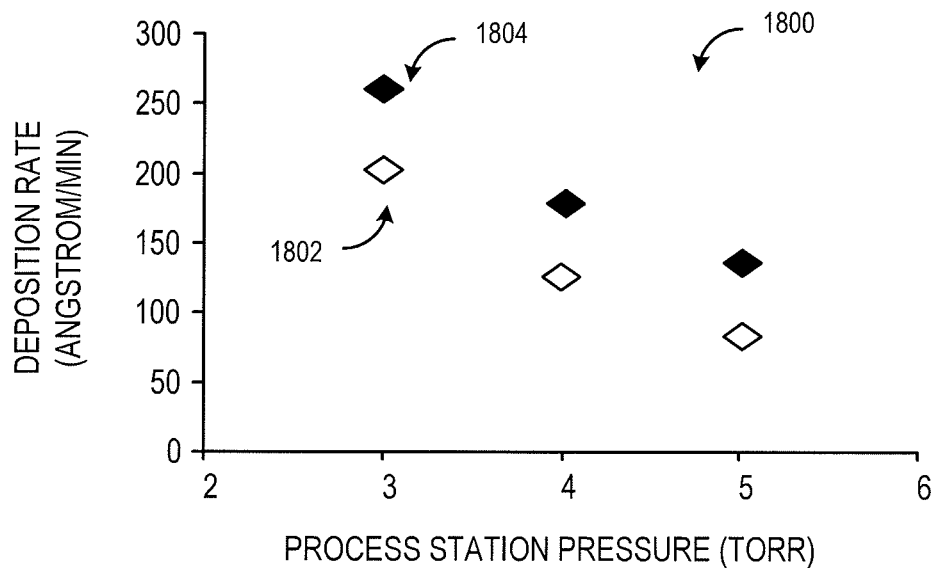
FIG. 18 graphically shows relationships between process station pressure and SiO$_2$ film deposition rates for ultra-smooth PECVD SiO$_2$ films deposited according to embodiments of the present disclosure, the SiO$_2$ films being deposited from ultra-smooth PECVD processes having similar silane flow rates but different total gas flow rates.

It will be appreciated that, in some embodiments, controlling the flows and/or concentrations of other process gases (e.g., co-reactants, such as $N_2O$, CO, and $CO_2$, and inerts, such as nitrogen, argon, and helium) may be used to control the deposition rate of the film to less than a threshold amount. For example, FIG. 18 shows a relationship 1800 between process station pressure and deposition rate for example ultra-smooth PECVD $SiO_2$ films deposited at a constant 100% $SiH_4$ flow rate of 40 sccm (though it will be appreciated that suitably dilute silane feed sources may have a greater flow rate without departing from the scope of the present disclosure) but having different total gas flow rates. Specifically, points 1802 shows a deposition rate trend for an example where the flow rates of all gases except silane are half the corresponding flow rates for the example shown in points 1804. Despite effectively increasing the concentration of silane, in the example shown in FIG. 18, reducing the flow rate of inert and non-inert gases leads to a decrease in deposition rate and a reduction in film roughness of up to 0.3 Å Ra (not shown) from the conditions of points 1804 to the conditions of points 1802. In another example, substituting CO or $CO_2$ for $N_2O$, each of which may have a different ionization cross-section relative to $N_2O$, may reduce the concentration of oxygen radicals in the plasma, potentially reducing the deposition rate of the silicon dioxide film.

As explained above, in some embodiments, and without wishing to be bound by theory, it is believed that decreasing the silane flow may provide additional time for surface migration and cross-linking of various silane radical species. Increasing the time for such processes may provide structurally dense lattices with comparatively fewer defects, potentially resulting in a smoother surface topography.

Figure 19:
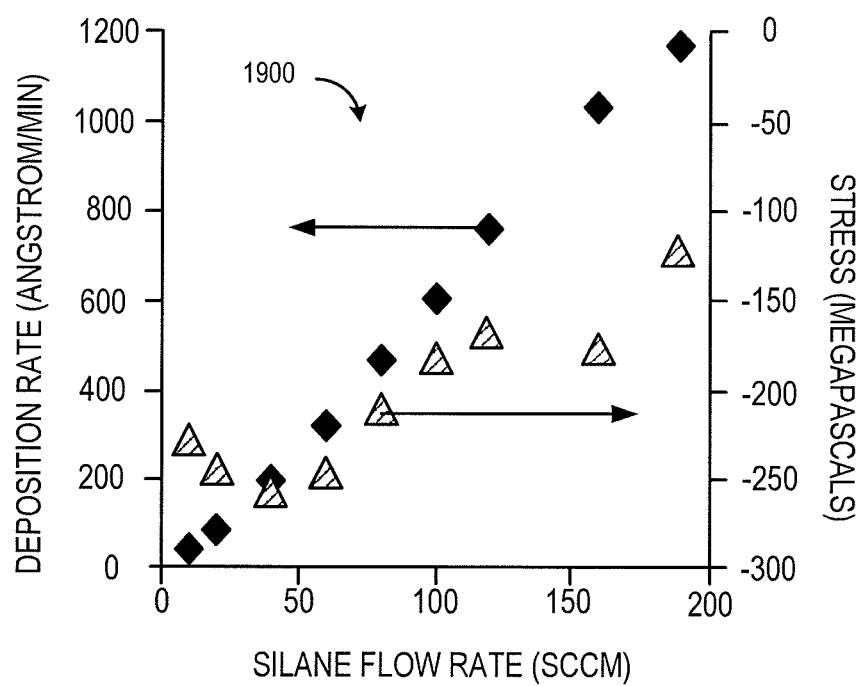
FIG. 19 graphically shows a relationship between film stress, SiO$_2$ film deposition rate, and silane flow rate for ultra-smooth PECVD SiO$_2$ films deposited according to embodiments of the present disclosure.
Figure 20:
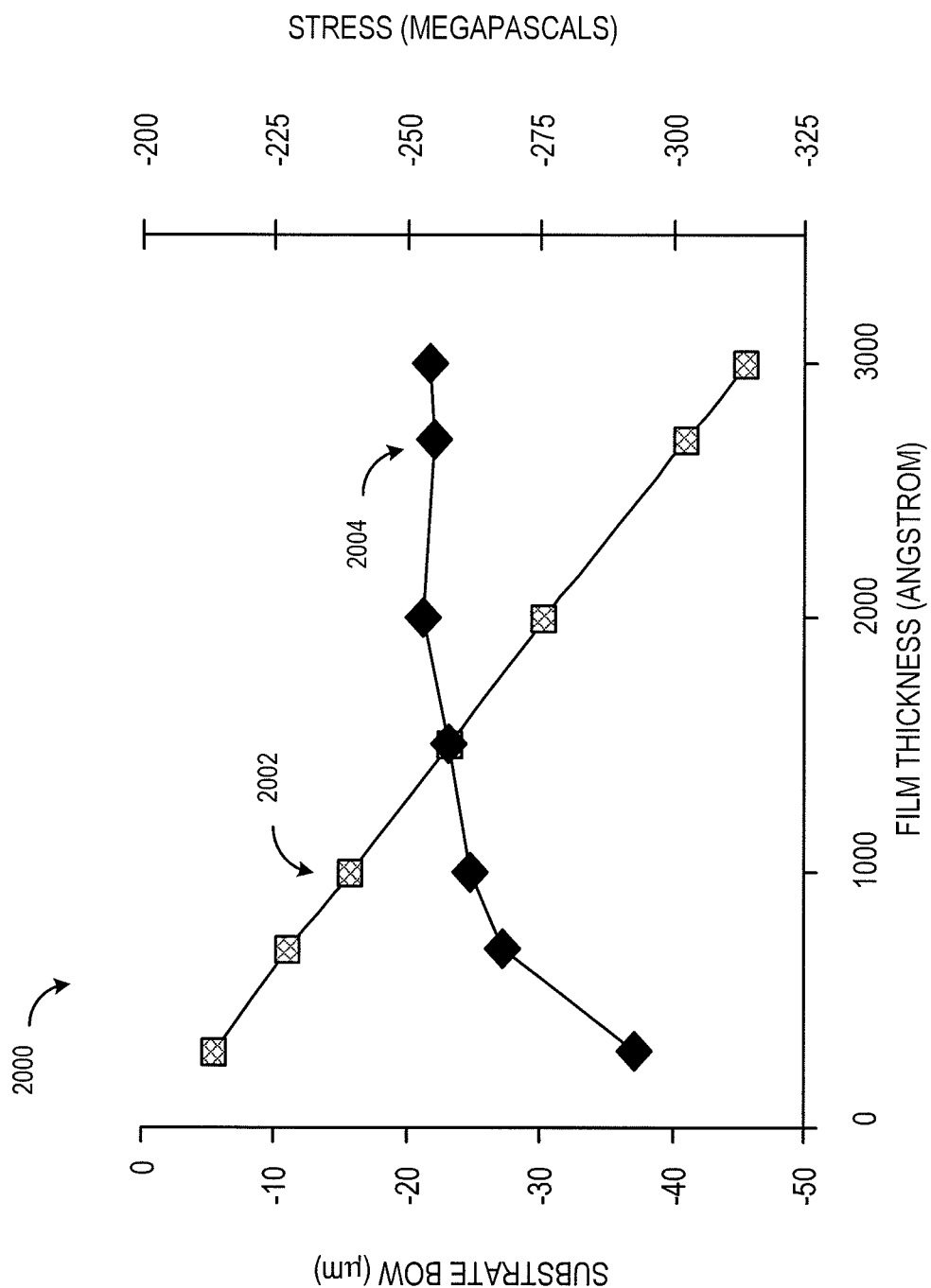
FIG. 20 graphically shows relationships between film stress, substrate bow, and film thickness for an ultra-smooth PECVD SiO$_2$ film deposited according to an embodiment of the present disclosure.

For example, FIG. 19 illustrates a relationship 1900 between film stress, deposition rate, and silane flow rate for an example silicon dioxide film. As the deposition rate declines in the example shown in FIG. 19, the film stress becomes comparatively more compressive, suggesting that the film is structurally denser. FIG. 20 shows a relationship 2000 between film stress, substrate bow, and film thickness for an example ultra-smooth PECVD $SiO_2$ film deposited at approximately 2.3 Å/sec. The example film shown in FIG. 20 exhibits a linear dependence 2002 of substrate bow on film thickness. The example film shown in FIG. 20 also exhibits a non-linear relationship 2004 between film stress and film thickness. As shown in FIG. 20, the film stress for the example film rapidly approaches the bulk film stress level within the first 1000 Å of deposition. Thus, the example ultra-smooth PECVD silicon dioxide film shown in FIG. 20 may rapidly achieve structural stability as the film is deposited.

Figure 21:
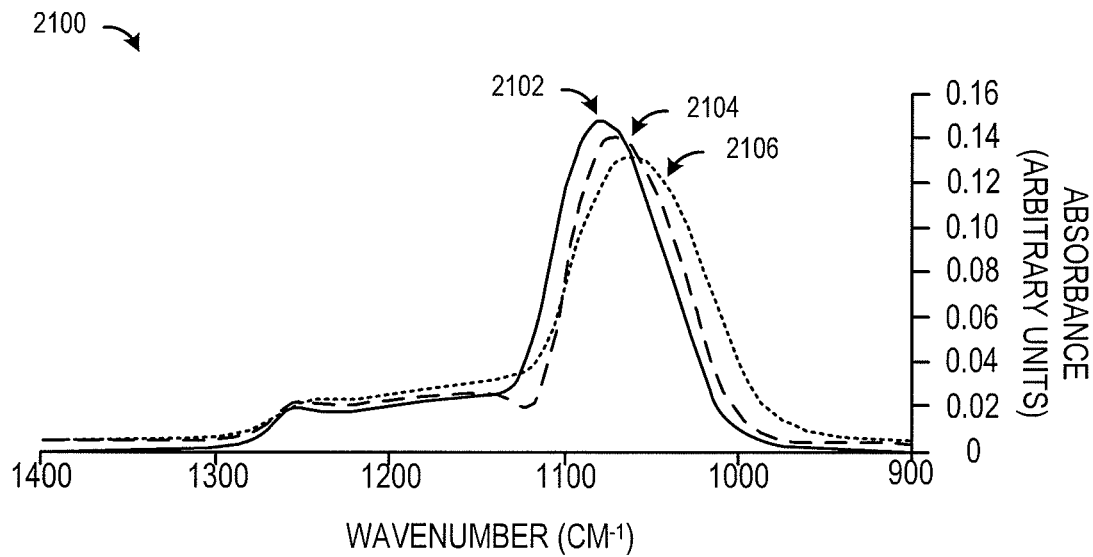
FIG. 21 graphically shows a comparison of Fourier transform infrared spectra showing Si—O bond-stretching mode data for a thermally-grown SiO$_2$ film, a TEOS-based PECVD SiO$_2$ film, and an ultra-smooth PECVD SiO$_2$ film deposited according to an embodiment of the present disclosure.

Other structural analyses provide additional support for the suggestion that increasing the time for surface rearrangement and assembly reactions may provide structurally dense lattices with comparatively fewer defects, potentially resulting in a smoother surface topography. For example, FIG. 21 shows a comparison of Fourier transform infrared (FTIR) spectra for an example thermally grown $SiO_2$ film (spectrum 2102) (sometimes called thermal oxide), an example ultra-smooth PECVD $SiO_2$ film having a deposition rate of approximately 2.3 Å/sec (spectrum 2104), and an example conventional TEOS-based PECVD $SiO_2$ film (spectrum 2106). As shown in FIG. 21, the example ultra-smooth PECVD film has a structure and composition that is more like that of the thermal oxide than the TEOS-based film is like that of the thermal oxide. For example, the peak height of the Si—O bond stretch mode for an example ultra-smooth PECVD film is higher and narrower than the peak height of the Si—O bond stretch mode for the TEOS-based film for comparable film thicknesses. This may suggest that there is a comparatively narrower distribution of bond types within the example ultra-smooth PECVD film relative to the TEOS-based film. Further, the position of the Si—O bond stretch mode for the ultra-smooth PECVD film shown in FIG. 21 (1071 $cm^{-1}$) is closer to the Si—O bond stretch mode position for the thermal oxide (1078 $cm^{-1}$) than is the Si—O bond stretch mode for the TEOS-based film (1063 $cm^{-1}$).

As further support for the suggestion that increasing the time for surface rearrangement and assembly reactions may provide structurally dense lattices with comparatively fewer defects, potentially resulting in a smoother surface topography, the wet etch characteristics of some ultra-smooth PECVD $SiO_2$ films approaches those of thermal oxides. Table 2 includes wet etch rate ratio (WERR, defined as 1 for thermal oxide) data for various PECVD $SiO_2$ films in a dilute hydrofluoric acid bath (100:1 $H_2O$:HF). For comparison, WERR data for conventional silane-based and TEOS-based PECVD processes and for a conventional HDP-CVD process are also included in Table 2. As shown in Table 2, the WERR for several ultra-smooth PECVD $SiO_2$ films is between 1.2 and 2.0.

TABLE 2

| Film Process | Deposition Rate | WERR |
|---|---|---|
| Ultra-smooth PECVD | 2.3 Å/sec | 1.2 |
| Ultra-smooth PECVD | 6.1 Å/sec | 2.0 |
| Conventional TEOS-Based PECVD | — | 1.7 |
| Conventional silane-based PECVD | — | 4.0 |
| Conventional HDP-CVD | — | 1.4 |
| Thermally grown oxide | — | 1.0 |

Returning to FIG. 15, in some embodiments, controlling a process parameter to control an absolute roughness of the film surface may include, at 1510, generating the plasma with a power density of 0.35 $W/in^2$ or more. In some embodiments, such power densities may be generated by a high-frequency plasma source operated at 250 W or more. As used herein, "high-frequency plasma" refers to a plasma operated at a frequency of 13.56 MHz or more. Additionally or alternatively, in some embodiments, a low frequency (e.g., frequencies below 13.56 MHz) power source may be used. In some other embodiments, a dual-frequency plasma may be used.

Table 3 provides example silicon dioxide film deposition and topography data for a plurality of ultra-smooth PECVD $SiO_2$ films deposited at 550° C. using various high-frequency (HF) plasma powers on silicon substrates. While the example described herein refers to a high-frequency plasma, it will be appreciated that any suitable plasma and/or power may be employed without departing from the scope of the present disclosure.

TABLE 3

| HF Power (W) | 100% $SiH_4$ flow (sccm) | $SiO_2$ Thickness (Å) | Dep. Rate (Å/sec) | Stress (MPa) | Ra (nm) |
|---|---|---|---|---|---|
| 1000 | 40 | 1031 | 3.26 | −254 | 0.304 |
| 1500 | 40 | 1019 | 2.76 | −258 | 0.278 |
| 2000 | 40 | 1024 | 2.49 | −268 | 0.275 |
| 2500 | 40 | 1030 | 2.34 | −268 | 0.263 |
| 3000 | 40 | 1023 | 2.24 | −265 | 0.256 |
| 3500 | 40 | 1034 | 2.20 | −267 | 0.252 |
| 4000 | 40 | 1015 | 2.19 | −249 | 0.245 |
| 4500 | 40 | 1025 | 2.27 | −267 | 0.245 |

Figure 22:
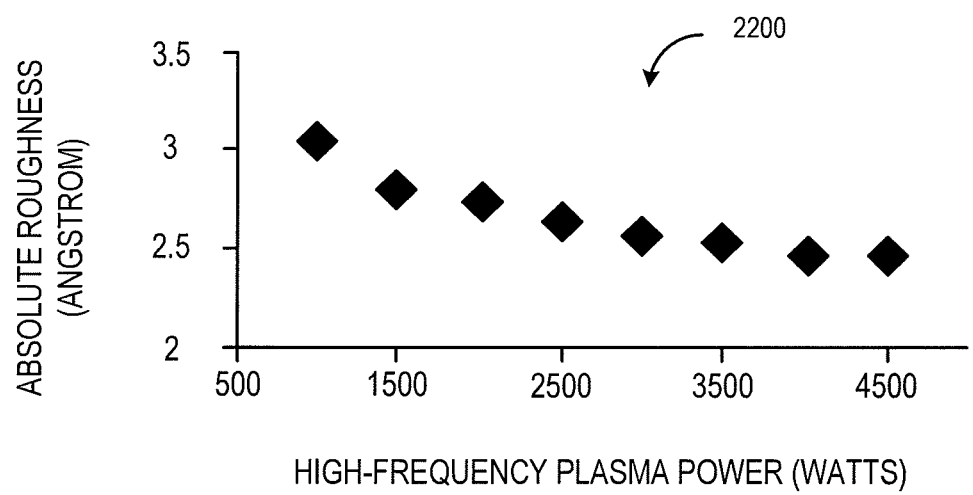
FIG. 22 graphically shows a relationship between absolute roughness of ultra-smooth PECVD SiO$_2$ films deposited according to embodiments of the present disclosure and the power level of a high-frequency plasma.

FIG. 22 graphically illustrates a relationship 2200 between high-frequency plasma power and absolute roughness for the example ultra-smooth PECVD silicon dioxide films provided in Table 3. As shown in FIG. 22, at low deposition rates, such as those corresponding to low silane flow rates, increasing the power of a high-frequency plasma may reduce the absolute roughness of ultra-smooth PECVD $SiO_2$ films. In the example shown in FIG. 22, the surface roughness of some ultra-smooth PECVD silicon dioxide films may be less than 2.5 Å as measured on a silicon substrate. As the native surface roughness of a typical silicon substrate approaches 2.5 Å, this may further suggest that such films are capable of self-planarization.

Additionally or alternatively, in some embodiments, the plasma conditions may be selected to control the ion density of the plasma. Continuing with FIG. 15, controlling a process parameter to control an absolute roughness of the film surface may include, at 1512, maintaining an ion density of less than $2\times10^{10}$ ions/cm$^3$. For example, a plasma for depositing an ultra-smooth PECVD silicon oxide film may be supplied at a plasma power of between 250 and 5000 watts and at a process station pressure of between 0.5 and 8 torr. In some embodiments, such plasma powers may generate a plasma density of between approximately 0.35 W/in$^2$ and 7.1 W/in$^2$ at four 15-inch showerheads powered by a shared plasma generator. This may avoid potential sputter-induced interlayer mixing in film stack applications.

Continuing with FIG. 15, in some embodiments, controlling a process parameter to control an absolute roughness of the film surface may include, at 1514, generating a plasma at a process station pressure of approximately 8 torr or less. In such embodiments, an ultra-smooth characteristic may be substantially maintained while a deposition rate for a film is adjusted while maintaining the deposition rate at a rate below the threshold rate. Put another way, the deposition rate of the film may be adjusted by varying the process station pressure without substantially altering the ultra-smooth topography of a deposited film.

Thus, Table 4 shows example silicon dioxide film deposition and topography data for a plurality of ultra-smooth PECVD SiO$_2$ films deposited at 550° C. on silicon substrates using various process station pressures.

TABLE 4

| Pressure (torr) | SiH$_4$ flow (sccm) | HF Power (W) | Thickness (Å) | Dep. Rate (Å/sec) | Stress (MPa) | Ra (nm) |
|---|---|---|---|---|---|---|
| 1.5 | 40 | 2500 | 985.2 | 6.22 | −280 | 0.286 |
| 2 | 40 | 2500 | 978.5 | 5.66 | −285 | 0.277 |
| 3 | 40 | 2500 | 1006.6 | 3.91 | −286 | 0.263 |
| 4 | 40 | 2500 | 1018.4 | 2.84 | −271 | 0.256 |
| 5 | 40 | 2500 | 1042.9 | 2.36 | −268 | 0.271 |
| 6 | 40 | 2500 | 1030.9 | 2.11 | −267 | 0.261 |

Figure 23:
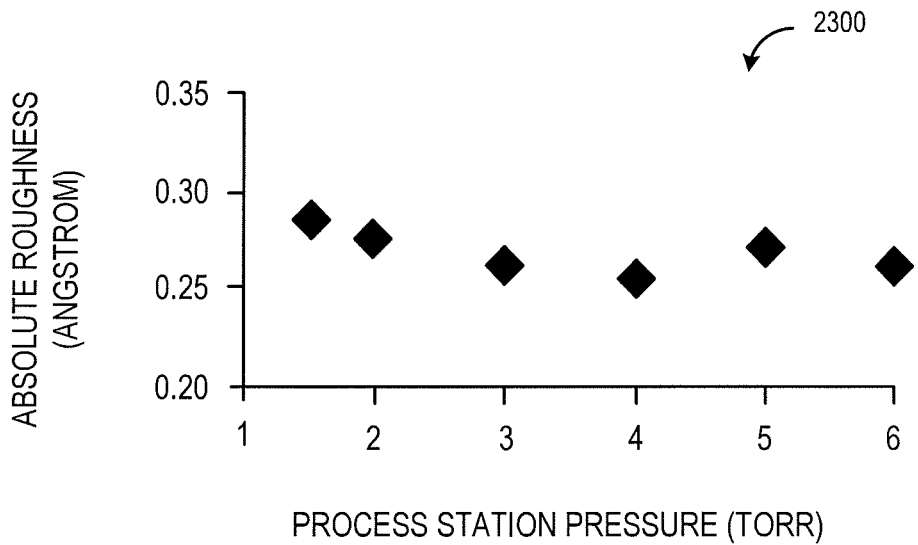
FIG. 23 graphically illustrates the dependence of process station pressure for ultra-smooth PECVD SiO$_2$ films deposited according to embodiments of the present disclosure and absolute roughness.

FIG. 23 illustrates a dependence 2300 of smoothness on process station pressure using the example data of Table 4. As shown in FIG. 23, decreasing the pressure of the process station may correlate with a slight increase in surface roughness for the example ultra-smooth PECVD silicon dioxide films, though the absolute roughness may still be maintained at less than 3 Å Ra as measured on a silicon substrate. FIG. 23 shows that surface smoothness may have a non-linear relationship with process station pressure during the example process range depicted, as shown in a minimum surface roughness at approximately 4 torr.

Figure 24:
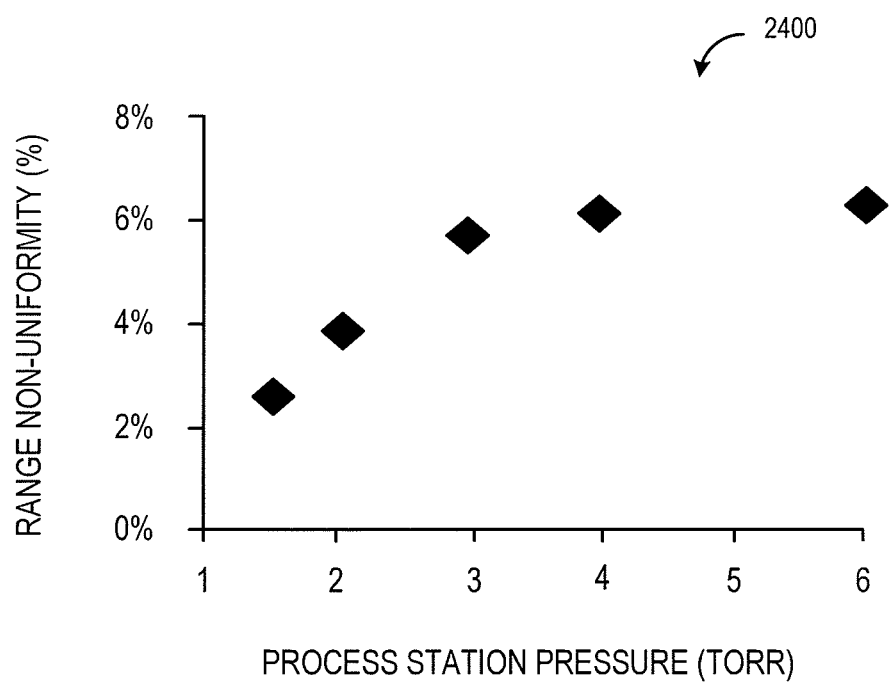
FIG. 24 graphically shows a relationship between within-substrate range non-uniformity and process station pressure for ultra-smooth PECVD SiO$_2$ films deposited according to embodiments of the present disclosure.

FIG. 24 shows a graph 2400 depicting a non-linear relationship between within-substrate range non-uniformity and process station pressure for the example films shown in Table 4. Thus, it will be appreciated from the example data provided in Table 4 and FIGS. 23 and 24 that, in some embodiments, an ultra-smooth PECVD silicon oxide film characteristic may be maintained and/or adjusted by generating the plasma at a process station pressure 8 torr or less. In one example, the deposition rate may be increased to greater than 6 Å/sec while maintaining a surface roughness of less than 3 Å (as measured on a 1000 Å film deposited on a silicon substrate). In another example, the within-substrate non-uniformity of a deposited film may be decreased to less than 3% while maintaining a surface roughness of less than 3 Å as measured on a silicon substrate.

In another example, an ultra-smooth characteristic may be substantially maintained while a deposition rate for the film is adjusted by varying an amount of an inert gas to the process station. Thus, continuing with FIG. 15, in some embodiments, controlling a process parameter to control an absolute roughness of the film surface may include, at 1516, supplying an inert gas to the plasma. For example, in some embodiments, argon may be supplied to the plasma to adjust the deposition rate of an ultra-smooth PECVD silicon dioxide film.

Figure 25:
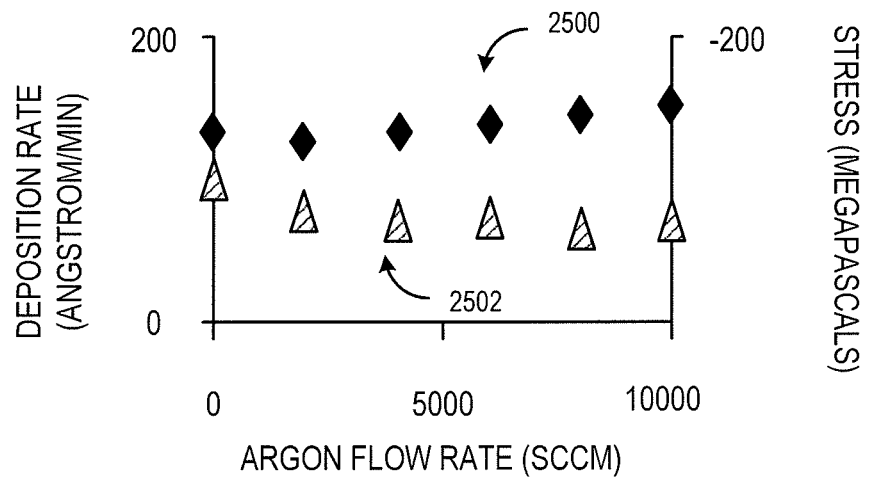
FIG. 25 graphically shows a relationship between deposition rate for ultra-smooth PECVD SiO$_2$ films deposited according to embodiments of the present disclosure and an argon flow rate.

FIG. 25 shows a relationship 2500 between deposition rate and argon flow rate to the process station for example ultra-smooth PECVD SiO$_2$ films deposited at 550° C. on silicon substrates. FIG. 25 also shows a relationship 2502 between SiO$_2$ film stress and argon flow rate to the process station. As shown in FIG. 25, the deposition rate may be increased and the SiO$_2$ film made more compressive, by increasing the flow rate of argon to the process station.

Figure 26:
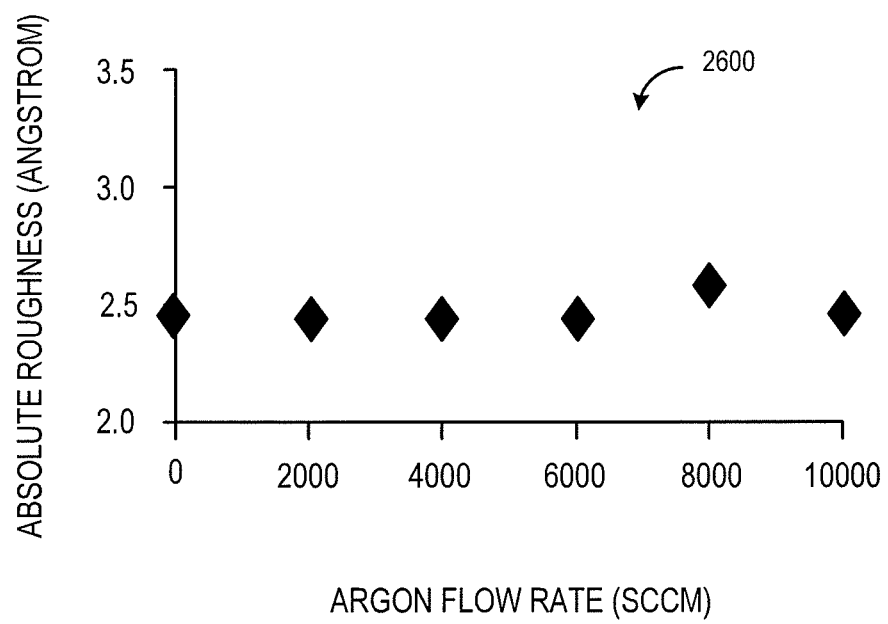
FIG. 26 graphically shows a relationship between absolute roughness of ultra-smooth PECVD SiO$_2$ films deposited according to embodiments of the present disclosure and an argon flow rate.

Further, in some embodiments, supplying inert gas to the process station may adjust the deposition rate without substantially disturbing the surface roughness of the film. For example, FIG. 26 shows an approximately constant relationship 2600 between absolute roughness and argon flow rate for the example ultra-smooth PECVD SiO$_2$ films shown in FIG. 25. Thus, it will be appreciated from the examples shown in FIGS. 25 and 26 that, in some embodiments, the deposition rate of an ultra-smooth PECVD film may be increased by increasing a flow rate of argon to the process station without causing an increase in surface roughness. It will be appreciated that, in some embodiments, varying the flow rates of other suitable inert gases, such as nitrogen and helium, may have similar effects.

It will be appreciated that control of the surface smoothness via control of one or more process parameters, such as reactant and inert feed rates, plasma power, ion density, and process station pressure, may be managed independently or in combination with any other suitable process variable. For example, in some embodiments, ion bombardment (e.g., from low-frequency plasma sources or from a DC bias source applied to the plasma) may provide a suitable ultra-smooth silicon-containing film. In another example, an ultra-smooth PECVD film may be deposited at temperatures of 400 C or greater. In one scenario, an ultra-smooth PECVD silicon dioxide film may be deposited at 550 C. Such films may exhibit the ultra-smooth surfaces described herein while having comparatively lower hydrogen concentrations than films deposited at 400 C or less. Further, such films may maintain a substrate bow without the assistance of a subsequent annealing step. Such films may exhibit ultra-smooth and highly flat surfaces during a subsequent lithography step where a pattern is transferred to the film stack. Other non-limiting examples of other process variables include process station temperature, plasma ignition sequencing, plasma extinction sequencing, and a spacing between a process gas distribution showerhead and a deposition substrate surface. For example, in one scenario, a high-frequency plasma may be ignited before silane is introduced to the process station. This may condition the substrate surface for deposition prior to the beginning of deposition, which in turn may reduce the formation of surface islands or domains. In another scenario, a high-frequency plasma may be extinguished after flow rate of silane is stopped after deposition, to consume residual silane molecules in the process station.

While the examples above relate to the deposition of ultra-smooth PECVD silicon dioxide films, it will be appreciated that any suitable silicon-containing film may be deposited according to the embodiments described herein. In some embodiments, ultra-smooth PECVD silicon nitride films may be deposited by plasma-activated reaction of ammonia and silane. Further, in some embodiments, suitable silicon oxynitride films may be deposited by plasma-activation of silane and $N_2O$ in the presence of a nitrogen plasma. Other suitable nitrogen-containing reactants include, but are not limited to, hydrazine and nitrogen/helium gas mixtures.

Table 5 summarizes roughness, refractive index, and film stress data for a variety of ultra-smooth silicon nitride containing films having a refractive index ranging from approximately 1.4 to approximately 2.1. The film data presented in Table 5 was measured from 1000 Å films deposited on silicon substrates, each film generated by feeding, for the respective film recipe, the indicated amounts of nitrous oxide or ammonia to a nitrogen plasma at a constant silane flow rate, nitrogen flow (approximately 5000 sccm), helium flow (approximately 8000 sccm), pressure (approximately 5 torr) and high-frequency plasma power (approximately 4500 W). As indicated in Table 5, reducing the flow of nitrous oxide fed to the plasma (shown in recipes A-G) provides a wide range of silicon oxide and silicon oxynitride films exhibiting an absolute roughness of less than approximately 3.1 Å, and in many cases, less than approximately 2.7 Å.

TABLE 5

| Recipe Name | 100% $SiH_4$ flow (sccm) | $N_2O$ flow (sccm) | $NH_3$ flow (sccm) | Stress (MPa) | Refractive Index | Ra (nm) |
| --- | --- | --- | --- | --- | --- | --- |
| A | 40 | 12000 | 0 | −302 | 1.4617 | 0.235 |
| B | 40 | 8000 | 0 | −313 | 1.4622 | 0.231 |
| C | 40 | 4000 | 0 | −339 | 1.4615 | 0.249 |
| D | 40 | 1500 | 0 | −348 | 1.4669 | 0.266 |
| E | 40 | 500 | 0 | −355 | 1.4703 | 0.265 |
| F | 40 | 150 | 0 | −314 | 1.5051 | 0.269 |
| G | 40 | 80 | 0 | −347 | 1.6214 | 0.309 |
| H | 40 | 0 | 0 | −1824 | 1.992 | 0.755 |
| I | 40 | 0 | 300 | −1734 | 1.990 | 0.397 |
| J | 40 | 0 | 500 | −1566 | 1.982 | 0.305 |
| Conventional PECVD SiN | 980 | 0 | 7500 | +200 to −200 | 1.90-2.02 | 0.53 |

Figure 27:
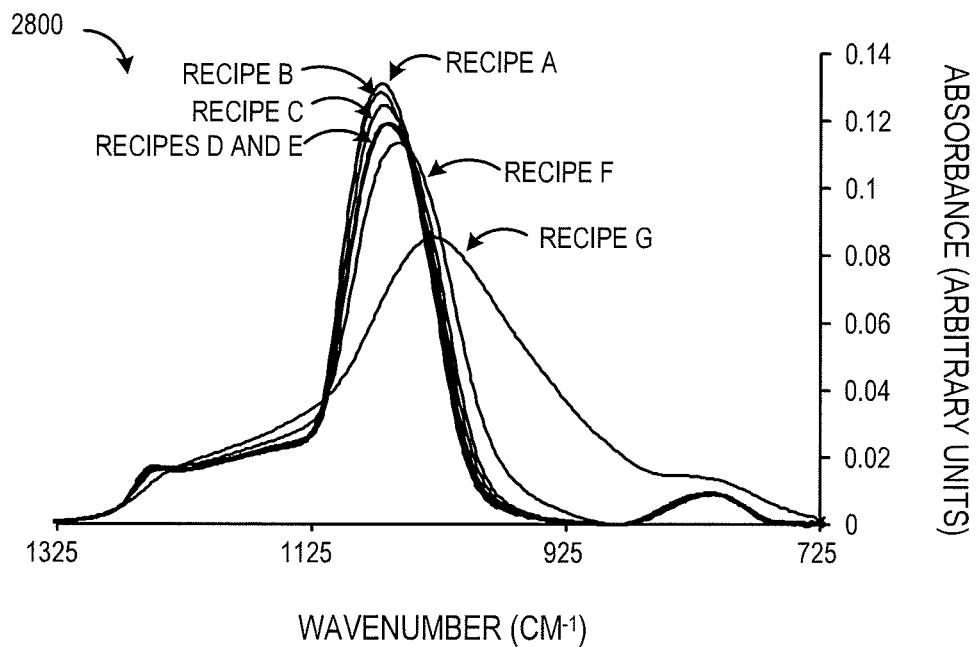
FIG. 27 graphically shows another comparison of Fourier transform infrared spectra showing Si—O bond-stretching mode data for example ultra-smooth PECVD silicon oxide and silicon oxynitride films deposited according embodiments of the present disclosure.

FIG. 27 shows a graph 2700 illustrating a comparison of Fourier transform infrared spectra showing Si—O bond stretching mode data for the example ultra-smooth PECVD silicon oxide and oxynitride films presented in Table 5. The FTIR measurements shown in FIG. 27 show a transition in Si—O bond stretch peak position as the concentration of nitrous oxide in the process station is reduced.

Figure 28:
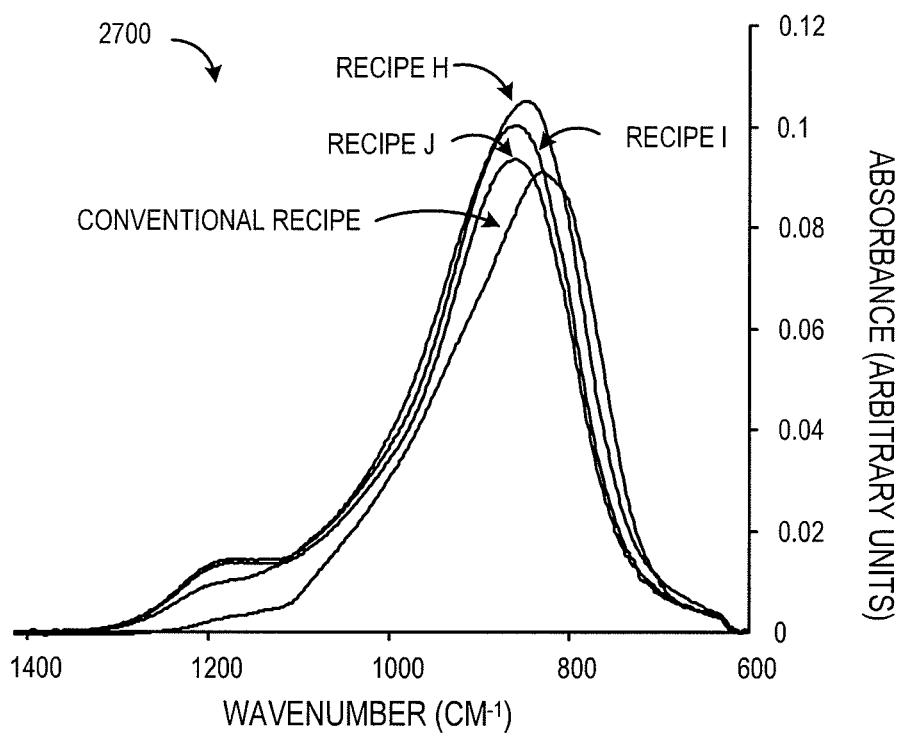
FIG. 28 graphically shows a comparison of Fourier transform infrared spectra showing Si—N bond-stretching mode data for an example conventional silicon nitride film and for example ultra-smooth PECVD silicon nitride films deposited according embodiments of the present disclosure.
Figure 29:
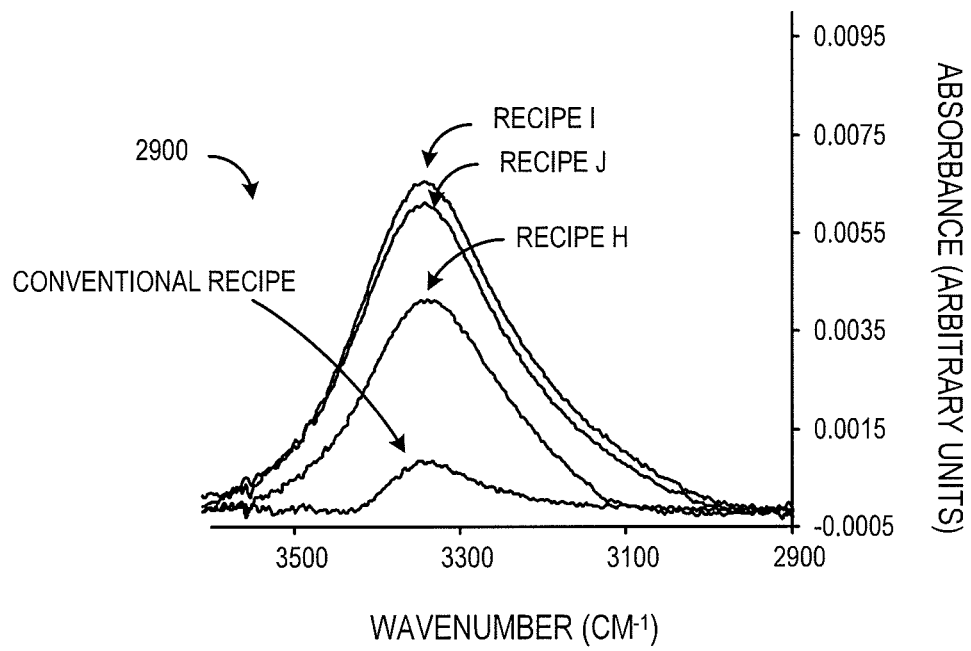
FIG. 29 graphically shows another comparison of Fourier transform infrared spectra showing N—H bond-stretching mode data for an example conventional silicon nitride film and for example ultra-smooth PECVD silicon nitride films deposited according embodiments of the present disclosure.
Figure 30:
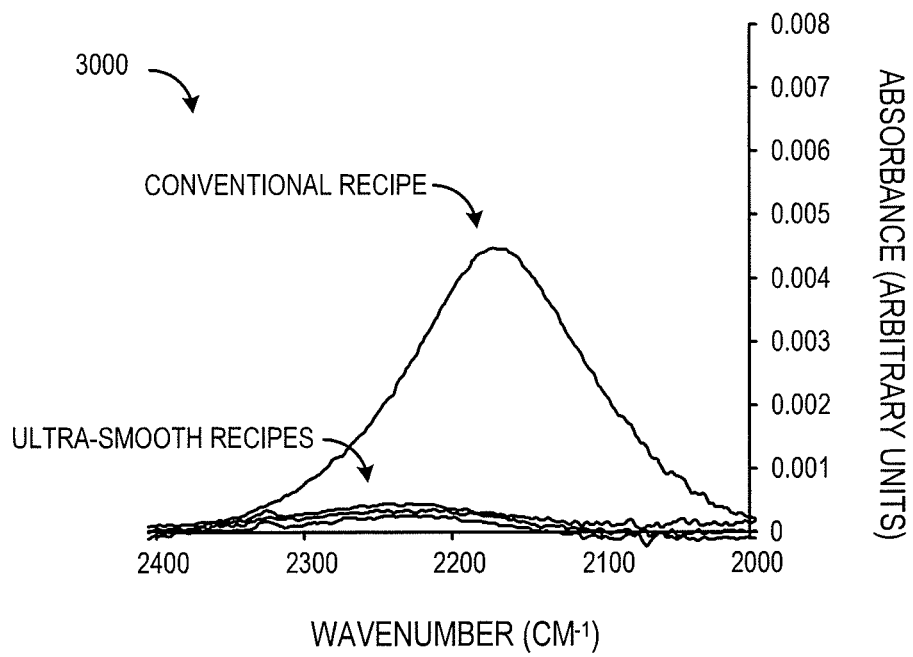
FIG. 30 graphically shows another comparison of Fourier transform infrared spectra showing Si—H bond-stretching mode data for an example conventional silicon nitride film and for example ultra-smooth PECVD silicon nitride films deposited according embodiments of the present disclosure.

The measurements presented in Table 5 also illustrate that ultra-smooth PECVD silicon nitride films having absolute roughness values of approximately 4 Å or less may be deposited by substituting ammonia for nitrous oxide at suitable flow rates. The data presented in Table 5 suggest an inverse relationship between film roughness and film stress and ammonia concentration. For comparison, film and recipe parameters for a conventional PECVD silicon nitride process are also provided in Table 5. FIGS. 28-30 depict comparisons of FTIR spectra 2800, 2900, and 3000, showing Si—N, N—H, and Si—H bond stretching modes, respectively, for the example ultra-smooth PECVD silicon nitride and conventional PECVD silicon nitride films presented in Table 5. As shown in FIGS. 28 and 29, increasing the ammonia concentration tends to shift the Si—N peak position away from the Si—N peak position of the conventional film and tends to increase the area of the N—H peak. This may suggest additional hydrogen incorporation in the film and provide an approach for tuning the film stress characteristics of the film, as supported by the stress data included in Table 5. However, FIG. 30 shows that, unlike the conventional PECVD film, the Si—H bond stretching mode is absent for the ultra-smooth PECVD silicon nitride films. This may provide a comparative improvement in breakdown voltage characteristics for the film relative to the conventional PECVD silicon nitride. Thus, it will be appreciated that, in some examples, the bulk film stress characteristics of the ultra-smooth PECVD silicon nitride film may be tuned while preserving electrical characteristics of the film.

In another example, an ultra-smooth PECVD silicon film (e.g., an amorphous silicon film, an undoped polycrystalline silicon film or a doped polycrystalline silicon film) may be deposited from plasma decomposition of silane alone or in a suitable reducing environment, such as in the presence of a helium, argon, and/or hydrogen plasma, and, in cases where doped polycrystalline silicon is deposited, in the presence of a suitable dopant precursor (e.g., a boron-containing precursor, an arsenic-containing precursor, and/or a phosphorous-containing precursor). Such ultra-smooth PECVD silicon films may also be used to construct film stacks in-situ, and may also exhibit self-planarizing characteristics. Further, in some embodiments, ultra-smooth PECVD silicon processes may add a DC bias or another suitable ion bombardment approach to promote surface rearrangement and potentially enhance surface smoothing. Non-limiting example process parameters for depositing ultra-smooth PECVD undoped silicon films using an example four-station process tool (described in detail below) are shown in Table 6.

TABLE 6

| Parameter | Range |
| --- | --- |
| Pressure (torr) | 0.5 to 8.0 |
| Temperature (° C.) | 300-650 |
| He flow rate (sccm) | 0-10000 |
| Ar flow rate (sccm) | 0-10000 |
| 100% Silane flow rate (sccm) | 0.1-200 |
| $N_2O$ flow rate (sccm) | 0-30000 |
| Nitrogen flow rate (sccm) | 0-15000 |
| High-frequency plasma power (W) | 250-5000 |
| Low-frequency plasma power (W) | 0-2500 |
| Time between beginning of silane flow and plasma ignition (sec) | −3 to +3 |
| Time between end of silane flow and plasma extinction (sec) | −3 to +10 |

Further, in some embodiments, an ultra-smooth PECVD silicon film may be doped by supplying a suitable dopant during deposition or in a post-deposition treatment phase. Non-limiting examples of dopants include arsenic, boron, and phosphorous. In some embodiments, a doped silicon film may be activated by a suitable thermal anneal in-situ. For example, an ultra-smooth PECVD boron-doped silicon film deposited at 550° C. may be annealed to 650° C. without a vacuum break. In some examples, annealing a doped film may lower the resistance of the film, improve conductivity within the film and the film stack and/or reduce the amount of dopant needed to provide a selected film conductivity.

As explained above, ex-situ film processing may lead to the inclusion of defects at one or more interfacial boundaries within the film stack. However, in some scenarios, transitions between in-situ film deposition processes may also lead to defect generation. For example, small particle defects may be generated from the interaction of incompatible processes gases during an in-situ transition from one film deposition process to another. Thus, various embodiments are disclosed herein that are related to film deposition chemistries, hardware, and purge sequences used for in-situ transitions between sequentially deposited films.

In contrast with a CVD process, where thermally activated gas-phase or surface-adsorbed decomposition and/or displacement reactions are used to deposit a film, a PECVD process supplements at least a portion of the process activation energy with plasma energy. Generally, plasma energy may refer to an energy associated with electrons, ions, excited species, and chemical radicals. In some embodiments, plasma-provided energy may result in lower deposition temperatures, which may extend thermal process budgets. Further, in some embodiments, PECVD processes may provide higher deposition rates, which may increase substrate throughput for a process tool.

In some embodiments, plasmas for PECVD processes may be generated by applying a radio frequency (RF) field to a low-pressure gas using two capacitively coupled plates. Ionization of the gas between the plates by the RF field ignites a plasma, creating free electrons in the plasma discharge region. These electrons are accelerated by the RF field and may collide with gas-phase reactant molecules. Collision of these electrons with reactant molecules may form radical species that participate in the deposition process. In one example, reactant radicals react with surface-adsorbed co-reactants to deposit a film layer. It will be appreciated that the RF field may be coupled via any suitable electrodes. Non-limiting examples of electrodes include process gas distribution showerheads, substrate support pedestals, etc. Further, it will be appreciated that plasmas for PECVD processes may be formed by suitable processes other than capacitive coupling of an RF field to a gas.

The plasma discharge region is surrounded by a negatively charged sheath that confines the plasma discharge region. In some embodiments, two radio frequency sources may be used concurrently to tune the plasma. For example, a low-frequency RF source may be used to control ion energy and a high-frequency RF source may be used to control plasma density.

In some embodiments, the plasma may be formed above the substrate surface, which may provide a greater plasma density and enhance a film deposition rate. However, small particles may form within the plasma. These small particles "float" electrically, so that electron and ion currents are balanced on the particle surface. Because an electron typically has a higher mobility than an ion, the particle may become negatively charged. Consequently, these particles may be trapped at plasma-sheath boundaries, where molecular drag forces from neutral and ionized species directed toward the deposition surface balance electrostatic forces directed toward the plasma discharge region. Quenching the plasma extinguishes the electrostatic forces, which may cause the particles to land on the deposition surface. Particles that decorate the deposition surface may appear as interface roughness defects or interface morphology defects and may ultimately diminish device performance and reliability.

Some approaches to mitigating defects created by plasma-generated particles include alternating pumping and purging of the reactor environment. However, these approaches may be time consuming and may reduce tool throughput. Thus, various embodiments are disclosed herein that are related to maintaining plasma stability throughout in-situ PECVD formation of film stacks to avoid depositing particles on the deposition surface.

Figure 31:
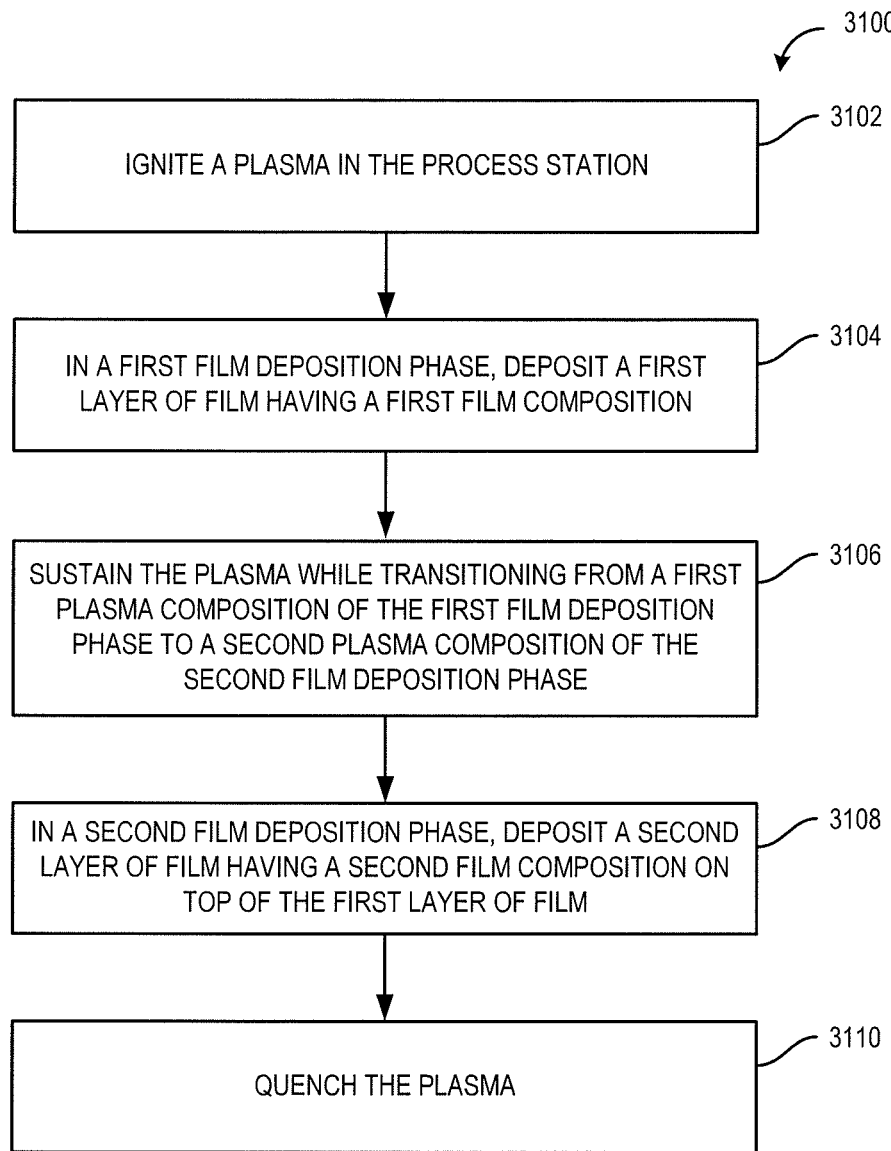
FIG. 31 shows a flow chart illustrating a method of depositing a film stack in-situ using a plurality of plasma-activated film deposition phases according to an embodiment of the present disclosure.

FIG. 31 shows a flow chart illustrating a method 3100 for depositing a film stack in-situ using a plurality of plasma-activated film deposition phases. At 3102, method 3100 includes igniting a plasma. At 3104, method 3100 includes, in a first plasma-activated film deposition phase, depositing a first layer of film having a first film composition. At 3106, method 3100 includes sustaining the plasma while transitioning a composition of the plasma from a first plasma composition of the first plasma-activated film deposition phase to a second plasma composition of the second plasma-activated film deposition phase. At 3108, method 3100 includes, in the second plasma-activated film deposition phase, depositing a second layer of film having a second film composition on top of the first layer of film. At 3110, method 3100 includes quenching the plasma. While method 3100 depicts an example two-layer in-situ film stack deposition process, it will be appreciated that, in some embodiments, three or more layers may be deposited by including a suitable number of film transition phases in which the plasma is sustained while the plasma composition is altered without departing from the scope of the present disclosure.

Figure 32:
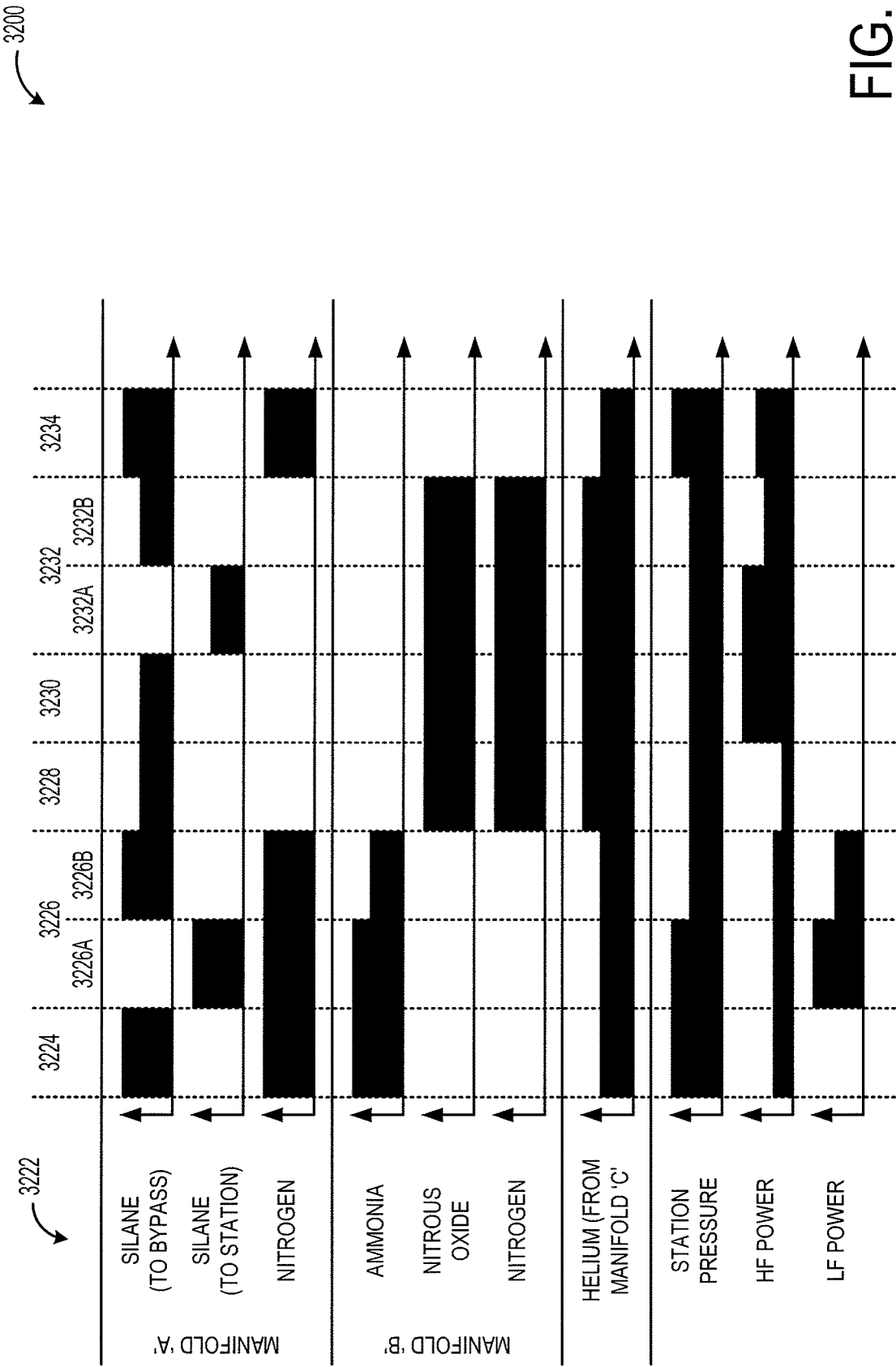
FIG. 32 schematically shows a timing diagram for an example PECVD process according to an embodiment of the present disclosure.

FIG. 32 schematically shows an example process timing diagram 3200 for in-situ PECVD deposition of alternating layers of silicon nitride and silicon oxide films. In the example shown in FIG. 32, silicon nitride is deposited by reaction of silane ($SiH_4$) and ammonia ($NH_3$) in the presence of a plasma during a first film deposition phase and silicon dioxide is deposited by reaction of silane and nitrous oxide ($N_2O$) in the presence of a plasma during a second film deposition phase. As shown in the example depicted in FIG. 32, a plasma is sustained during transitions between deposition phases. Sustaining the plasma may trap plasma-generated particles in the above-described electrically floating state. Trapping the particles in the sustained plasma may reduce decoration of the surface by small particle defects, which may lead to increased yields compared to processes in which the plasma is quenched between deposition steps.

In some embodiments, the plasma is sustained by controlling process station conditions to maintain a constant plasma volume (e.g., less than 20% variation as the plasma volume is visually observed) between different and/or subsequent deposition events. Alternatively or additionally, in some embodiments, a constant ion energy distribution and/or a constant absorbed RF power distribution is maintained between subsequent deposition events. In some embodiments, such control may be achieved by controlling one or more set points of a process station pressure, a gas concentration, an RF source power, an RF source frequency, and a plasma power pulse timing. In one non-limiting example, a set point for a total delivered plasma power may be held constant between different film deposition events. In another non-limiting example, a low-frequency plasma power may be decreased by a proportionally greater amount than a decrease in a high-frequency plasma power. This may reduce ion damage to the substrate surface between deposition events while maintaining plasma density. It will be appreciated that such parameters may be adjusted, discretely or continuously, to maintain plasma stability and to avoid indicia of plasma instability. Non-limiting examples of indicia of plasma instability include plasma flickering, extinction, and local plasma brightness variation. It further will be appreciated that these specific embodiments are described for the purpose of example and are not intended to be limiting, as any suitable method of maintaining plasma integrity and stability may be employed between various deposition phases of an in-situ PECVD film stack process.

FIG. 32 shows an example list of parameters 3222, such as gas flow rates, process pressure, and high- and low-frequency RF power settings for an RF power source that may be used in an in-situ PECVD process including sustained plasmas between deposition events. FIG. 32 also shows a temporal progression of process phases, wherein one or more of parameters 3222 are varied to achieve a process condition for the process phase. Each of the example process phases will be described in detail below, though it will be appreciated that other suitable process chemistries may vary one or more aspects of the process phases while remaining within the scope of the present disclosure. Parameter ranges for example silane-based silicon dioxide and silicon nitride processes using an example four-station process tool (described in more detail below) are provided in Tables 7A and 7B, though it will be appreciated that other suitable parameter ranges may be employed in other embodiments of film-forming process chemistries. For example, other parameter ranges may apply for silicon dioxide films formed from silane using CO and/or $CO_2$ as an oxygen source and for silicon nitride films formed from silane using nitrogen atoms obtained from $N_2$ and/or $N_2/H_2$ plasmas. An example silicon nitride process using silane and ammonia and an example four-station process tool is provided in Table 8 and an example silicon dioxide process using silane and nitrous oxide and an example four-station process tool is provided in Table 9.

TABLE 7A

| | Phase | | | |
|---|---|---|---|---|
| | Silicon nitride deposition preparation phase | Silicon nitride deposition subphase 1 | Silicon nitride deposition subphase 2 | N/O transition phase |
| $SiH_4$ (sccm) | 1-1000 | 1-1000 | 1-1000 | 0-1000 |
| $N_2$ Manifold A (sccm) | 0-10000 | 0-10000 | 0-10000 | 0-20000 |
| $NH_3$ (sccm) | 10-10000 | 10-10000 | 10-10000 | 0-10000 |
| $N_2O$ (sccm) | 0 | 0 | 0 | 0-30000 |
| $N_2$ Manifold B (sccm) | 0-20000 | 0-20000 | 0-20000 | 0-20000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-6.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |
| LF Power (W) | 0-2500 | 0-2500 | 0-2500 | 0-2500 |

TABLE 7B

| | Phase | | | |
|---|---|---|---|---|
| | $SiO_2$ deposition preparation phase | $SiO_2$ deposition subphase 1 | $SiO_2$ deposition subphase 2 | O/N transition phase |
| $SiH_4$ (sccm) | 0.1-1000 | 0.1-1000 | 0.1-1000 | 0-1000 |
| $N_2$ Manifold A (sccm) | 0-20000 | 0-20000 | 0-20000 | 1000-10000 |
| $NH_3$ (sccm) | 0 | 0 | 0 | 0-10000 |
| $N_2O$ (sccm) | 1-30000 | 1-30000 | 1-30000 | 0 |
| $N_2$ Manifold B (sccm) | 0-20000 | 0-20000 | 0-20000 | 0-20000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-5.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |
| LF Power (W) | 0-2500 | 0-2500 | 0-2500 | 0-2500 |

TABLE 8

| | |
|---|---|
| $SiH_4$ (sccm) | 200 |
| $NH_3$ (sccm) | 1040 |
| $N_2$ Manifold A (sccm) | 6000 |
| $N_2$ Manifold B (sccm) | 3000 |
| He (sccm) | 0 |
| Ar (sccm) | 0 |
| Pressure (torr) | 2.8 |
| Temp (C.) | 550 |
| HF Power (W) | 1000 |
| LF Power (W) | 100 |

TABLE 9

| | |
|---|---|
| $SiH_4$ (sccm) | 40 |
| $N_2O$ (sccm) | 24000 |
| $N_2$ Manifold A (sccm) | 5000 |
| $N_2$ Manifold B (sccm) | 5000 |
| He (sccm) | 8000 |
| Ar (sccm) | 0 |
| Pressure (torr) | 1.5 |
| Temp (C.) | 550 |

TABLE 9-continued

| | |
|---|---|
| HF Power (W) | 2500 |
| LF Power (W) | 0 |

At silicon nitride deposition preparation phase 3224 of FIG. 32, a flow rate for silane is set and silane is supplied to a process station bypass line. This may provide time for the silane flow to stabilize prior to introduction to the process station. FIG. 32 also shows that ammonia is supplied to the process station at a controlled flow rate. Thus, each reactant for the silicon nitride deposition process may be flow-stabilized prior to initiating deposition, which may provide for deposition thickness control during the silicon nitride deposition process. FIG. 32 also shows that nitrogen is supplied to the process station during silicon nitride deposition preparation phase 3224. Nitrogen may act as a diluent gas to assist pressure and/or temperature control, as a sweep gas to prevent back-diffusion of reactant gases into plumbing for an incompatible co-reactant, etc. Additionally or alternatively, in some embodiments, nitrogen may react with silane to form a silicon nitride film.

FIG. 32 also shows that other process variables are set and stabilized during silicon nitride deposition preparation phase 3224. For example, helium is supplied to the process station and a high frequency RF power source is activated to strike and stabilize a helium plasma. Further, a process station pressure is stabilized during silicon nitride deposition preparation phase 3224. In some embodiments, process station pressure may be controlled by varying one or more gas flows feeding the process station, adjusting a process station throttle valve, etc. Further, in some embodiments, a temperature of a substrate pedestal may be stabilized at a deposition temperature. Thus, it will be appreciated that any suitable process parameter may be adjusted and/or stabilized at silicon nitride deposition preparation phase 3224. Silicon nitride deposition preparation phase 3224 may have any suitable duration. In one non-limiting example, silicon nitride deposition preparation phase 3224 may be approximately three seconds long.

The process station begins depositing silicon nitride at silicon nitride deposition phase 3226. In the example shown in FIG. 32, silicon nitride deposition phase 3226 is divided into two subphases: nitride deposition subphase 3226A, which represents an active deposition subphase, and nitride deposition subphase 3226B, which represents a post-deposition film treatment subphase.

As shown in FIG. 1, silane, which was previously routed to the process station bypass line, is supplied to the process station and the low-frequency RF power is increased during nitride deposition subphase 3226A. Consequently, a silicon nitride film is nucleated and is continuously deposited on the substrate surface throughout nitride deposition subphase 3226A. Excluding a time needed for film nucleation, the duration of nitride deposition subphase 3226A may be approximately proportional to the thickness of the deposited film. Thus, the duration of nitride deposition subphase 3226A may be adjusted to vary the thickness of the deposited silicon nitride layer. In one non-limiting example, nitride deposition subphase 3226A may be approximately ten seconds long, which may correspond to a silicon nitride film approximately 300 angstroms thick.

At nitride deposition subphase 3226B, shown in FIG. 32, silane is again diverted to the process station bypass line and the low-frequency RF power is decreased. Further, ammonia flow to the process station is decreased and the total process station pressure is reduced. In some embodiments, these adjustments may provide a post-deposition treatment of bulk and/or near-surface portions of the deposited silicon nitride film. Example post-deposition treatments include a densification treatment and a nitrogen enrichment treatment. Additionally or alternatively, in some embodiments, nitride deposition subphase 3226B may provide a surface pre-treatment for preparing the silicon nitride surface for subsequent film deposition. An example pre-treatment may be configured to reduce subsequent film nucleation time. Nitride deposition subphase 3226B may have any suitable duration. For example, in one embodiment, nitride deposition subphase 3226B may be approximately five seconds long. Further, it will be appreciated that additional nitride deposition subphases may be included in some embodiments within the scope of the present disclosure.

At nitride/oxide transition phase 3228, shown in FIG. 32, various process parameters are adjusted to transition the process station from silicon nitride deposition to silicon dioxide deposition. In the example shown in FIG. 32, the flow rate of silane, still routed to the process station bypass line, is decreased. Further, the ammonia flow is turned off and an $N_2O$ flow is turned on during nitride/oxide transition phase 3228. Further still, sources of nitrogen are varied between gas manifolds as shown in FIG. 32. As described above, sources and/or flow rates of nitrogen gas may be varied to provide back-diffusion prevention, pressure control, temperature control, etc. In some embodiments, nitrogen flow rates may be varied during nitride/oxide transition phase 3228 to purge incompatible reactant gases from the process station that might otherwise participate in undesirable defect-forming reactions.

Throughout nitride/oxide transition phase 3228, parameters 3222 are varied to maintain the plasma. For example, FIG. 32 shows that the helium flow is increased and high-frequency plasma power is decreased at nitride/oxide transition phase 3228. Similar plasma-stabilizing approaches are used in silicon dioxide deposition preparation phase 3230, where the HF power is increased in preparation for silicon dioxide deposition phase 3232. These approaches may maintain the integrity and stability of the plasma density and/or volume during transition to process conditions for silicon dioxide film deposition. Non-limiting examples of suitable durations of nitride/oxide transition phase 3228 and silicon dioxide deposition preparation phase 30 are each approximately three seconds.

As shown in FIG. 32, silicon dioxide deposition phase 3232 is divided into two subphases. Oxide deposition subphase 3232A represents an active deposition subphase. Oxide deposition subphase 3232B represents a post-deposition film treatment subphase. As shown in FIG. 32, silane, which was previously routed to the process station bypass line, is supplied to the process station during oxide deposition subphase 3232A. During oxide deposition subphase 3232A, a silicon dioxide film is nucleated and deposited on the substrate surface. Excluding a time needed for film nucleation, the duration of oxide deposition subphase 3232A may be approximately proportional to the thickness of the deposited film. Thus, the duration of oxide deposition subphase 3232A may be adjusted to vary the thickness of the silicon dioxide layer. In one non-limiting example, oxide deposition subphase 3232A may be approximately eight seconds long, which may correspond to a deposited silicon dioxide film approximately 300 angstroms thick.

At oxide deposition subphase 3232B, silane is diverted to the process station bypass line and the high-frequency power is decreased. In some embodiments, these adjustments may provide a post-deposition treatment of bulk and/or near-surface portions of the deposited silicon dioxide film. Example post-deposition treatments may include densification treatments, oxygen enrichment treatments, trap reduction treatments, etc. Additionally or alternatively, oxidation deposition subphase 3232B may pre-treat the surface of the deposited silicon dioxide in preparation for deposition of a subsequent film. One example pre-treatment may be a treatment to reduce subsequent film nucleation time. Oxide deposition subphase 3232B may have any suitable duration. In one non-limiting example, oxide deposition subphase 3232B is approximately two seconds long. Further, it will be appreciated that additional oxide deposition subphases may be provided within the scope of the present disclosure.

At oxide/nitride transition phase 3234, shown in FIG. 32, various process parameters are adjusted to transition the process station from silicon dioxide deposition to silicon nitride deposition. In the example shown in FIG. 32, the flow rate of silane, still routed to the process station bypass line, is increased. Further, the $N_2O$ flow is turned off during oxide/nitride transition phase 3234. Further still, sources of nitrogen are varied between gas manifolds during oxide/nitride transition phase 3234. As described above, sources and/or flow rates of nitrogen gas may be varied to provide back-diffusion prevention, pressure control, temperature control, etc. In some embodiments, nitrogen flow rates may be varied during oxide/nitride transition phase 3234 to purge incompatible reactant gases from the process station that might otherwise participate in undesirable defect-forming reactions.

Throughout oxide/nitride transition phase 3234, parameters 3222 are varied to maintain plasma stability. For example, in the depicted embodiment, the helium flow is decreased and the high-frequency RF power is increased at oxide/nitride transition phase 3234. This may maintain the integrity and stability of the plasma density and/or volume during transition to process conditions for silicon dioxide film deposition. Oxide/nitride transition phase 3234 may have any suitable duration. In one non-limiting example, oxide/nitride transition phase 3234 is approximately two seconds long.

In some process conditions, high-frequency plasmas may be comparatively more effective at bond scission processes than low-frequency plasmas. Conversely, under some process conditions, low-frequency plasmas may provide a comparatively higher flux of radicals to the substrate surface. Thus, it will be appreciated that, in some embodiments, plasma powers for single or dual-frequency plasmas may be selected to generate suitable plasma conditions for various film deposition chemistries and conditions. Example silicon oxide process conditions and silicon nitride conditions suitable for use with the process illustrated in FIG. 32 are provided in Tables 7A, 7B, 8 and 9 above.

It will be appreciated that the two-film process described above may commence with the deposition of a silicon dioxide film rather than a silicon nitride film. Further, it will be appreciated that additional alternating layers may be formed by repeating all or a part of the example two-film process described above. For example, an oxide/nitride/oxide film may be deposited as a part of a process to form a silicon oxide/silicon nitride/silicon oxide (ONO) gate device. Further still, it will be appreciated that, in some embodiments, multiple film types may be deposited in-situ. For example, a three-film process may be used for in-situ deposition of a film stack having three film types.

While the deposition processes disclosed above have been discussed in the context of 3D memory applications, it will be appreciated that in-situ deposition of film stacks may be used for any suitable purpose in an integrated device or in an integrated material. For example, a carbon-based ashable hardmask (AHM) layer may be deposited in-situ with an antireflective layer (ARL) for lithographic patterning applications. In one scenario, the ashable hardmask layer may be approximately 200 Å thick and the antireflective layer may be approximately 100 to 600 Å thick.

In another example, a carbon-doped silicon dioxide film may be deposited in-situ with a silicon nitride film using a suitable carbon-based silicon-containing reactant. For example, carbon-doped silicon dioxide films may be deposited using plasma-enhanced decomposition of TEOS (and/or another suitable alkoxysilane) in the presence of an oxygen plasma. In some embodiments, varying the concentration of oxygen radicals provided by the plasma may be used to vary an amount of carbon remaining in the silicon dioxide film. Thus, varying the plasma conditions in a TEOS-based process may be used to modify physical and electrical properties of the deposited silicon dioxide film that might be invariant in a silane-based silicon dioxide deposition process.

Parameter ranges for an example TEOS-based silicon dioxide process and an example silane-based silicon nitride process using an example four-station process tool (described in more detail below) are provided in Tables 10A and 10B. Table 11 shows a specific example of a TEOS-based silicon dioxide process using an example four-station process tool. It will be appreciated that other suitable parameter ranges may be employed in other embodiments of film-forming process chemistries. For example, other parameter ranges may apply for silicon dioxide films formed from TEOS using $N_2O$ (examples of which are described in more detail below with respect to Tables 12A, 12B, and 13), CO, and/or $CO_2$ as an oxygen source.

TABLE 10A

| | Phase | | | |
|---|---|---|---|---|
| | Silicon nitride deposition preparation phase | Silicon nitride deposition subphase 1 | Silicon nitride deposition subphase 2 | N/O transition phase |
| $SiH_4$ (sccm) | 1-1000 | 1-1000 | 1-1000 | 0 |
| TEOS (mL/min) | 0 | 0 | 0 | 0-20 |
| $N_2$ Manifold A (sccm) | 0-10000 | 0-10000 | 0-10000 | 0-10000 |
| $NH_3$ (sccm) | 10-10000 | 10-10000 | 10-10000 | 0-10000 |
| $O_2$ (sccm) | 0 | 0 | 0 | 0-20000 |
| $N_2$ Manifold B (sccm) | 0-20000 | 0-20000 | 0-20000 | 0-30000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-6.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |

TABLE 10A-continued

| | Phase | | | |
|---|---|---|---|---|
| | Silicon nitride deposition preparation phase | Silicon nitride deposition subphase 1 | Silicon nitride deposition subphase 2 | N/O transition phase |
| LF Power (W) | 0-2500 | 0-2500 | 0-2500 | 0-2500 |

TABLE 10B

| | Phase | | | |
|---|---|---|---|---|
| | $SiO_2$ deposition preparation phase | $SiO_2$ deposition subphase 1 | $SiO_2$ deposition subphase 2 | O/N transition phase |
| $SiH_4$ (sccm) | 0 | 0 | 0 | 0 |
| TEOS (mL/min) | 1-20 | 1-20 | 1-20 | 0 |
| $N_2$ Manifold A (sccm) | 0 | 0 | 0 | 0-10000 |
| $NH_3$ (sccm) | 0 | 0 | 0 | 0 |
| $O_2$ (sccm) | 100-20000 | 100-20000 | 100-20000 | 0 |
| $N_2$ Manifold B (sccm) | 0 | 0 | 0 | 0-20000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-6.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |
| LF Power (W) | 0-2500 | 0-2500 | 0-2500 | 0-2500 |

TABLE 11

| | |
|---|---|
| TEOS (mL/min) | 4.5 |
| $O_2$ (sccm) | 10000 |
| $N_2$ Manifold A (sccm) | 0 |
| $N_2$ Manifold B (sccm) | 0 |
| He (sccm) | 0 |
| Ar (sccm) | 0 |
| Pressure (torr) | 1.2 |
| Temp (C.) | 550 |
| HF Power (W) | 350 |
| LF Power (W) | 800 |

Figure 33:
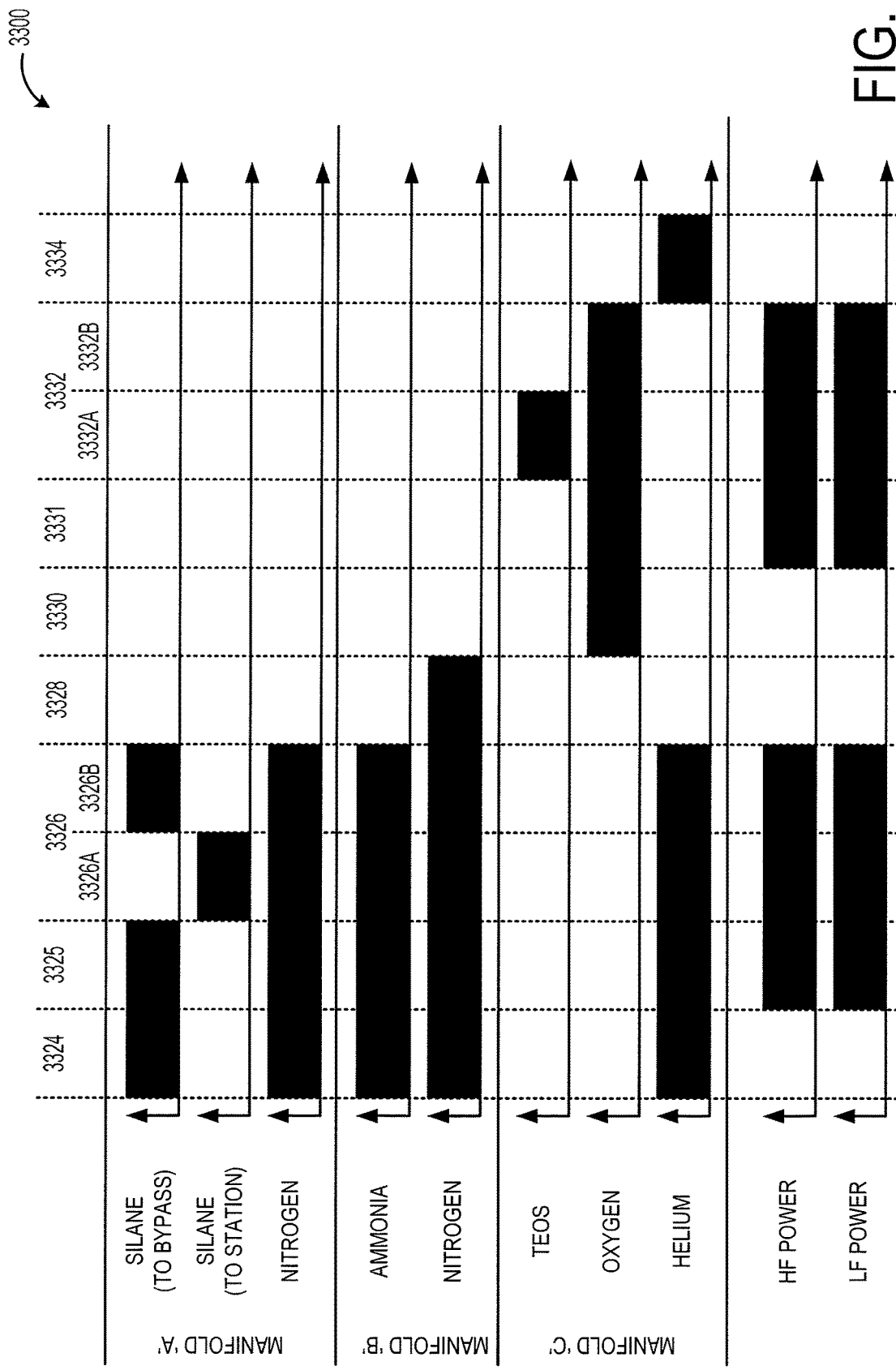
FIG. 33 schematically shows another timing diagram for an example PECVD process according to an embodiment of the present disclosure.

FIG. 33 schematically shows an example process timing diagram 3300 for in-situ PECVD deposition of alternating layers of silicon nitride and silicon oxide films. In the example shown in FIG. 33, silicon nitride is deposited by reaction of silane ($SiH_4$) and ammonia ($NH_3$) in the presence of a plasma during a first film deposition phase and silicon dioxide is deposited by reaction of TEOS and oxygen in the presence of a plasma during a second film deposition phase. As shown in the example depicted in FIG. 33 and described in more detail below, the plasma is quenched during transitions between silicon nitride and silicon dioxide deposition phases.

At silicon nitride deposition preparation phase 3324 of FIG. 33, a flow rate for silane is set and silane is supplied to a process station bypass line. This may provide time for the silane flow to stabilize prior to introduction to the process station. FIG. 33 also shows that ammonia is supplied to the process station at a controlled flow rate. Thus, each reactant for the silicon nitride deposition process may be flow-stabilized prior to initiating deposition, which may provide for deposition thickness control during the silicon nitride deposition process. FIG. 33 also shows that nitrogen is supplied to the process station during silicon nitride deposition preparation phase 3324. Nitrogen may act as a diluent gas to assist pressure and/or temperature control, as a sweep gas to prevent back-diffusion of reactant gases into plumbing for an incompatible co-reactant, etc. Additionally or alternatively, in some embodiments, nitrogen may react with silane to form a silicon nitride film. Other suitable process gases may be supplied to the process station in preparation for silicon nitride deposition during silicon nitride deposition preparation phase 3324. For example, FIG. 33 also shows that helium is supplied to the process station during silicon nitride deposition preparation phase 3324.

Other process parameters, such as process pressure, may also be adjusted during silicon nitride preparation phase 3324. In some embodiments, process station pressure may be controlled by varying one or more gas flows feeding the process station, adjusting a process station throttle valve, etc. Further, in some embodiments, a temperature of a substrate pedestal may be stabilized at a deposition temperature. Thus, it will be appreciated that any suitable process parameter may be adjusted and/or stabilized at silicon nitride deposition preparation phase 3324. Silicon nitride deposition preparation phase 3324 may have any suitable duration.

In the example shown in FIG. 33, high and low frequency RF power sources are activated to strike and stabilize a plasma at an optional nitride plasma ignition phase 3325, though it will be appreciated that in some embodiments, a single-frequency RF power source may be activated without departing from the scope of the present disclosure. Striking a plasma prior to introducing silane to the process station may avoid small particle generation under some process conditions. For example, by first striking a plasma and later supplying silane, as shown in FIG. 33, plasma ignition events that may generate small particles may be comparatively reduced relative to striking a silane plasma. However, it will be appreciated that, in some embodiments, a silane plasma may be ignited during silicon nitride deposition phase 3326.

The process station begins depositing silicon nitride at silicon nitride deposition phase 3326. In the example shown in FIG. 33, silicon nitride deposition phase 3326 is divided into two subphases: nitride deposition subphase 3326A, which represents an active deposition subphase, and optional nitride deposition subphase 3326B, which represents a post-deposition film treatment subphase.

As shown in FIG. 33, silane, which was previously routed to the process station bypass line, is supplied to the process station during nitride deposition subphase 3326A. Consequently, a silicon nitride film is nucleated and is deposited on the substrate surface throughout nitride deposition subphase 3326A. Excluding a time needed for film nucleation, the duration of nitride deposition subphase 3326A may be approximately proportional to the thickness of the deposited film. Thus, the duration of nitride deposition subphase 3326A may be adjusted to vary the thickness of the deposited silicon nitride layer.

At nitride deposition subphase 3326B, shown in FIG. 33, silane is diverted to the process station bypass line. In the embodiment shown in FIG. 33, the high- and low-frequency power supplies are turned off at the end of nitride deposition subphase 3326B, which may consume residual silane within the process station, potentially reducing small particle defects. However, it will be appreciated that, in other embodiments, one or more of the plasma power supplies may be turned off at any suitable point within nitride deposition subphase 3326B.

In some embodiments, other process parameters, such as ammonia flow, process station pressure, and process station temperature, may be adjusted during nitride deposition subphase 3326B to provide a post-deposition treatment of bulk and/or near-surface portions of the deposited silicon nitride film. Example post-deposition treatments include, but are not limited to, plasma and/or thermally-driven densification treatments and nitrogen enrichment treatments. Additionally or alternatively, in some embodiments, nitride deposition subphase 3326B may provide a surface pre-treatment for preparing the silicon nitride surface for subsequent film deposition. An example pre-treatment may be configured to reduce subsequent film nucleation time. Nitride deposition subphase 3326B may have any suitable duration. Further, it will be appreciated that additional nitride deposition subphases may be included in some embodiments without departing from the scope of the present disclosure. In the example shown in FIG. 33, silane, ammonia, and helium flows to the process station are turned off at the end of nitride deposition subphase 3326B in preparation for oxide deposition.

At nitride/oxide transition phase 3328, shown in FIG. 33, various process parameters are adjusted to transition the process station from silicon nitride deposition to silicon dioxide deposition. For example, FIG. 33 shows that nitrogen continues to flow in the process station to assist with purging residual silane and nitride deposition byproducts. In some embodiments, nitrogen flow rates may be varied during nitride/oxide transition phase 3328 to purge incompatible reactant gases from the process station that might otherwise participate in undesirable defect-forming reactions. It will be appreciated that any suitable purge gas may be used without departing from the scope of the present disclosure, and that, in some embodiments, alternating purge and evacuation cycles may be used in nitride/oxide transition phase 3328 to prepare the process station for in situ silicon dioxide deposition. In the example shown in FIG. 33, nitrogen is turned off at the end of nitride/oxide transition phase 3328.

Oxygen is supplied to the process station at the start of silicon dioxide deposition preparation phase 3330. Subsequently, the example shown in FIG. 33 shows that, during optional oxide plasma ignition phase 3331, both high and low frequency RF power sources are activated to strike and stabilize a plasma. However, it will be appreciated that in some embodiments, a single-frequency power source maybe employed without departing from the scope of the present disclosure. It will be appreciated that oxide plasma ignition phase 3331 is optional, and that, in some embodiments, a plasma may be ignited during silicon dioxide deposition phase 3332. In some embodiments, other gases, such as helium and argon, may be provided to the process station during one or more of silicon dioxide deposition preparation phase 3330, optional oxide plasma ignition phase 3331 and subsequent silicon dioxide deposition phase 3332.

The process station begins depositing silicon dioxide at silicon dioxide deposition phase 3332. As shown in FIG. 33, silicon dioxide deposition phase 3332 is divided into two subphases. Oxide deposition subphase 3332A represents an active deposition subphase. Optional oxide deposition subphase 3332B represents a post-deposition film treatment subphase. As shown in FIG. 33, TEOS is supplied to the process station during oxide deposition subphase 3332A. During oxide deposition subphase 3332A, a silicon dioxide film is nucleated and deposited on the substrate surface. Excluding a time needed for film nucleation, the duration of oxide deposition subphase 3332A may be approximately proportional to the thickness of the deposited film. Thus, the duration of oxide deposition subphase 3332A may be adjusted to vary the thickness of the silicon dioxide layer. TEOS flow to the process station is stopped at the end of oxide deposition subphase 3332A.

In the example shown in FIG. 33, both high and low frequency power supplies are turned off at the end of oxide deposition subphase 3332B. However, it will be appreciated that, in some embodiments, one or more of the plasma power supplies may be turned off at any suitable point within oxide deposition subphase 3332B. The resulting plasma may consume residual TEOS in the process station and may provide a post-deposition treatment of bulk and/or near-surface portions of the deposited silicon dioxide film. Example post-deposition treatments may include densification treatments, oxygen enrichment treatments, trap reduction treatments, etc. Oxygen flow to the process station is turned off at the end of oxide deposition subphase 3332B. At oxide/nitride transition phase 3334, shown in FIG. 33, the flows of nitrogen and helium are turned on in preparation for a subsequent deposition of silicon nitride.

Additionally or alternatively, in some embodiments, particle generation caused by incompatible process gases may be addressed by reacting TEOS with plasma-activated nitrous oxide in place of plasma-activated oxygen to form a silicon dioxide film. $N_2O$ may be less likely to interact with the silane-based silicon nitride process; for example, $N_2O$ may be less likely to remain adsorbed to hardware and/or plumbing surfaces. Accordingly, an $N_2O$- and TEOS-based silicon dioxide process may be less likely to generate particles when sharing hardware with a silane-based silicon nitride process.

Parameter ranges for example $N_2O$- and TEOS-based silicon dioxide processes and example silane-based silicon nitride processes using an example four-station process tool (described in more detail below) are provided in Tables 12A and 12B. Table 13 shows a specific example of a $N_2O$- and TEOS-based silicon dioxide process using an example four-station process tool. It will be appreciated that other suitable parameter ranges may be employed in other embodiments of film-forming process chemistries. For example, other parameter ranges may apply for silicon dioxide films formed from TEOS using CO and/or $CO_2$ as an oxygen source.

TABLE 12A

| | Phase | | | |
|---|---|---|---|---|
| | Silicon nitride deposition preparation phase | Silicon nitride deposition subphase 1 | Silicon nitride deposition subphase 2 | N/O transition phase |
| SiH₄ (sccm) | 1-1000 | 1-1000 | 1-1000 | 0 |
| TEOS (mL/min) | 0 | 0 | 0 | 0-20 |
| N₂ Manifold A (sccm) | 0-10000 | 0-10000 | 0-10000 | 0 |
| NH₃ (sccm) | 10-10000 | 10-10000 | 10-10000 | 0-10000 |
| N₂O (sccm) | 0 | 0 | 0 | 0-30000 |
| N₂ Manifold B (sccm) | 0-20000 | 0-20000 | 0-20000 | 0-30000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-6.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |
| LF Power (W) | 0-2500 | 0-2500 | 0-2500 | 0-2500 |

TABLE 12B

| | Phase | | | |
|---|---|---|---|---|
| | SiO₂ deposition preparation phase | SiO₂ deposition subphase 1 | SiO₂ deposition subphase 2 | O/N transition phase |
| SiH₄ (sccm) | 0 | 0 | 0 | 0 |
| TEOS (mL/min) | 1-20 | 1-20 | 1-20 | 0 |
| N₂ Manifold A (sccm) | 0 | 0 | 0 | 0-10000 |
| NH₃ (sccm) | 0 | 0 | 0 | 0 |
| N₂O (sccm) | 100-30000 | 100-30000 | 100-30000 | 0-30000 |
| N₂ Manifold B (sccm) | 0 | 0 | 0 | 0-20000 |
| He (sccm) | 0-20000 | 0-20000 | 0-20000 | 0-20000 |
| Ar (sccm) | 0-30000 | 0-30000 | 0-30000 | 0-30000 |
| Pressure (torr) | 0.5-6.0 | 0.5-6.0 | 0.5-6.0 | 0.5-6.0 |
| Temp (C.) | 200-650 | 200-650 | 200-650 | 200-650 |
| HF Power (W) | 0-5000 | 0-5000 | 0-5000 | 0-5000 |
| LF Power (W) | 0-2500 | 0-2500 | 0-2500 | 0-2500 |

TABLE 13

| | |
|---|---|
| TEOS (mL/min) | 4.9 |
| N₂O (sccm) | 15000 |
| N₂ Manifold A (sccm) | 0 |
| N₂ Manifold B (sccm) | 0 |
| He (sccm) | 0 |
| Ar (sccm) | 0 |
| Pressure (torr) | 1.8 |
| Temp (C.) | 400 |
| HF Power (W) | 350 |
| LF Power (W) | 800 |

It will be appreciated that silicon oxide films deposited using plasma activated TEOS and nitrous oxide may be deposited by one or more of the embodiments described above. For example, in some embodiments, a silicon oxide film may be deposited on a substrate using TEOS and nitrous oxide in a process station. The process station may be controlled within suitable process parameter ranges such as those listed above in Tables 12A, 12B, and 13. For example, a process station may be controlled to heat a substrate to a temperature of between 200° C. and 650° C. Deposition of the silicon oxide film may be achieved by supplying a plasma to the substrate and by supplying tetraethyl orthosilicate (TEOS) and nitrous oxide to the plasma.

As explained above, in some embodiments, silicon oxide films deposited by plasma-activation of TEOS and nitrous oxide may be performed in-situ with another deposition process. For example, in some embodiments, a process tool may deposit a silicon nitride film on a substrate followed by deposition of a silicon oxide film using plasma-activated TEOS and nitrous oxide without an intervening vacuum break. In one scenario, the in-situ deposition may occur within the same process station. In another scenario, the in-situ deposition may occur within different process stations included in the same process tool.

As explained above, in some embodiments, variations in the concentration of oxygen radicals provided by the plasma may be used to vary an amount of carbon remaining in the silicon dioxide film. Thus, in some embodiments, varying the plasma conditions in a nitrous oxide- and TEOS-based plasma-activated film deposition process may be used to adjust the carbon concentration of the silicon oxide film in any suitable way. For example, in some embodiments, the plasma may be controlled to maintain an approximately constant concentration of carbon. Alternatively, in some embodiments, the plasma may be controlled to vary a carbon concentration profile as the film is deposited. Such approaches may vary physical and electrical properties of the deposited silicon oxide film that might be invariant in a silane-based silicon dioxide deposition process.

Additionally or alternatively, in some embodiments, in-situ film transitions may be made between film deposition processes by segregating incompatible process reactants and/or by suitably purging one or more portions of a reactant delivery system shared by incompatible process reactants.

Figure 34:
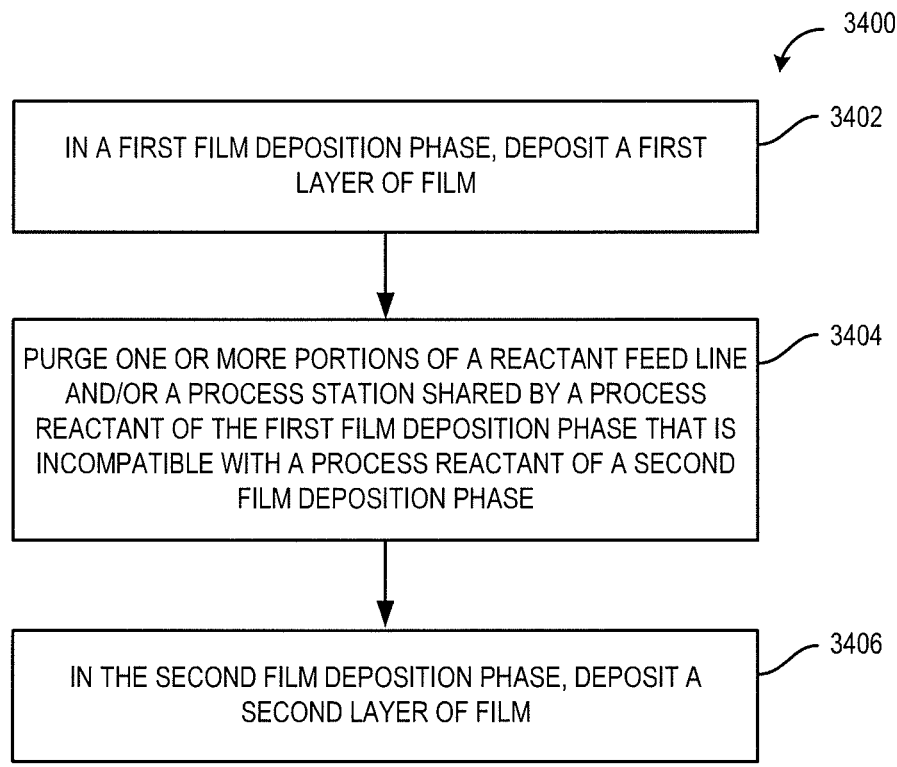
FIG. 34 shows a flow chart illustrating a method of transitioning, in-situ, from a first film deposition process to a second film deposition process with an intervening purge step according to an embodiment of the present disclosure.

For example, FIG. 34 shows a flow chart illustrating an embodiment of a method 3400 of transitioning, in-situ, from a first film deposition process to a second film deposition process with an intervening purge step. Method 3400 includes, at 3402, in a first film deposition phase, depositing a first layer of film. At 3404, method 3400 includes purging one or more portions of a reactant delivery line and/or a process station shared by a process reactant of the first film deposition phase that is incompatible with a process reactant of a second film deposition phase. At 3406, method 3400 includes, in the second film deposition phase, depositing a second layer of film on top of the first layer of film.

Figure 35A:
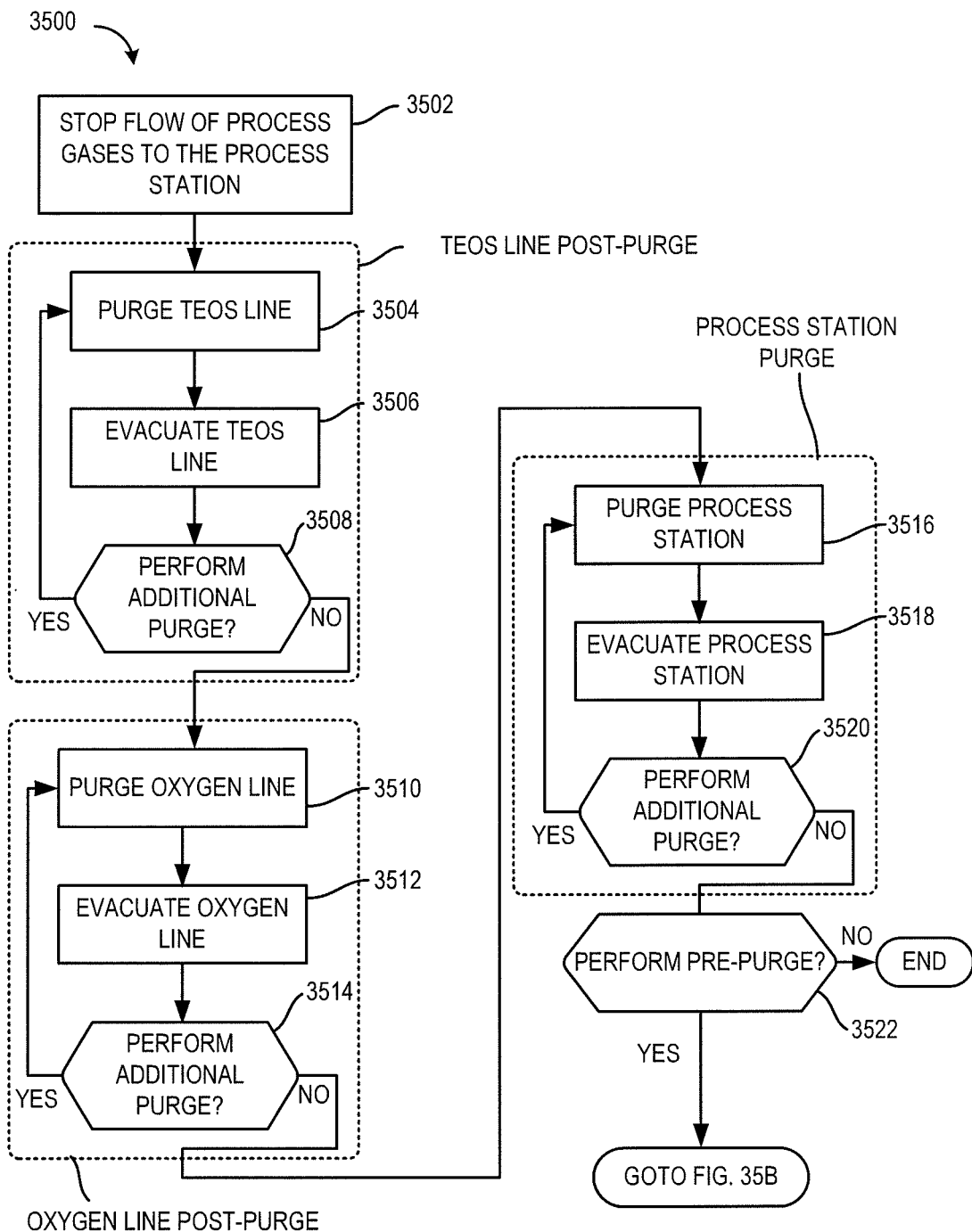
FIG. 35A shows a flow chart illustrating a first portion of a method of purging one or more portions of a reactant delivery line shared by a process reactant of the first film deposition phase that is incompatible with a process reactant of a second film deposition phase according to an embodiment of the present disclosure.
Figure 35B:
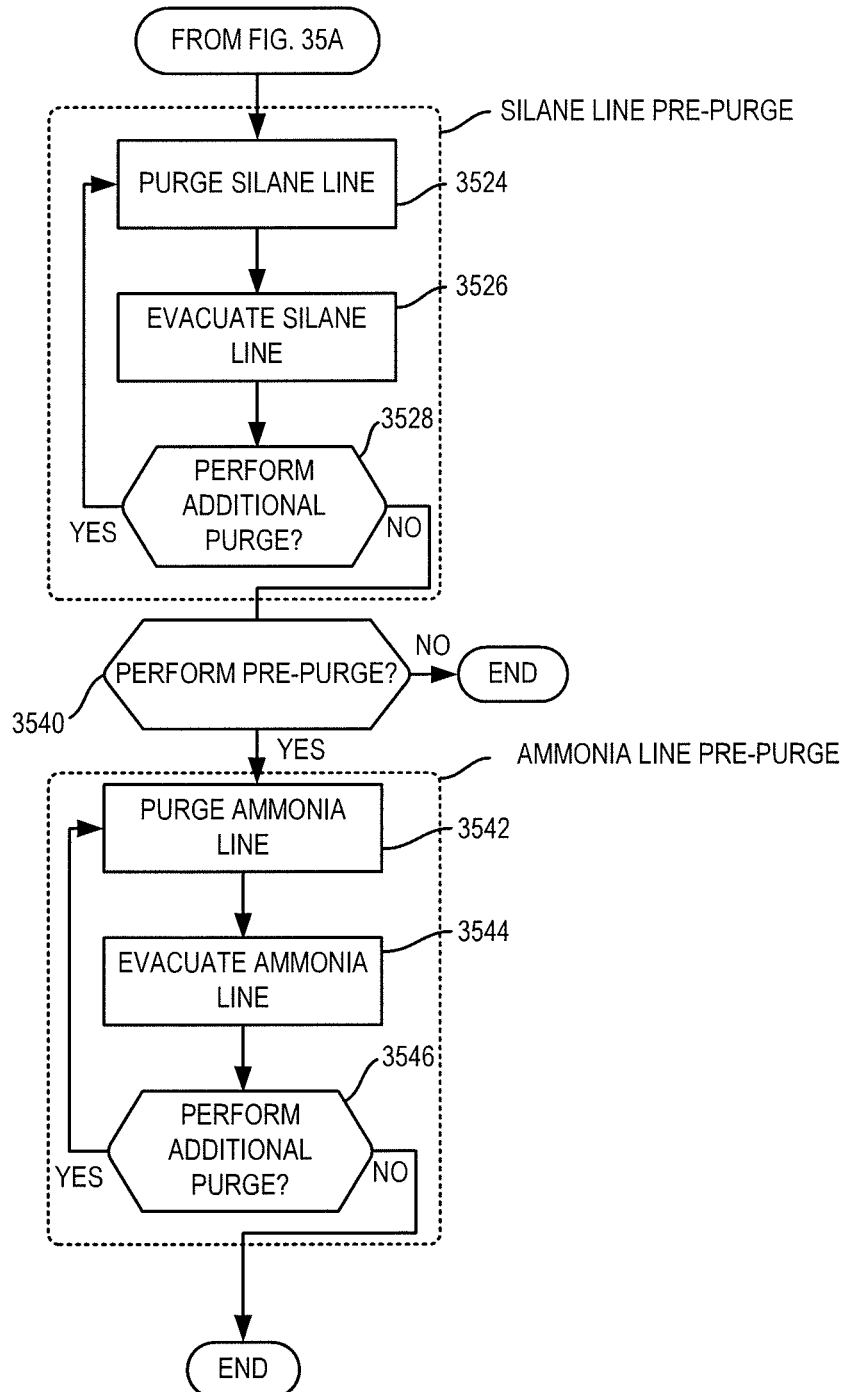
FIG. 35B shows a flow chart illustrating a second portion of the method of purging one or more portions of a reactant delivery line shared by a process reactant of the first film deposition phase that is incompatible with a process reactant of a second film deposition phase illustrated in FIG. 35A.

FIGS. 35A and 35B show an example flow chart illustrating an embodiment of a method 3500 purging one or more portions of a reactant delivery line shared by a process reactant of the first film deposition phase that is incompatible with a process reactant of a second film deposition phase. In the example method depicted in FIGS. 35A and 35B, a process station is being transitioned from a TEOS-based silicon dioxide film deposition process to a silane-based silicon nitride film deposition process. Specifically, FIG. 35A shows a first portion of method 3500 directed at performing post-deposition purges ("post-purges") of the TEOS and oxygen delivery lines and at performing a purge of the process station, while FIG. 35B shows a second portion of method 3500 directed at performing optional pre-deposition purges ("pre-purges") of the silane and ammonia delivery lines. It will be appreciated that this example is provided merely for illustrative purposes, and that other suitable purging cycles for other suitable deposition process transitions may be substituted within the scope of this disclosure.

Referring to FIG. 35A, method 3500 includes, at 3502, stopping the flow of process gases to the process station. Next, method 3500 enters a TEOS delivery line post-purge phase. At 3504, method 3500 includes purging the TEOS delivery line. In some embodiments, an oxygen flow may be used to purge the TEOS delivery line. For example, oxygen may be supplied at a suitable flow rate to purge delivery lines and hardware downstream of mixing point where the TEOS delivery line is fluidly connected with the oxygen source.

At 3506, method 3500 includes evacuating the TEOS delivery line. In some embodiments, the TEOS delivery line may be evacuated by evacuating the process station. For example, the purge gas in the TEOS delivery line may be turned off and the process station pressure may be controlled to evacuate a portion of the remaining gas in the process station. In some embodiments, the process station may be controlled to a base pressure by commanding a process station control valve to a fully open setting. One non-limiting example of a process station base pressure is a pressure of less than 0.5 torr. Additionally or alternatively, in some embodiments, a separate TEOS delivery line evacuation pipe may be used to evacuate residual gases from the TEOS delivery line.

At 3508, method 3500 includes checking whether additional TEOS delivery line purging is indicated. For example, in some embodiments, a recipe may indicate a number of TEOS delivery line purge cycles to be performed. If additional TEOS delivery line purging is indicated, method 3500 returns to 3504. In some embodiments, between two and five purge and evacuation cycles may be performed. In one non-limiting example, each purge and evacuation cycle may have a duration of between 30 seconds and 60 seconds.

If additional TEOS delivery line purging is not indicated, method 3500 continues to 3510, where method 3500 enters an oxygen delivery line post-purge phase. At 3510, includes purging the oxygen delivery line. In some embodiments, nitrogen supplied at a suitable flow rate may be used to purge the silane delivery line.

At 3512, method 3500 includes evacuating the oxygen delivery line. In some embodiments, the oxygen delivery line may be evacuated by evacuating the process station. For example, the purge gas in the oxygen delivery line may be turned off and the process station pressure may be controlled to evacuate a portion of the remaining gas in the process station. In some embodiments, the process station may be controlled to a base pressure by commanding a process station control valve to a fully open setting. One non-limiting example of a process station base pressure is a pressure of less than 0.5 torr. Additionally or alternatively, in some embodiments, a separate oxygen delivery line evacuation pipe may be used to evacuate residual gases from the oxygen delivery line.

At 3514, method 3500 includes checking whether additional oxygen delivery line purging is indicated. For example, in some embodiments, a recipe may indicate a number of oxygen delivery line purge cycles to be performed. If additional oxygen delivery line purging is indicated, method 3500 returns to 3510. In some embodiments, between two and five purge and evacuation cycles may be performed. In one non-limiting example, each purge and evacuation cycle may have a duration of between 30 seconds and 60 seconds.

If additional oxygen delivery line purging is not indicated, method 3500 continues to 3516, where method 3500 enters process station purge phase. At 3516, method 3500 includes purging the process station. In some embodiments, a purge gas is supplied to the process station to sweep small particles from plumbing and/or hardware surfaces within the process station, the mixing vessel, etc. In one non-limiting example, nitrogen and/or an inert gas is supplied to sweep away small particles and displace oxygen adsorbed to process station hardware, such as the mixing vessel, a showerhead gas distributor, process station walls, etc.

At 3518, method 3500 includes evacuating the process station. In some embodiments, the process station may be pumped down to the base pressure of the process station. Optionally, the oxygen supply manifold may be isolated by closing one or more process valves. This may prevent back-diffusion of subsequently delivered gases into the oxygen supply manifold.

At 3520, method 3500 includes checking whether additional process station purging is indicated. For example, in some embodiments, a recipe may indicate a number of process station purge cycles to be performed. If additional process station purging is indicated, method 3500 returns to 3516. In some embodiments, between two and five purge and evacuation cycles may be performed. In one non-limiting example, each purge and evacuation cycle may have a duration of between 5 seconds and 20 seconds. In some embodiments, if additional process station purging is not indicated and if pre-purging the silane delivery line is not indicated, method 3500 continues to 3522, where method 3500 checks whether an optional pre-purge of one or more of the silane and ammonia delivery lines may be indicated. If pre-purging is not indicated, method 3500 ends. If a pre-purge of the silane delivery line is indicated, method 3500 continues to FIG. 35B.

Turning to FIG. 35B, method 3500 includes, at 3524, purging the silane delivery line. In some embodiments, a nitrogen flow may be used to purge the silane delivery line. For example, nitrogen supplied at a suitable flow rate may be used to purge the silane delivery line.

At 3526, method 3500 includes evacuating the silane delivery line. In some embodiments, the silane delivery line may be evacuated by evacuating the process station. For example, the purge gas in the silane delivery line may be turned off and the process station pressure may be controlled to evacuate a portion of the remaining gas in the process station. In some embodiments, the process station may be controlled to a base pressure as described above. Additionally or alternatively, in some embodiments, a separate silane delivery line evacuation pipe may be used to evacuate residual gases from the silane delivery line.

At 3528, method 3500 includes checking whether additional silane delivery line purging is indicated. For example, in some embodiments, a recipe may indicate a number of silane delivery line purge cycles to be performed. If additional silane delivery line purging is indicated, method 3500 returns to 3524. In some embodiments, between two and five purge and evacuation cycles may be performed. In one non-limiting example, each purge and evacuation cycle may have a duration of approximately 60 seconds. Optionally, in some embodiments the silane delivery line may be isolated by closing one or more process valves. This may prevent back-diffusion of subsequently delivered gases into the silane delivery line.

In some embodiments, if additional silane delivery line purging is not indicated, method 3500 continues to 3540, where method 3500 checks whether an optional pre-purge of the ammonia delivery line is be indicated. If pre-purging of the ammonia delivery line is not indicated, method 3500 ends.

If a pre-purge of the ammonia delivery line is indicated, method 3500 continues to 3542. At 3542, method 3500 includes purging the ammonia delivery line. In some embodiments, a nitrogen flow may be used to purge the ammonia delivery line. For example, nitrogen may be supplied at a suitable flow rate to purge the ammonia delivery line.

At 3544, method 3500 includes evacuating the ammonia delivery line. In some embodiments, the ammonia delivery line may be evacuated by evacuating the process station. For example, the purge gas in the ammonia delivery line may be turned off and the process station pressure may be controlled to evacuate a portion of the remaining gas in the process station. In some embodiments, the process station may be controlled to a base pressure as described above. Additionally or alternatively, in some embodiments, a separate ammonia delivery line evacuation pipe may be used to evacuate residual gases from the ammonia delivery line.

At 3546, method 3500 includes checking whether additional ammonia delivery line purging is indicated. For example, in some embodiments, a recipe may indicate a number of ammonia delivery line purge cycles to be performed. If additional ammonia delivery line purging is indicated, method 3500 returns to 3546. In some embodiments, between two and five purge and evacuation cycles may be performed. In one non-limiting example, each purge and evacuation cycle may have a duration of approximately 60 seconds. If additional ammonia delivery line purging is not indicated, method 200 ends. Optionally, in some embodiments the ammonia delivery line may be isolated by closing one or more process valves. This may prevent back-diffusion of subsequently delivered gases into the ammonia delivery line.

It will be appreciated that other suitable arrangements of portions of method 3500 are included within the scope of the present disclosure. For example, in some embodiments, one or more process station purge cycles may be included between the silane delivery line purge and the ammonia line purge. Further, the present disclosure is not limited to a silane/ammonia/TEOS system described in method 3500. Thus, it will be appreciated that other suitable delivery line and process station purge cycles for other incompatible process gases are included within the scope of the present disclosure. Further still, any suitable purge gas may be used. Other example purge gases include, but are not limited to, helium, argon, etc.

The methods described herein may be performed by any suitable apparatus. A suitable apparatus includes hardware for accomplishing the process operations and a system controller having instructions for controlling process operations in accordance with the present invention. For example, in some embodiments, the hardware may include one or more process stations included in a process tool.

The system controller will typically include one or more memory devices and one or more processors configured to execute instructions for controlling process operations so that the apparatus will perform a method in accordance with the present disclosure. For example, in some embodiments, the system controller may operate various valves, temperature controllers, plasma controllers, and pressure controllers to adjust process conditions within the apparatus. In some embodiments, machine-readable media containing instructions for controlling process operations in accordance with the present disclosure may be coupled to the system controller.

For example, FIG. 36 schematically shows an example embodiment of a process station 3600. For simplicity, process station 3600 is depicted as a standalone process station having a process chamber body 3672 for maintaining a low-pressure environment. However, it will be appreciated that a plurality of process stations 3600 may be included in a common low-pressure process tool environment. Process station 3600 includes a process gas delivery line 3674 for providing process gases, such as inert gases, precursors, reactants, and treatment reactants, for delivery to process station 3600. In the example shown in FIG. 36, a showerhead 3678 is included to distribute process gases within process station 3600. Substrate 3686 is located beneath showerhead 3678, and is shown resting on a holder 3680 supported by a pedestal 3682. In some embodiments, pedestal 3682 may be configured to rotate about a vertical axis. Additionally or alternatively, pedestal 3682 may be configured to translate horizontally and/or vertically.

Figure 37:
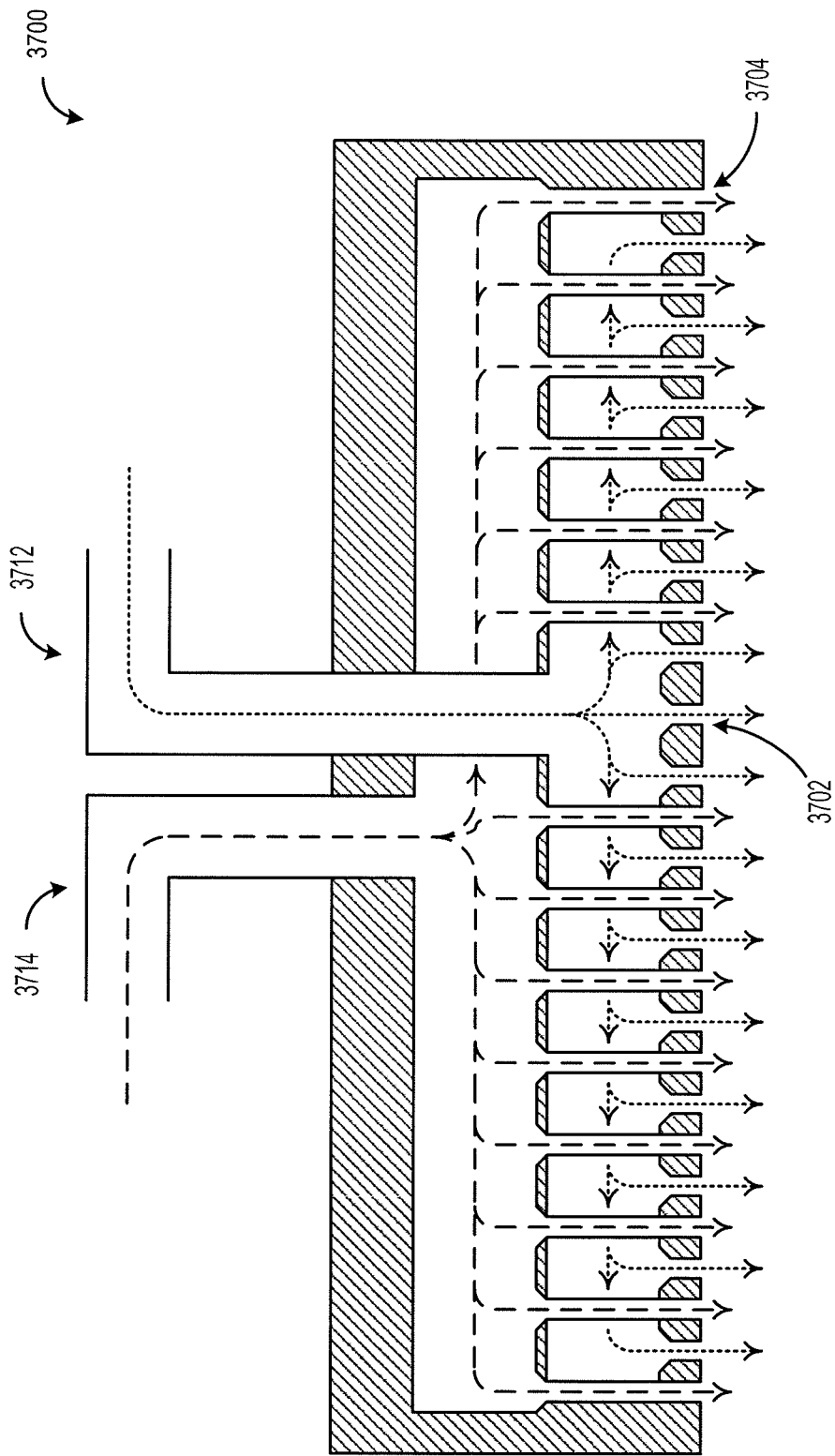
FIG. 37 schematically shows an example dual-plenum showerhead according to an embodiment of the present disclosure.

In some embodiments, showerhead 3678 may be a dual-plenum or multi-plenum showerhead. For example, FIG. 37 schematically shows an embodiment of a dual-plenum showerhead 3700. A first set of holes 3702 receives gas from a first process gas delivery line 3712 and a second set of holes 3704 receives gas from a second process gas delivery line 3714. Such physical isolation of process gases may provide an approach to reducing small particle generation from reaction between incompatible process gases in process gas delivery plumbing upstream of showerhead 3700. Any suitable segregation scheme may be employed. For example, in one scenario, holes 3702 may be dedicated to a silicon dioxide film deposition process while holes 3704 may be dedicated to a silicon nitride film deposition process. In another scenario, holes 3704 may be dedicated to oxidizing reactants while holes 3704 may be dedicated to reducing reactants. While the example shown in FIG. 37 is a dual-plenum showerhead, it will be appreciated that, in some embodiments, a showerhead may be a multi-plenum showerhead having three or more sets of holes.

Showerhead 3678 and holder 3680 electrically communicate with RF power supply 3688 and matching network 3690 for powering a plasma 3692. Plasma 3692 may be contained by a plasma sheath 3694 located adjacent to showerhead 3678 and holder 3680. While FIG. 36 depicts a capacitively-coupled plasma, plasma 3692 may be generated by any suitable plasma source. In one non-limiting example, plasma 3692 may include a parallel plate plasma source.

In the embodiment shown in FIG. 36, RF power supply 3688 may provide RF power of any suitable frequency. In some embodiments, RF power supply 3688 may be configured to control high- and low-frequency RF power sources independently of one another. Example low-frequency RF powers may include, but are not limited to, frequencies between 200 kHz and 2000 kHz. Example high-frequency RF powers may include, but are not limited to, frequencies between 13.56 MHz and 80 MHz. Likewise, RF power supply 3688 and matching network 3690 may be operated at any suitable power to form plasma 3692. Examples of suitable powers include, but are not limited to, powers between 250 W and 5000 W for a high-frequency plasma and powers between 0 W and 2500 W for a low-frequency plasma for a four-station multi-process tool including four 15-inch showerheads. RF power supply 3688 may be operated at any suitable duty cycle. Examples of suitable duty cycles include, but are not limited to, duty cycles of between 5% and 90%.

Returning to FIG. 36, in some embodiments, holder 3680 may be temperature controlled via heater 3684. Further, in some embodiments, pressure control for process station 3600 may be provided by butterfly valve 3696 or by any other suitable pressure control device. As shown in FIG. 36, butterfly valve 3696 throttles a vacuum provided by a vacuum pump (not shown) fluidly coupled to process station exhaust line 3698. However, in some embodiments, pressure control of process station 3600 may also be adjusted by varying a flow rate of one or more gases introduced to process station 3600.

It will be appreciated that control of one or more process parameters may be provided locally (e.g., RF power may be controlled by a plasma controller communicating with RF power supply 3688, process station pressure may be controlled by a valve controller communicating with butterfly valve 3696 or with gas metering valves or flow controllers included coupled with process gas delivery line 3674, etc.) or under partial or total control provided by a system controller (described in more detail below) communicating with process station 3600 without departing from the scope of the present disclosure.

As described above, one or more PECVD process stations may be included in a multi-station processing tool. In some embodiments of a multi-station process tool, control and/or supply of various process inputs (e.g., process gases, plasma power, heater power, etc.) may be distributed from shared sources to a plurality of process stations included in the process tool. For example, in some embodiments, a shared plasma generator may supply plasma power to two or more process stations. In another example, a shared gas distribution manifold may supply process gases to two or more process stations. Some non-limiting example embodiments of multi-station processing tools are described below.

Figure 38:
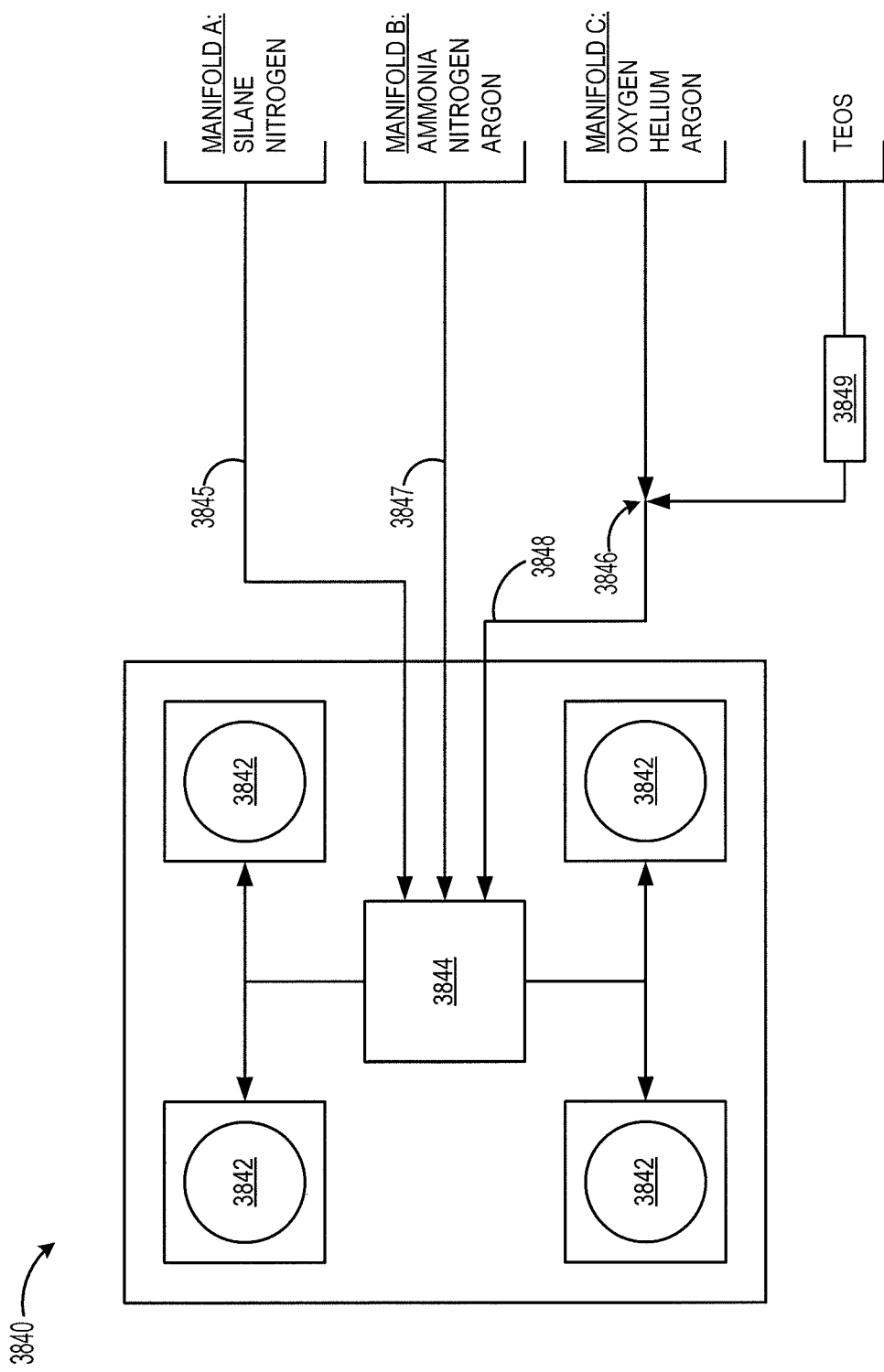
FIG. 38 schematically shows an example of a multi-station process tool according to an embodiment of the present disclosure.

FIG. 38 schematically shows an example process tool 3840, which includes a plurality of processing stations 3842 in a low-pressure environment. By maintaining each station in a low-pressure environment, defects caused by vacuum breaks between film deposition processes may be avoided. In the example shown in FIG. 25, each processing station 3842 is configured to deposit TEOS-based silicon dioxide films and silane-based silicon nitride films. Process gases for each processing station 3842 are supplied by a common mixing vessel 3844 for blending and/or conditioning process gases prior to delivery. In some embodiments, mixing vessel 3844 may be temperature controlled. Process gases may be supplied from a plurality of process gas manifolds, each of which may include any suitable process gas. For example, FIG. 38 depicts a manifold A including silane and nitrogen fluidly communicating with a silane delivery line 3845; a manifold B including ammonia and nitrogen fluidly communicating with an ammonia delivery line 3847; and a manifold C including oxygen, helium, and argon fluidly communicating with a TEOS delivery line 3848. However, it will be appreciated that other suitable arrangements are included within the scope of the present disclosure. In one non-limiting example, helium and/or argon are provided to each of manifolds A, B, and C.

In the example shown in FIG. 38, TEOS is introduced into TEOS delivery line 3848 fluidly communicating with manifold C at mixing point 3846. In some embodiments, liquid TEOS may be vaporized by optional vaporizer 3849 upstream of mixing point 3846.

Deposition of each film type may occur by a process that may include one or more of the above-described phases suitably modified for in-situ deposition of TEOS-based silicon dioxide films and silane-based silicon nitride films. Because each processing station 3842 is configured to provide each film type, additional purge and/or evacuation steps may be included within one or both processes to separate incompatible process gases. For example, in one scenario, residual oxygen adsorbed to plumbing surfaces may react with subsequently introduced silane to form fine silicon dioxide particulates. In another scenario, residual TEOS may react with subsequently introduced ammonia to form silicon oxynitride particulates. These particulates may be entrained during a gas flow event and may be distributed on the substrate surface as particle defects. One approach to addressing generation of such particles is by using one or more purge and/or evacuation cycles to displace incompatible process gases from surfaces and/or spaces shared by the process gases during transitions between deposition events.

In some embodiments, separate mixing vessels may be employed, separating incompatible precursors and potentially reducing purging and/or evacuation times for portions of the process gas delivery plumbing. For example, FIG. 39 schematically shows an embodiment example process tool 3990, which includes a plurality of processing stations 3992 in a low-pressure environment.

Process gases may be supplied to process tool 3990 from a plurality of process gas manifolds, each of which may include any suitable process gas. For example, FIG. 39 depicts a manifold A including silane and nitrogen fluidly communicating with process tool 3990; a manifold B including ammonia and nitrogen fluidly communicating with process tool 3990; and a manifold C including oxygen, helium, and argon fluidly communicating with process tool 3990. However, it will be appreciated that other suitable arrangements are included within the scope of the present disclosure. In one non-limiting example, helium and/or argon are provided to each of manifolds A, B, and C.

Figure 39:
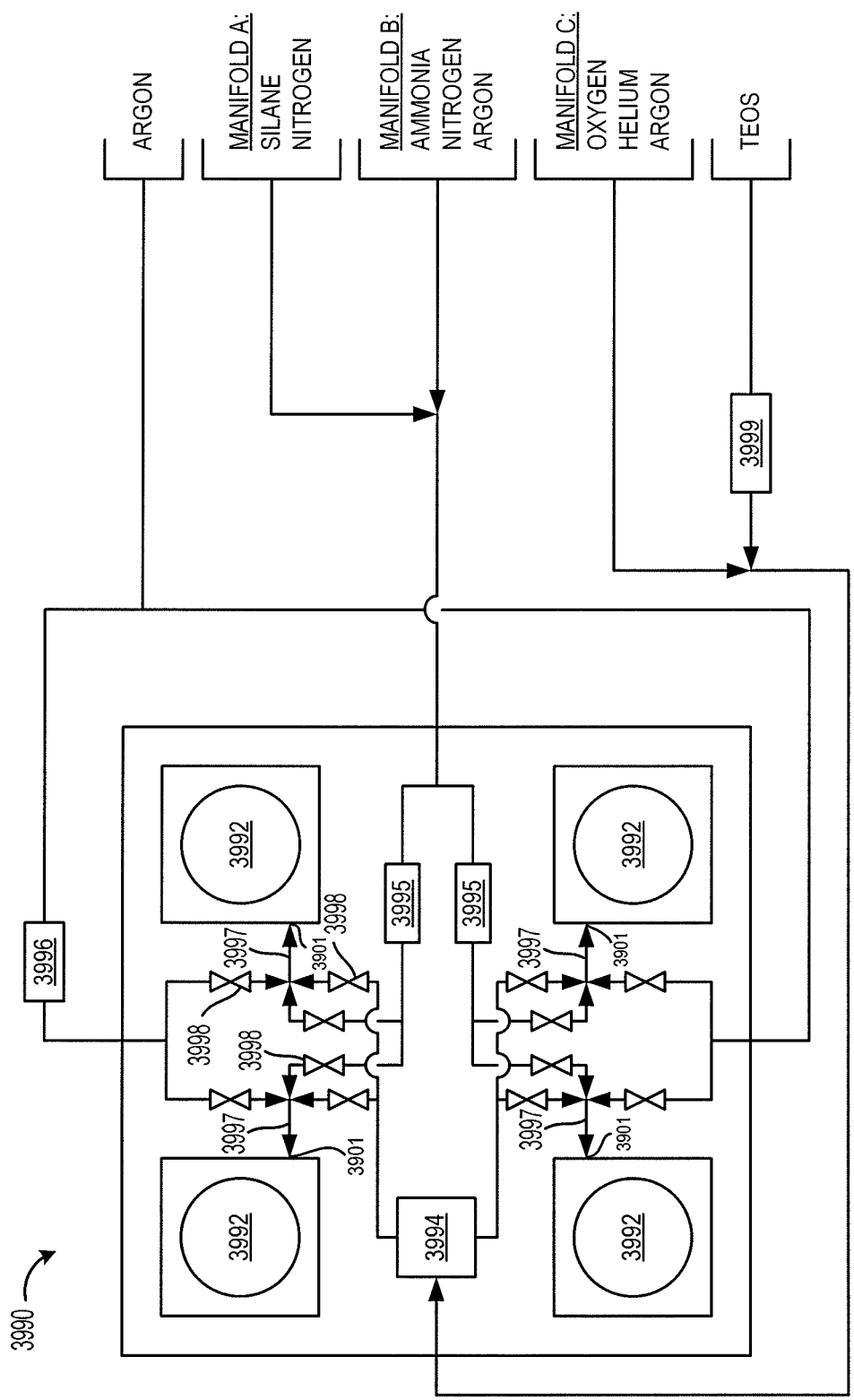
FIG. 39 schematically shows another example of a multi-station process tool according to an embodiment of the present disclosure.

In the example shown in FIG. 39, process stations 3992 are configured to deposit TEOS-based silicon dioxide films and silane-based silicon nitride films. Oxide film reactants, shown in FIG. 39 as TEOS and oxygen, are delivered to each processing station 3992 via an oxide system mixing vessel 3994. In the example shown in FIG. 39, liquid TEOS may be vaporized by optional vaporizer 3999 and mixed with oxygen supplied from manifold C at mixing point 3991.

In some embodiments, oxide system mixing vessel 3994 may be heated to discourage condensation of TEOS vapor.

Additionally or alternatively, in some embodiments, oxide system mixing vessel 3994 may be configured to be purged and/or evacuated. Such approaches may potentially reduce the formation of small silicon oxide particles within oxide system mixing vessel 3994 and/or other process gas plumbing. While FIG. 39 shows a single oxide system mixing vessel 3994, it will be appreciated that any suitable number of oxide system mixing vessels 3994 may be included within the scope of the present disclosure. For example, in some embodiments, two or more oxide system mixing vessels 3994 may be included; in some other embodiments, oxide system mixing vessel 3994 may be omitted. Additionally or alternatively, in some embodiments, any suitable number or configuration of mixing device, either dynamic or static, may be included in oxide system mixing vessel 3994 or fluidly coupled therewith.

Nitride film reactants, shown in FIG. 39 as silane and ammonia, are supplied via manifolds A and B, respectively, to each processing station 3992 via nitride system mixers 3995. In some embodiments, nitride system mixers 3995 may include dynamic or static mixing elements. In one non-limiting example, nitride system mixers 3995 may be static gas mixers including static, helically-shaped baffles. Additionally or alternatively, in some embodiments, nitride system mixers 3995 may include one or more heated mixing vessels. While FIG. 39 shows that process tool 3990 comprises two nitride system mixers 3995 for mixing nitride film reactants, it will be appreciated that any suitable number of nitride system mixers 3995 may be employed within the scope of the present disclosure. In some examples, three or more nitride system mixers may be used; in some other examples, a single nitride system mixer 3995 may be used, or the nitride system mixer 3995 may be omitted. In some embodiments, one or more nitride system mixers 3995 may include a mixing vessel. For example, in one scenario, one or more mixing vessels having no baffles may be substituted for one or more nitride system mixers 3995.

In some embodiments, inert gases, such as argon, helium, and nitrogen, may be supplied to one or more process stations, providing purging, process gas dilution and/or pressure control capability. In the example shown in FIG. 39, argon is provided to each process station 3992 via two inert mixers 3996. However, it will be appreciated that, in some embodiments, any suitable number of inert mixers 3996 may be employed, or in the alternative, that inert mixers 3996 may be omitted.

A plurality of valves 3998 for each process station 3992 isolate upstream portions of the oxide film gas delivery plumbing from the nitride film gas delivery plumbing from one another and from a process station feed 3997. This may prevent reactions between incompatible reactants. In some embodiments, the arrangement of valves 3998 may comparatively reduce a volume of process station feed 3997, further reducing potential reactions between incompatible reactants.

While FIG. 39 depicts three valves 3998 and a single process station feed 3997 serving each process station 3992, it will be appreciated that any suitable number of valves 3998 and process station feeds 3997 may be employed. For example, in some embodiments, each process gas may have a separate process station feed 3997 serving each process station 3992.

Further, it will be appreciated that, in some embodiments, two or more valves 3998 serving a common process station 3992 may be logically tied together via any suitable method (e.g., via electronic or pneumatic approaches) to act as a virtual single valve. For example, one or more sets of three valves 3998 serving an associated process station 3992 may be operated by a process station controller (not shown) as a virtual three-way valve. This may provide a measure of process defect control, preventing concurrent supply of incompatible gases. Alternatively, in some embodiments, any suitable number of valves 3998 may be physically united within a common valve assembly, such as an actual three-way valve. While not shown in FIG. 39, it will be appreciated that any suitable number of additional manually- or programmatically-controlled valves may be included within the scope of the present disclosure. Such valves may provide additional process control capability, leak-check capability, etc.

Deposition of each film type may occur by a process that may include one or more of the above-described phases suitably modified for in-situ deposition of TEOS-based silicon dioxide films and silane-based silicon nitride films. Because each process station 3992 is configured to provide each film type, additional purge and/or evacuation steps may be included within one or both processes to separate incompatible process gases. For example, in one scenario, residual oxygen adsorbed to plumbing surfaces may react with subsequently introduced silane to form fine silicon dioxide particulates. In another scenario, residual TEOS may react with subsequently introduced ammonia to form silicon oxynitride particulates. These particulates may be entrained during a gas flow event and may be distributed on the substrate surface as particle defects. One approach to addressing generation of such particles is by using one or more purge and/or evacuation cycles to displace incompatible process gases from surfaces and/or spaces shared by the process gases during transitions between deposition events.

In the example shown in FIG. 39, each processing station 3992 is configured to deposit TEOS-based silicon dioxide films and silane-based silicon nitride films. However, it will be appreciated that any suitable number of process stations 3992 may be "hard" dedicated to depositing either film via appropriate physical isolation of process gases, or, that any suitable number of process stations 3992 may be "soft" dedicated to depositing either film via process recipe, temporary physical isolation of process gases, or software-based isolation of process gases.

Figure 40:
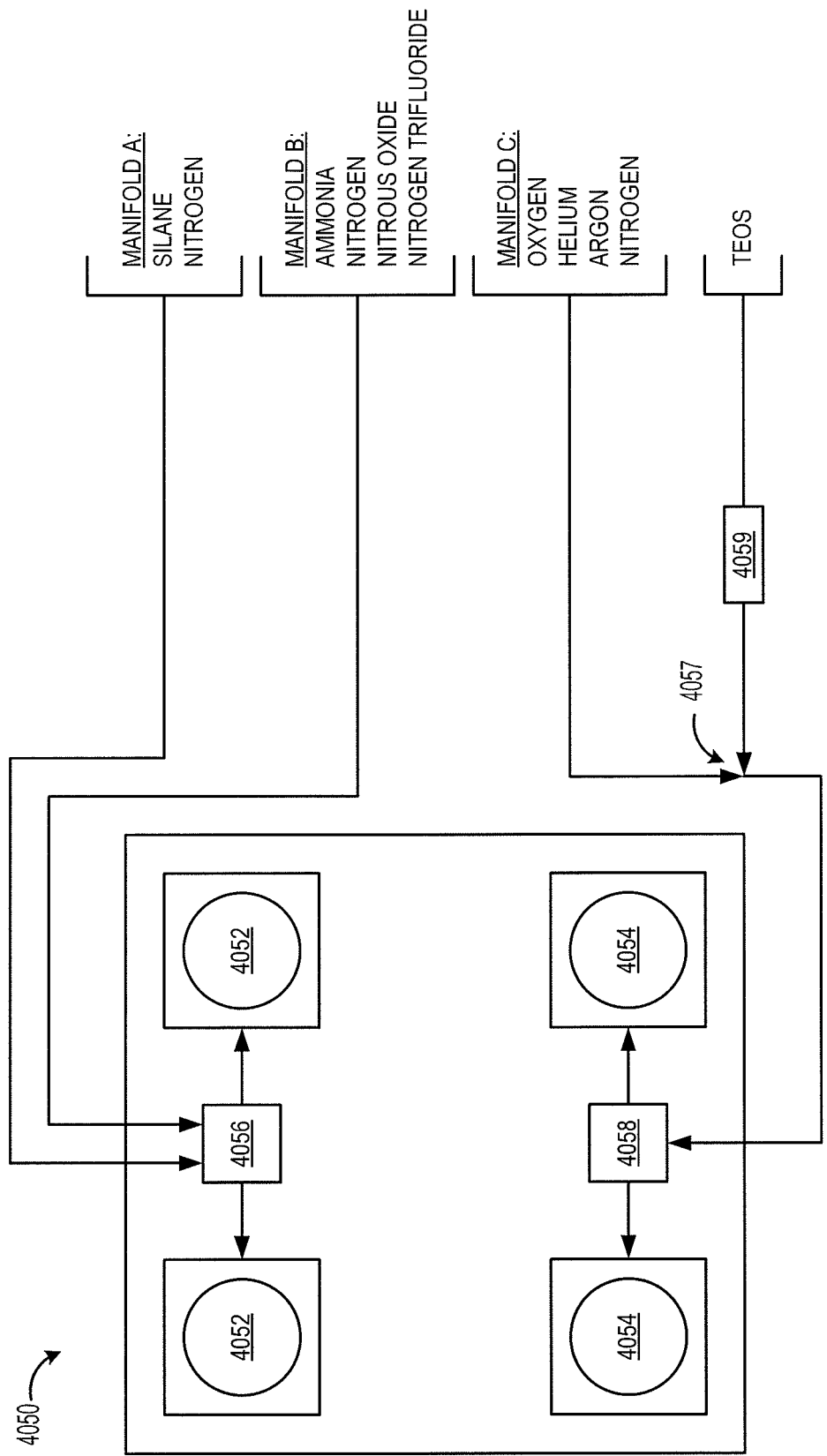
FIG. 40 schematically shows another example of a multi-station process tool according to an embodiment of the present disclosure.

For example, in some embodiments, particle generation caused by incompatible process gases may be addressed by segregating TEOS-based silicon dioxide deposition process hardware from silane-based silicon nitride deposition process hardware on a common process tool. For example, FIG. 40 schematically shows a process tool 4050 having a plurality of silicon nitride process stations 4052 and a plurality of silicon oxide process stations 4054. Process tool 4050 includes three gas manifolds. Manifold A is supplied with silane and nitrogen. Manifold B is supplied with nitrogen, ammonia, nitrogen trifluoride ($NF_3$), which may be used to provide in-situ process station cleaning capability), and nitrous oxide. In the embodiment shown in FIG. 40, manifolds A and B are plumbed to a common mixing vessel 4056. However, in some embodiments, mixing vessel 4056 may be omitted, and manifolds A and B may be plumbed directly to each processing station 4052. Manifold C is supplied with argon, helium, nitrogen, and oxygen, which are routed via a delivery line to mixing vessel 4058. TEOS vapor, which may be generated at optional vaporizer 4059, is blended with oxygen in a delivery line fluidly communicating with manifold C at mixing point 4057 and routed to mixing vessel 4058.

By segregating the silicon dioxide and the silicon nitride deposition processes to independent processing stations having independent process gas delivery systems, purge and/or evacuation times at each processing station may be reduced, which may reduce an overall cycle time for the processing tool. For example, in one process recipe, a film stack of alternating silicon dioxide and silicon nitride films may be deposited by deposition of a silicon dioxide layer in either of the silicon oxide process stations 4054, followed by moving the substrate, such as by a substrate transfer system, to a silicon nitride process station 4052 for deposition of a silicon nitride layer. Thus, an alternating film stack may be built up by an appropriate number of substrate transfer operations between process stations 4052 and 4054.

Figure 41:
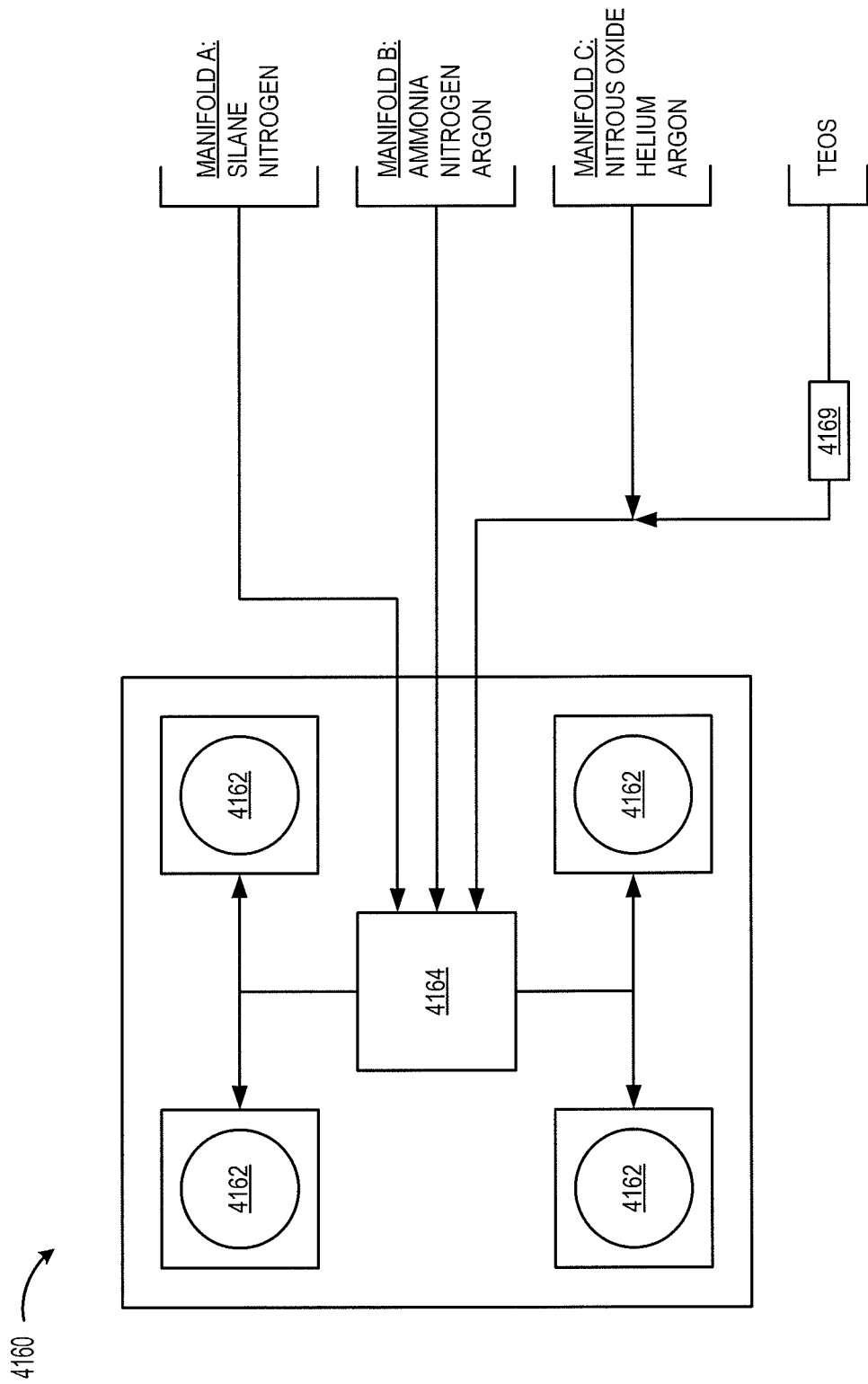
FIG. 41 schematically shows another example of a multi-station process tool according to an embodiment of the present disclosure.

FIG. 41 schematically shows an example process tool 4160, which includes a plurality of processing stations 4162 in a low-pressure environment. Each processing station 4162 is configured to deposit $N_2O$ and TEOS-based silicon dioxide and silane-based silicon nitride. Each processing station 4162 is supplied by a common mixing vessel 4164 for blending and/or conditioning process gases prior to delivery to each processing station 4162.

Figure 42:
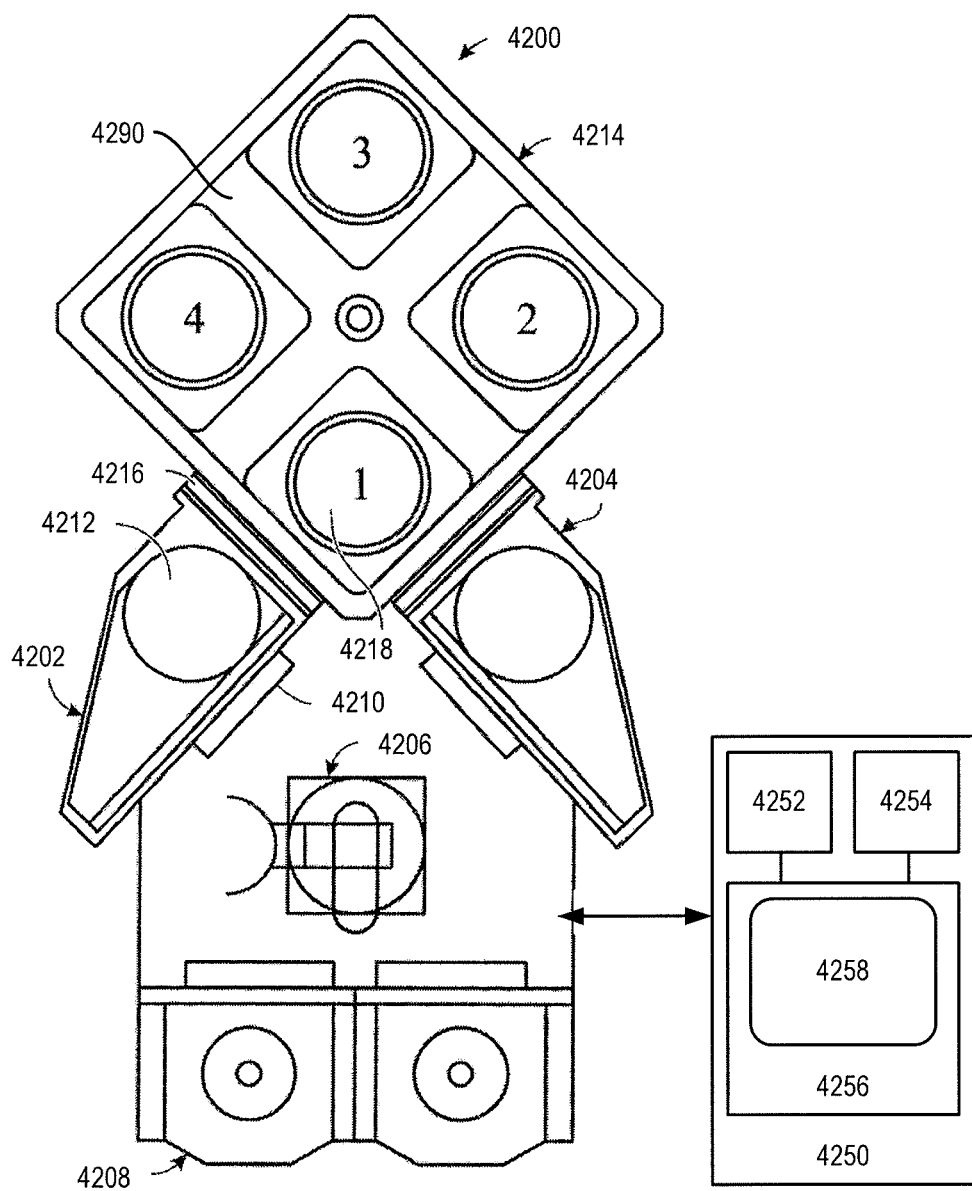
FIG. 42 schematically shows another example of a multi-station process tool according to an embodiment of the present disclosure.

FIG. 42 shows a schematic view of an embodiment of another multi-station processing tool 4200 with an inbound load lock 4202 and an outbound load lock 4204. A robot 4206, at atmospheric pressure, is configured to move substrates from a cassette loaded through a pod 4208 into inbound load lock 4202 via an atmospheric port 4210. Inbound load lock 4202 is coupled to a vacuum source (not shown) so that, when atmospheric port 4210 is closed, inbound load lock 4202 may be pumped down. Inbound load lock 4202 also includes a chamber transport port 4216 interfaced with processing chamber 4214. Thus, when chamber transport 4216 is opened, another robot (not shown) may move the substrate from inbound load lock 4202 to a pedestal of a first process station for processing.

In some embodiments, inbound load lock 4202 may be connected to a remote plasma source (not shown) configured to supply a plasma to load lock. This may provide remote plasma treatments to a substrate positioned in inbound load lock 4202. Additionally or alternatively, in some embodiments, inbound load lock 4202 may include a heater (not shown) configured to heat a substrate. This may remove moisture and gases adsorbed on a substrate positioned in inbound load lock 4202. While the embodiment depicted in FIG. 42 includes load locks, it will be appreciated that, in some embodiments, direct entry of a substrate into a process station may be provided.

The depicted processing chamber 4214 comprises four process stations, numbered from 1 to 4 in the embodiment shown in FIG. 42. In some embodiments, processing chamber 4214 may be configured to maintain a low pressure environment so that substrates may be transferred among the process stations without experiencing a vacuum break and/or air exposure. Each process station depicted in FIG. 42 includes a process station substrate holder (shown at 4218 for station 1) and process gas delivery line inlets. In some embodiments, one or more process station substrate holders 4218 may be heated.

In some embodiments, each process station may have different or multiple purposes. For example, a process station may be switchable between an ultra-smooth PECVD process mode and a conventional PECVD or CVD mode. Additionally or alternatively, in some embodiments, processing chamber 4214 may include one or more matched pairs of ultra-smooth PECVD and conventional PECVD stations (e.g., a pair including an ultra-smooth PECVD $SiO_2$ station and a conventional PECVD SiN station). In another example, a process station may be switchable between two or more film types, so that stacks of different film types may be deposited in the same process chamber.

While the depicted processing chamber 4214 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 42 also depicts an embodiment of a substrate handling system 4290 for transferring substrates within processing chamber 4214. In some embodiments, substrate handling system 4290 may be configured to transfer substrates between various process stations and/or between a process station and a load lock. It will be appreciated that any suitable substrate handling system may be employed. Non-limiting examples include substrate carousels and substrate handling robots.

Figure 43:
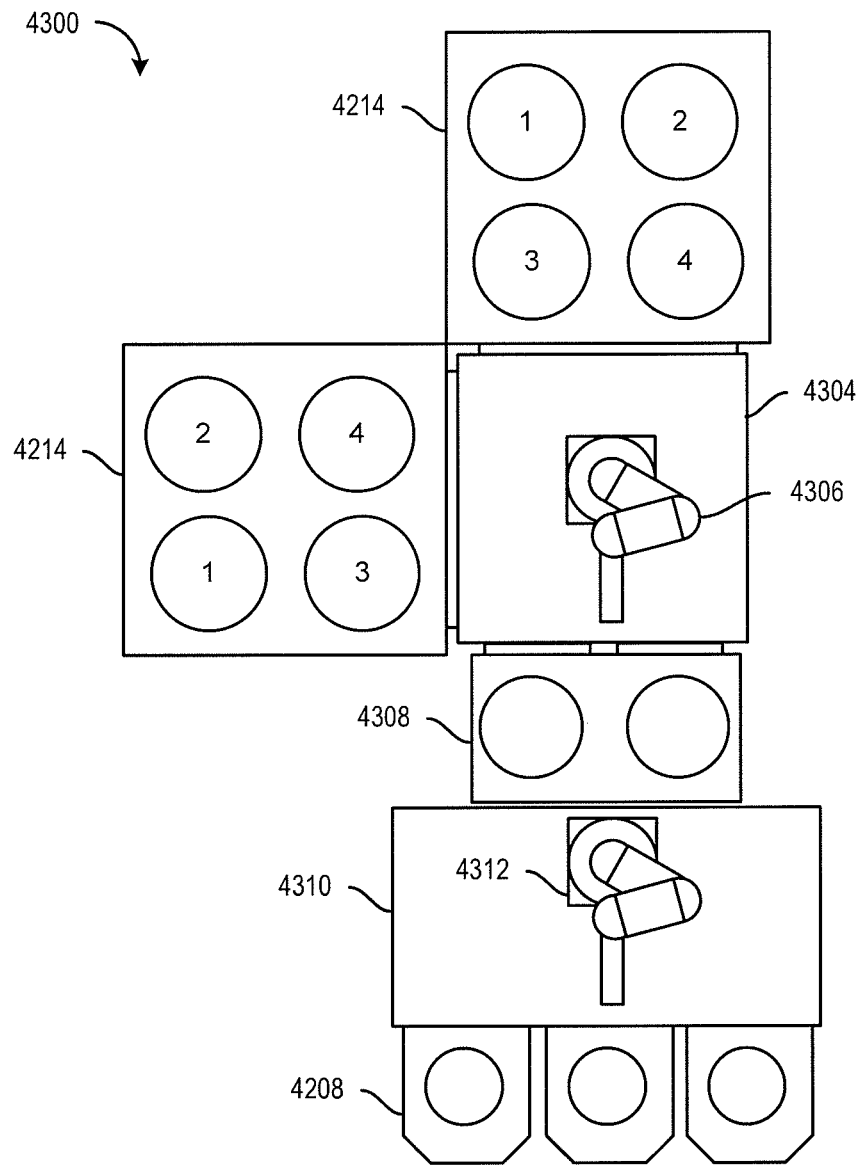
FIG. 43 schematically shows another example of a multi-station process tool according to an embodiment of the present disclosure.

It will be appreciated that, in some embodiments, a low-pressure transfer chamber may be included in a multi-station processing tool to facilitate transfer between a plurality of processing chambers. For example, FIG. 43 schematically shows another embodiment of a multi-station processing tool 4300. In the embodiment shown in FIG. 43, multi-station processing tool 4300 includes a plurality of processing chambers 4214 including a plurality of process stations (numbered 1 through 4). Processing chambers 4214 are interfaced with a low-pressure transport chamber 4304 including a robot 4306 configured to transport substrates between processing chambers 4214 and load lock 4308. An atmospheric substrate transfer module 4310, including an atmospheric robot 4312, is configured to facilitate transfer of substrates between load lock 4308 and pod 4208.

Turning back to FIG. 42, multi-station processing tool 4200 also includes an embodiment of a system controller 4250 employed to control process conditions and hardware states of processing tool 4200. For example, in some embodiments, system controller 4250 may control one or more process parameters during an ultra-smooth PECVD film deposition phase to control an absolute roughness of the film surface. While not shown in FIG. 43, it will be appreciated that the embodiment of multi-station processing tool 4300 may include a suitable system controller like the embodiment of system controller 4250 shown in FIG. 42.

System controller 4250 may include one or more memory devices 4256, one or more mass storage devices 4254, and one or more processors 4252. Processor 4252 may include a CPU or computer, analog and/or digital input/output connections, stepper motor controller boards, etc.

In some embodiments, system controller 4250 controls all of the activities of processing tool 4200. System controller 4250 executes machine-readable system control software 4258 stored in mass storage device 4254, loaded into memory device 4256, and executed on processor 4252. System control software 4258 may include instructions for controlling the timing, mixture of gases, chamber and/or station pressure, chamber and/or station temperature, substrate temperature, target power levels, RF power levels, substrate pedestal, chuck and/or susceptor position, and other parameters of a particular process performed by processing tool 4200. System control software 4258 may be configured in any suitable way. For example, various process tool component subroutines or control objects may be written to control operation of the process tool components for performing various process tool processes. System control software 4258 may be coded in any suitable computer readable programming language.

In some embodiments, system control software 4258 may include input/output control (IOC) sequencing instructions for controlling the various parameters described above. For example, each phase of an ultra-smooth PECVD process may include one or more instructions for execution by system controller 4250. The instructions for setting process conditions for an ultra-smooth PECVD process phase may be included in a corresponding ultra-smooth PECVD recipe phase. In some embodiments, the ultra-smooth PECVD recipe phases may be sequentially arranged, so that all instructions for an ultra-smooth PECVD process phase are executed concurrently with that process phase.

Other computer software and/or programs stored on mass storage device 4254 and/or memory device 4256 associated with system controller 4250 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto process station substrate holder 4218 and to control the spacing between the substrate and other parts of processing tool 4200.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 4250. The user interface may include a display screen, graphical software displays of the apparatus and/or process conditions, and user input devices such as pointing devices, keyboards, touch screens, microphones, etc.

In some embodiments, parameters adjusted by system controller 4250 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 4250 from various process tool sensors. The signals for controlling the process may be output on the analog and digital output connections of processing tool 4200. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 4250 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, i.e. substrate, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask layer (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method for depositing, on a substrate, a film stack including films of different compositions in a process station using a plasma, the method comprising:
   (a) in a first plasma-activated film deposition phase, depositing a first film having a first film composition on the substrate;
   (b) in a second plasma-activated deposition phase, depositing a second film having a second film composition on the first film, wherein the second film composition is different from the first film composition, and wherein the second film comprises a different set of elements from the first film, wherein (a) comprises delivering at least two first deposition phase reactants to the process station via a delivery line; and (b) comprises delivering at least two second deposition phase reactants to the process station via the same delivery line that was used in (a); and
   (c) purging the delivery line between (a) and (b) to remove the first deposition phase reactants from the delivery line.

2. The method of claim 1, wherein the at least two first deposition phase reactants comprise a silicon-containing reactant and an oxygen-containing reactant, and wherein the at least two second deposition phase reactants comprise a silicon-containing reactant and a nitrogen-containing reactant.

3. The method of claim 1, wherein the at least two first deposition phase reactants comprise a silicon-containing reactant and ammonia ($NH_3$), and the at least two second deposition phase reactants comprise a silicon-containing reactant and oxygen ($O_2$).

4. The method of claim 1, wherein the at least two first deposition phase reactants comprise silane ($SiH_4$) and ammonia ($NH_3$), and the at least two second deposition phase reactants comprise TEOS (tetraethyl orthosilicate) and oxygen ($O_2$).

5. The method of claim 1, wherein the first film and the second film are each selected from the group consisting of silicon nitride and silicon oxide.

6. The method of claim 1, further comprising: sustaining the plasma while transitioning a composition of the plasma from a first plasma composition of the first plasma-activated film deposition phase to a second plasma composition of the second plasma-activated film deposition phase, wherein the second plasma composition is different from the first plasma composition.

7. The method of claim 6, wherein sustaining the plasma includes maintaining a constant plasma volume.

8. The method of claim 6, wherein sustaining the plasma includes maintaining a constant delivered power to the plasma.

9. The method of claim 1, further comprising:

purging the process station with a purging gas after the first film deposition phase and before the second film deposition phase while sustaining the plasma during the purging of the process station.

10. The method of claim 1, wherein (a) comprises generating a plasma using a low-frequency plasma source and a high-frequency plasma source, and wherein the low-frequency plasma source power is decreased from a higher power used during the first film deposition phase to a lower power or to zero power during purging of the process station after the first film deposition phase.

11. The method of claim 1, further comprising repeating (a)-(c).

* * * * *